US010186618B2

(12) United States Patent
Yamazaki

(10) Patent No.: US 10,186,618 B2
(45) Date of Patent: Jan. 22, 2019

(54) SEMICONDUCTOR DEVICE AND MANUFACTURING METHOD THEREOF

(71) Applicant: Semiconductor Energy Laboratory Co., Ltd., Kanagawa-ken (JP)

(72) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 166 days.

(21) Appl. No.: 15/070,674

(22) Filed: Mar. 15, 2016

(65) Prior Publication Data

US 2016/0276493 A1    Sep. 22, 2016

(30) Foreign Application Priority Data

Mar. 18, 2015  (JP) ................................. 2015-055466
Mar. 24, 2015  (JP) ................................. 2015-060518
Jul. 14, 2015   (JP) ................................. 2015-140262

(51) Int. Cl.
  *H01L 29/78*   (2006.01)
  *H01L 29/786*  (2006.01)
  *H01L 29/45*   (2006.01)
  *H01L 21/322*  (2006.01)

(52) U.S. Cl.
  CPC .... *H01L 29/78696* (2013.01); *H01L 21/3221* (2013.01); *H01L 29/458* (2013.01); *H01L 29/78654* (2013.01); *H01L 29/78672* (2013.01)

(58) Field of Classification Search
  CPC ........... H01L 29/78696; H01L 21/3221; H01L 29/458; H01L 29/78654; H01L 29/78672
  See application file for complete search history.

(56) References Cited

U.S. PATENT DOCUMENTS

| 5,426,315 A | * | 6/1995 | Pfiester ............... H01L 27/1108 257/351 |
| 5,506,598 A | * | 4/1996 | Shimada ............. G02F 1/13624 345/92 |
| 5,793,072 A | * | 8/1998 | Kuo ..................... H01L 29/6675 257/241 |
| 6,235,558 B1 | | 5/2001 | Oda et al. |
| 6,493,046 B1 | * | 12/2002 | Ueda ................. G02F 1/136209 349/38 |
| 6,740,938 B2 | | 5/2004 | Tsunoda et al. |

(Continued)

FOREIGN PATENT DOCUMENTS

| JP | 06-005856 A | 1/1994 |
| JP | 2000-294787 A | * 10/2000 ........... H01L 29/786 |

(Continued)

*Primary Examiner* — Syed Gheyas
*Assistant Examiner* — S. M. S Imtiaz
(74) *Attorney, Agent, or Firm* — Husch Blackwell LLP

(57) ABSTRACT

An object is to achieve high electrical characteristics (a high on-state current value, an excellent S value, and the like) and a highly reliable semiconductor device. A high on-state current value is achieved, whereby a further reduction in channel width (W) is achieved. A second conductive layer functioning as a gate electrode has a function of electrically surrounding side surfaces of a semiconductor film in a cross section in a channel width direction. With this structure, on-state current of a transistor can be increased. To achieve a semiconductor device with less hot-carrier degradation, the gate electrode has a tapered portion.

11 Claims, 27 Drawing Sheets

(56) References Cited

U.S. PATENT DOCUMENTS

| | | |
|---|---|---|
| 6,858,478 B2 | 2/2005 | Chau et al. |
| 6,914,295 B2 | 7/2005 | Chau et al. |
| 6,972,467 B2 | 12/2005 | Zhang et al. |
| 7,005,366 B2 | 2/2006 | Chau et al. |
| 7,358,121 B2 | 4/2008 | Chau et al. |
| 7,368,791 B2 | 5/2008 | Zhang et al. |
| 7,427,794 B2 | 9/2008 | Chau et al. |
| 7,504,678 B2 | 3/2009 | Chau et al. |
| 7,514,346 B2 | 4/2009 | Chau et al. |
| 7,560,756 B2 | 7/2009 | Chau et al. |
| 7,700,984 B2 * | 4/2010 | Yukawa ............ H01L 27/10 257/277 |
| 7,723,721 B2 | 5/2010 | Udagawa et al. |
| 8,154,015 B2 | 4/2012 | Udagawa et al. |
| 8,324,618 B2 | 12/2012 | Udagawa et al. |
| 8,629,438 B2 * | 1/2014 | Yamazaki ......... H01L 27/1225 257/43 |
| 8,648,338 B2 | 2/2014 | Udagawa et al. |
| 8,735,231 B2 * | 5/2014 | Miyairi ............ H01L 29/6675 438/157 |
| 8,754,409 B2 | 6/2014 | Yamazaki et al. |
| 9,054,199 B2 | 6/2015 | Udagawa et al. |
| 2002/0130616 A1 * | 9/2002 | Shirakawa ........... H05B 33/10 313/509 |
| 2004/0036126 A1 | 2/2004 | Chau et al. |
| 2006/0157792 A1 * | 7/2006 | Konushi ............. H01G 4/232 257/359 |
| 2007/0026646 A1 * | 2/2007 | Chae ................ B82Y 10/00 438/479 |
| 2007/0296899 A1 * | 12/2007 | Murade .............. G02F 1/1339 349/139 |
| 2008/0093670 A1 * | 4/2008 | Atanakovic ....... H01L 21/28518 257/347 |
| 2009/0140270 A1 | 6/2009 | Takahashi et al. |
| 2010/0117075 A1 * | 5/2010 | Akimoto ........... H01L 29/66742 257/43 |
| 2010/0140608 A1 | 6/2010 | Park et al. |
| 2010/0148175 A1 * | 6/2010 | Godo ............... H01L 29/78696 257/57 |
| 2010/0224878 A1 * | 9/2010 | Kimura ............ H01L 27/1225 257/57 |
| 2010/0279474 A1 * | 11/2010 | Akimoto ........... H01L 27/1225 438/158 |
| 2010/0301326 A1 * | 12/2010 | Miyairi ............ H01L 27/1225 257/43 |
| 2011/0008640 A1 * | 1/2011 | Goto ............... C22C 21/00 428/551 |
| 2011/0024755 A1 * | 2/2011 | Korenari ............ H01L 27/1214 257/59 |
| 2012/0049190 A1 * | 3/2012 | Miyairi ............. H01L 29/04 257/57 |
| 2012/0182208 A1 | 7/2012 | Takahashi et al. |
| 2012/0241739 A1 | 9/2012 | Yamazaki et al. |
| 2013/0001544 A1 * | 1/2013 | Yamazaki ......... H01L 21/02554 257/43 |
| 2013/0015436 A1 * | 1/2013 | Yamazaki ......... H01L 29/42384 257/43 |
| 2013/0069059 A1 | 3/2013 | Yamazaki |
| 2013/0140635 A1 * | 6/2013 | Yan ............... H01L 27/1225 257/347 |
| 2013/0161606 A1 | 6/2013 | Isobe et al. |
| 2013/0175530 A1 | 7/2013 | Noda et al. |
| 2013/0181214 A1 | 7/2013 | Yamazaki et al. |
| 2013/0187187 A1 * | 7/2013 | Matsukura ......... H01L 27/2436 257/99 |
| 2013/0277670 A1 | 10/2013 | Isobe |
| 2013/0299820 A1 * | 11/2013 | Miyamoto ........... H01L 29/495 257/43 |
| 2013/0299821 A1 | 11/2013 | Yamazaki |
| 2014/0051238 A1 * | 2/2014 | Saitoh ............. H01L 27/1288 438/510 |
| 2014/0151691 A1 | 6/2014 | Matsubayashi et al. |
| 2014/0252353 A1 | 9/2014 | Yamazaki et al. |
| 2015/0270322 A1 | 9/2015 | Udagawa et al. |
| 2015/0357479 A1 | 12/2015 | Yamazaki |
| 2015/0380417 A1 | 12/2015 | Yamazaki et al. |
| 2016/0077640 A1 * | 3/2016 | Brinkley ........... G02F 1/13338 345/173 |
| 2016/0345425 A1 * | 11/2016 | Goto ............... C23C 14/165 |

FOREIGN PATENT DOCUMENTS

| | | |
|---|---|---|
| JP | 2003-023161 A | 1/2003 |
| JP | 2003-208110 A | 7/2003 |
| JP | 2008-071922 A | 3/2008 |
| JP | 2009-151293 A | 7/2009 |
| JP | 2012-216802 A | 11/2012 |
| WO | WO 2015/037686 A1 | 3/2015 |

* cited by examiner

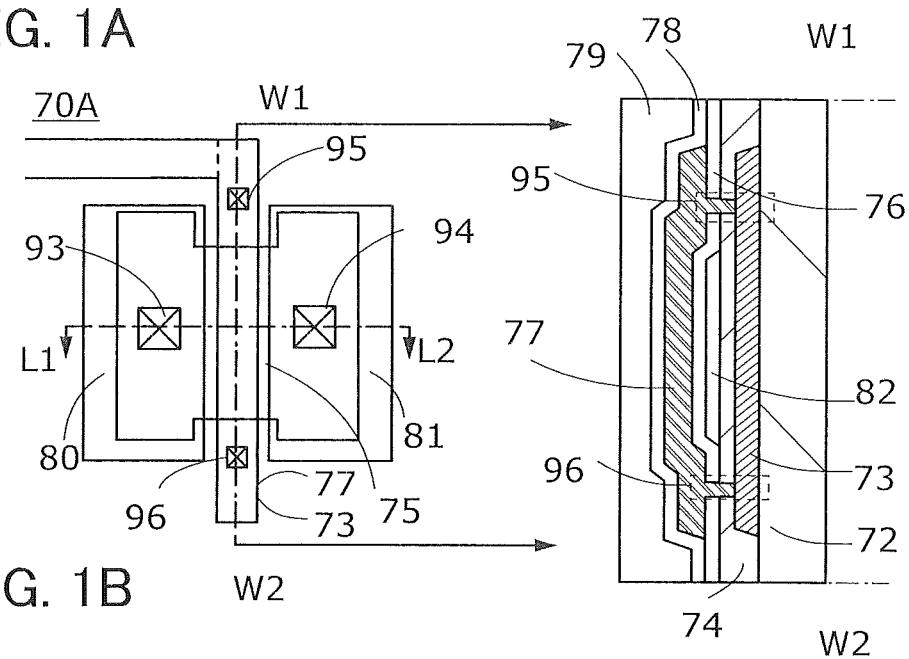
FIG. 1A
FIG. 1C
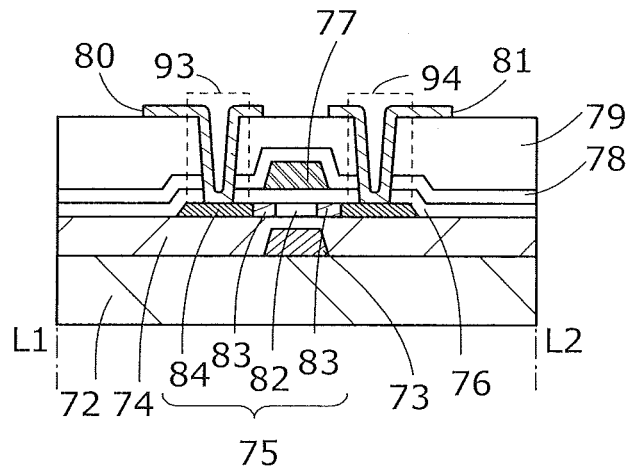
FIG. 1B

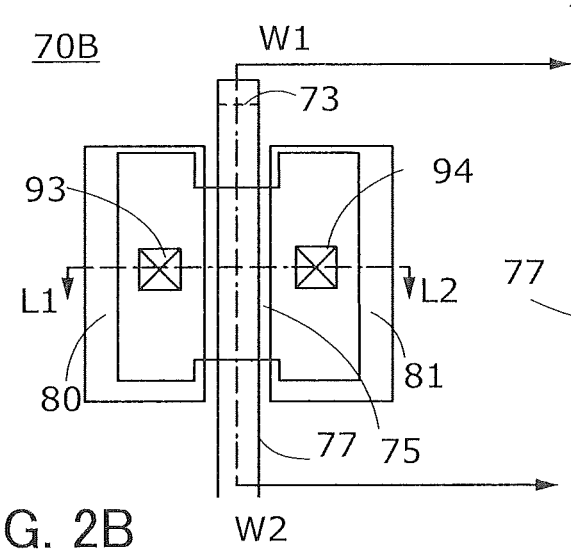
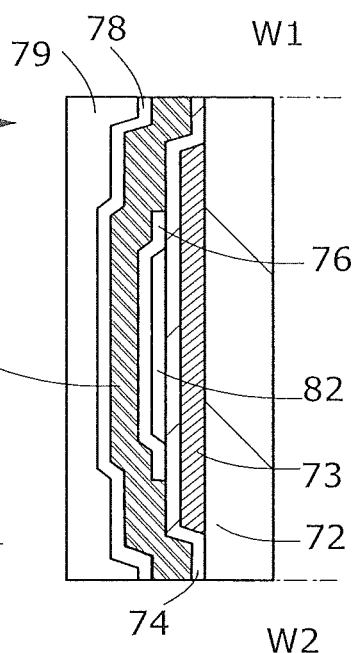
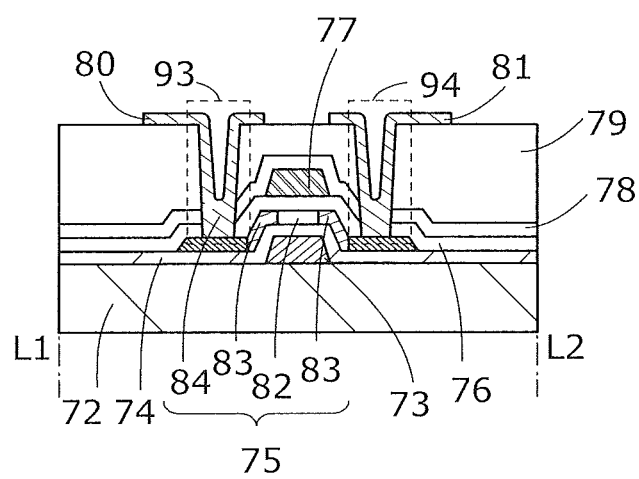
FIG. 2A
FIG. 2B
FIG. 2C

FIG. 4A
FIG. 4B
FIG. 4C
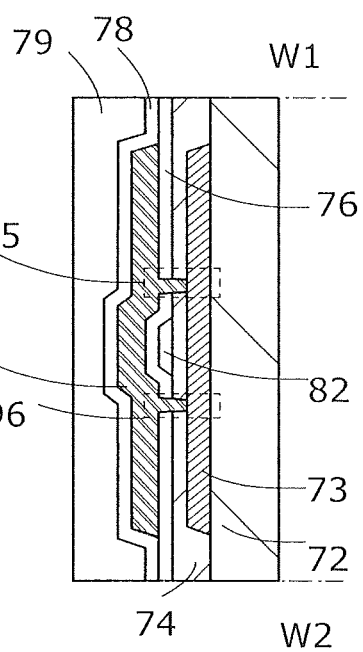
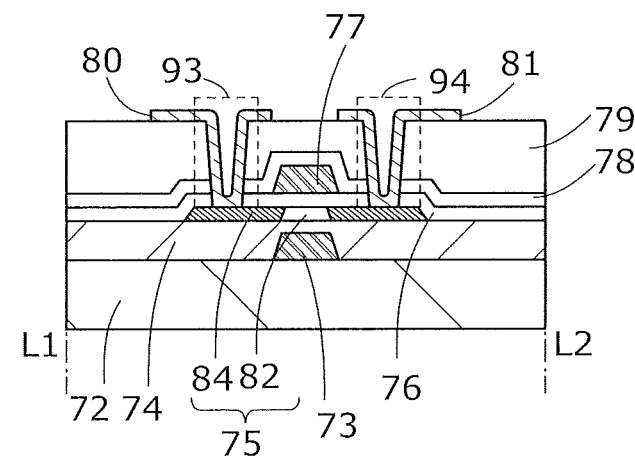

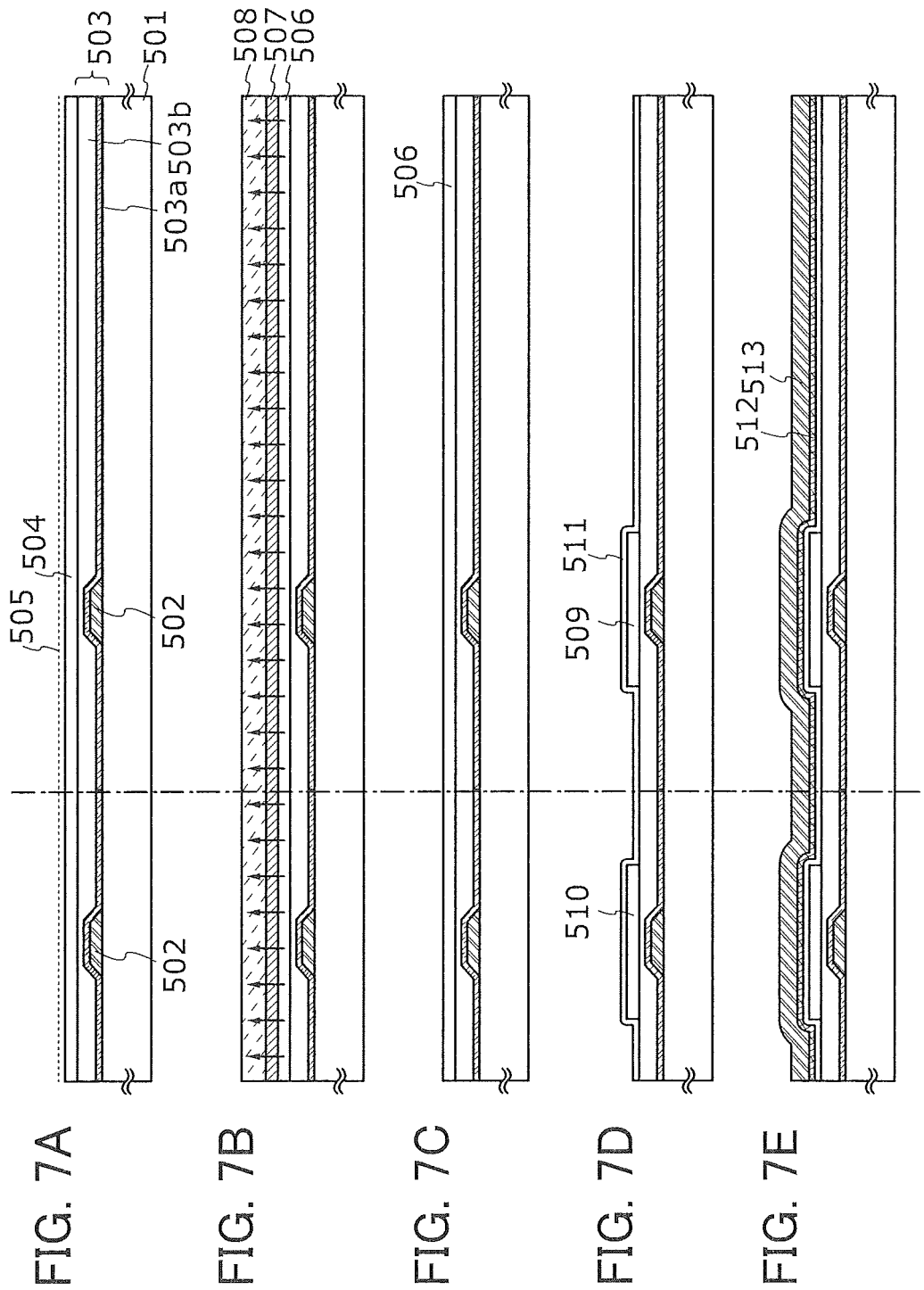

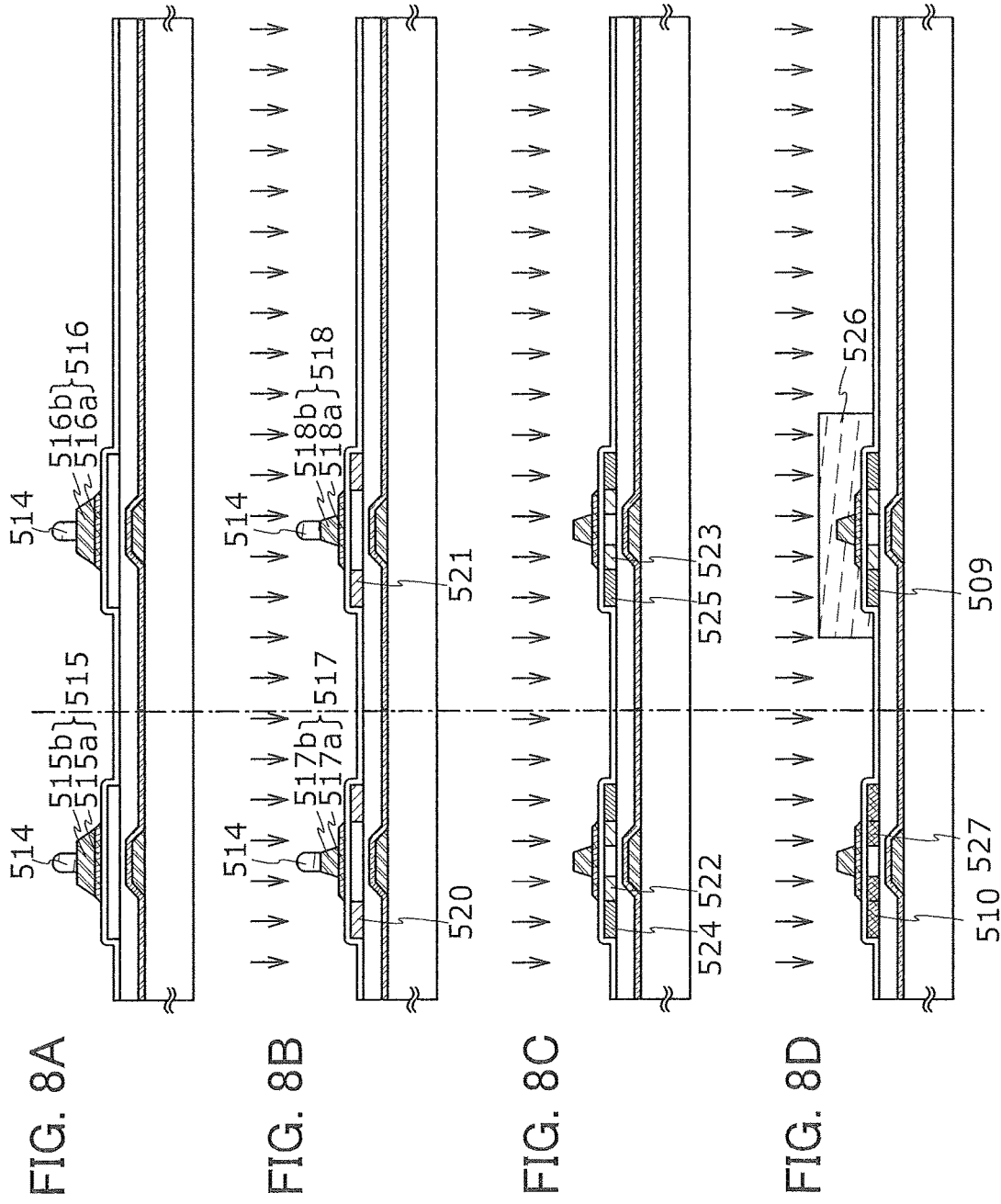

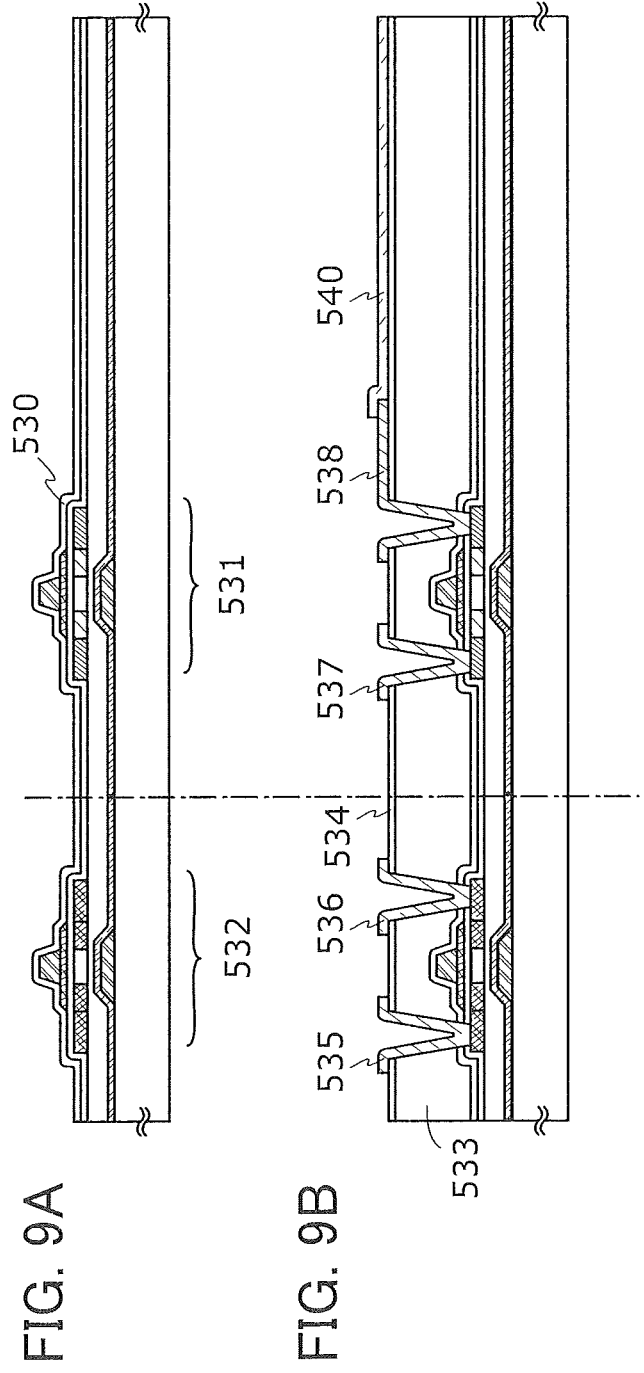

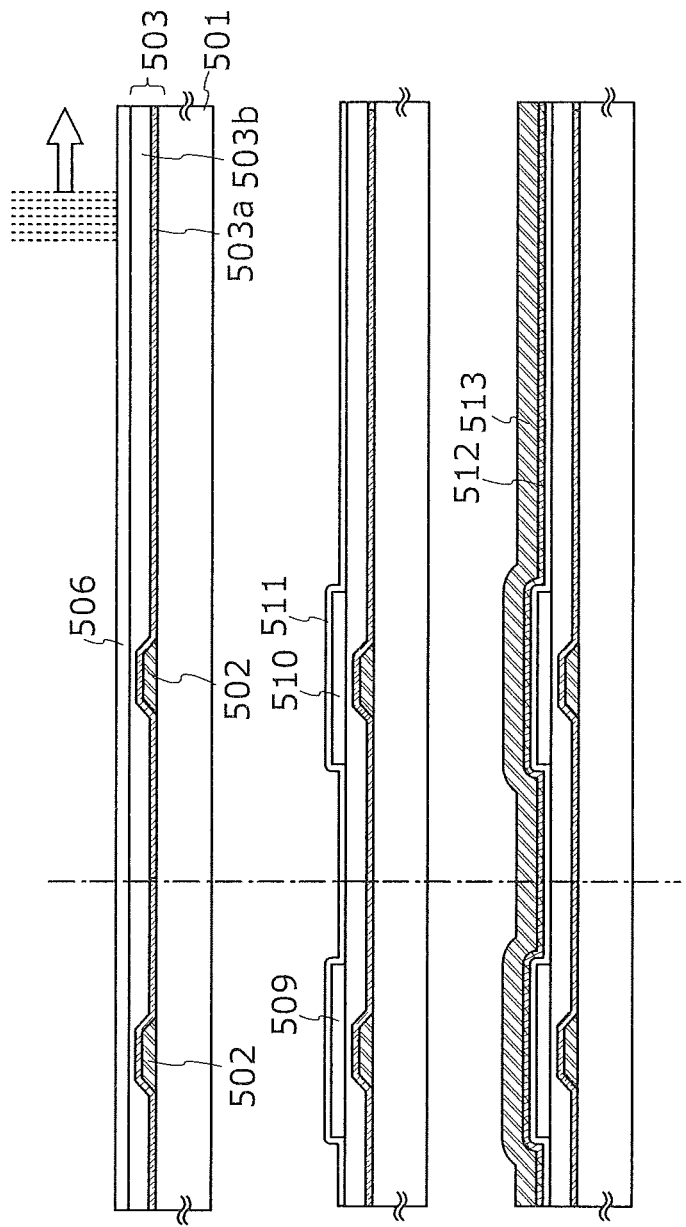

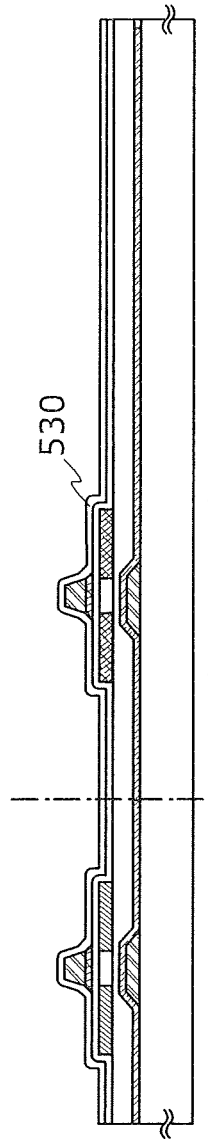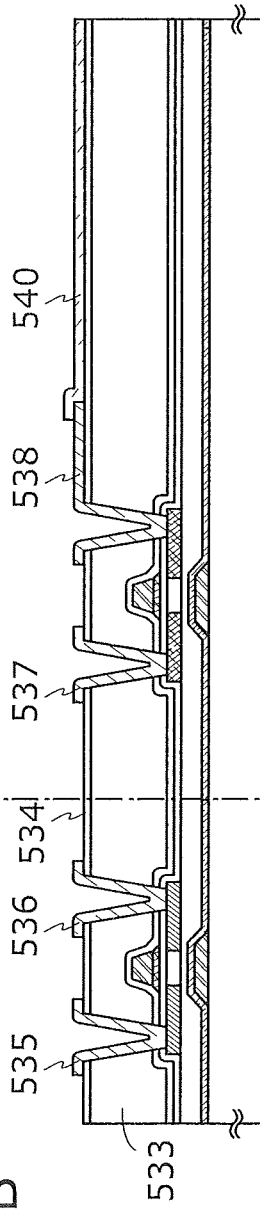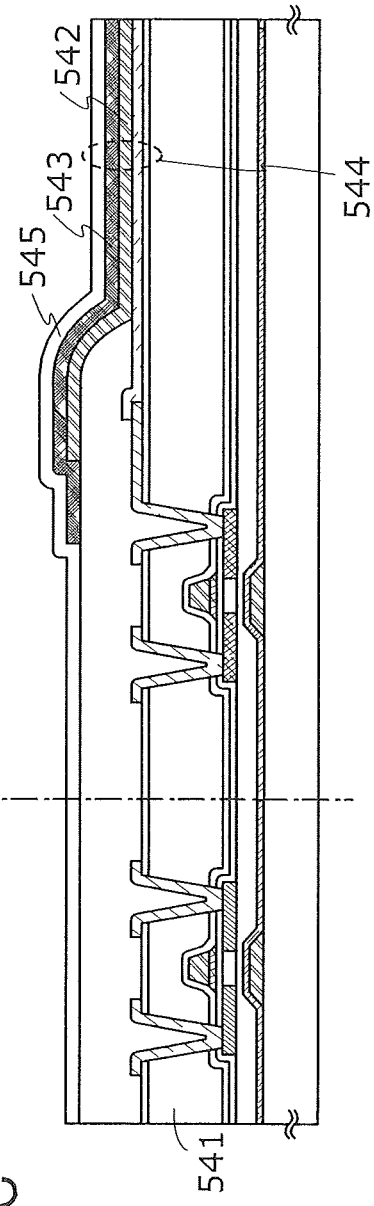

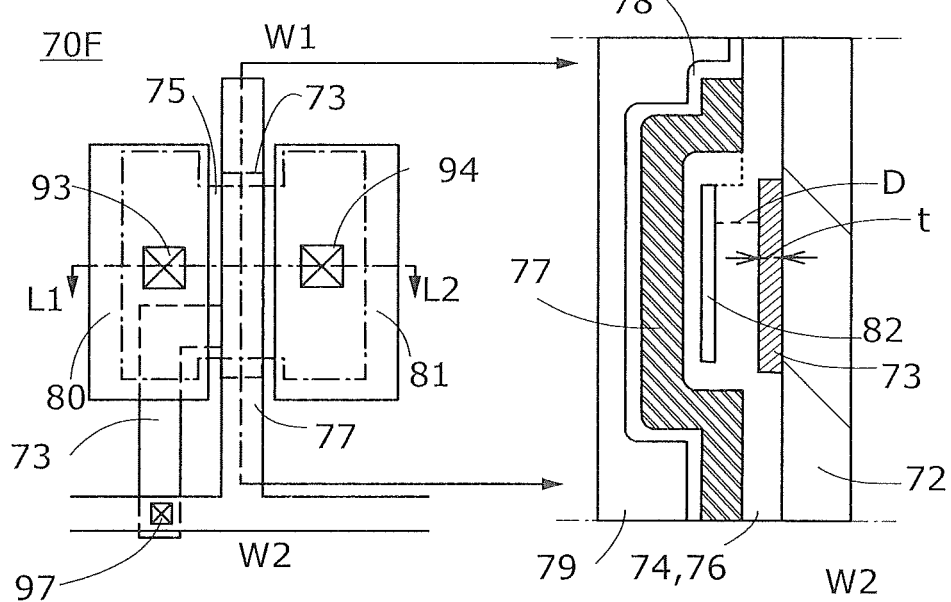
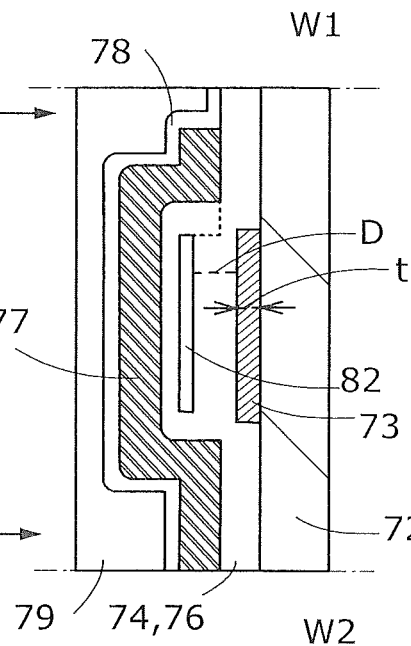
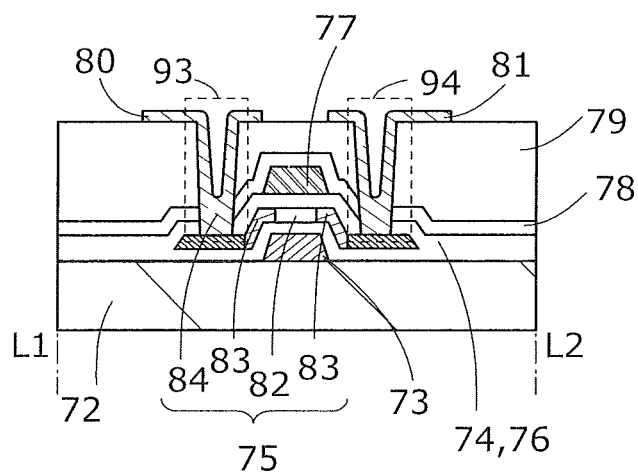

SEMICONDUCTOR DEVICE AND MANUFACTURING METHOD THEREOF

BACKGROUND OF THE INVENTION

1. Field of the Invention

The present invention relates to, for example, a transistor, a semiconductor device, and manufacturing methods thereof. The present invention relates to, for example, a display device, a light-emitting device, a lighting device, a power storage device, a memory device, a processor, and an electronic device. The present invention relates to a method for manufacturing a display device, a liquid crystal display device, a light-emitting device, a memory device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

Electro-optical devices including large-sized integrated circuits formed using transistors in which crystalline semiconductor films (typically, a polysilicon film, a microcrystalline silicon film, and the like) provided over insulating surfaces are used as active layers have been actively developed. Transistors including polysilicon films can form various functional circuits because of its high field-effect mobility.

For example, in an active matrix liquid crystal display device, a pixel circuit for performing image display for each functional block and an integrated circuit including a shift register circuit, a level shifter circuit, a buffer circuit, a sampling circuit, and the like, which are based on a CMOS circuit, are formed over one substrate.

In these circuits, a voltage is applied to liquid crystals to drive a pixel portion including a pixel transistor, which functions as a switching element, and a capacitor. Since the liquid crystals need to be driven with an alternating current, a method called frame inversion driving has been employed in many cases. Thus, the transistor characteristic of a sufficiently low off-state current (Ioff: the value of a drain current flowing when a transistor is off) is required. However, it has been pointed out that a transistor including a polysilicon film has disadvantages of a low drain withstand voltage and a large off-state current.

As a means for solving this problem, a lightly doped drain (LDD) structure including a low-concentration impurity region (LDD region) (a structure where the low-concentration impurity region is provided between a channel formation region and a source region or a drain region to which an impurity element is added at a high concentration) has been known.

In the case where the LDD structure is employed, as compared with the case where a single-drain structure is employed, the drain withstand voltage is significantly improved; however, the drain current is reduced because of the large resistance of the low-concentration impurity region (an n⁻ region or a p⁻ region).

In addition, it has been pointed out that there is a problem in that a high electric field is generated in the vicinity of the drain region, hot carriers are generated and trapped in a gate insulating film over an LDD region, and element characteristics such as a threshold voltage are largely changed and decreased. To prevent the degradation due to hot carriers, the transistor where the LDD region and the gate electrode overlap has been disclosed (for example, see Patent Document 1). As compared with a transistor having a normal LDD structure, a transistor having a gate-overlap LDD structure has high current drive capability and can relieve the high electric field in the vicinity of the drain region to prevent the degradation due to hot carriers.

Furthermore, since a high drive voltage is applied to a buffer circuit, the withstand voltage needs to be increased such that the buffer circuit is not broken even if a high voltage is applied, and it is also necessary to secure a sufficiently large on-state current value (Ion: the value of a drain current flowing when a transistor is on) to obtain high current drive capacity.

As a means for achieving high-speed operation of a transistor, for example, a dual gate structure where a semiconductor layer is sandwiched between a pair of gate electrodes, which is disclosed in Patent Document 2, has been considered. In addition, a fin structure disclosed in Patent Document 3 has been proposed.

Moreover, to reduce variations in luminance of an OLED, a structure where a transistor having a long channel length is used is disclosed in Patent Document 4.

REFERENCE

Patent Documents

[Patent Document 1] Japanese Published Patent Application No. 2000-294787
[Patent Document 2] Japanese Published Patent Application No. 2003-23161
[Patent Document 3] PCT International Publication No. WO 2015/037686
[Patent Document 4] Japanese Published Patent Application No. 2003-208110

SUMMARY OF THE INVENTION

High integration of a semiconductor device requires miniaturization of a transistor. However, it is known that miniaturization of a transistor causes deterioration of electrical characteristics of the transistor. In particular, a decrease in channel width (W) causes a reduction in on-state current.

In view of the above problems, it is an object of the present invention to achieve high electrical characteristics (such as a high on-state current value) and a highly reliable semiconductor device. The high on-state current value can achieve a further decrease in channel width (W).

Another object is to provide a semiconductor device in which hot-carrier degradation hardly occurs even at a high drain voltage.

Another object is to improve reliability of a semiconductor device and suppress deterioration in display quality.

Another object is to reduce variations in electrical characteristics of a semiconductor device including a display portion and improve in display quality of a display device.

A transistor of one embodiment of the present invention includes a first insulating layer over a first conductive layer, a semiconductor layer including a channel formation region over the first insulating layer, a second insulating layer over the semiconductor layer, and a second conductive layer over the second insulating layer. The second conductive layer covers side surfaces of the semiconductor layer with the second insulating layer provided therebetween. The semiconductor layer is surrounded by the first conductive layer and the second conductive layer in a cross section in a channel width direction.

The first conductive layer and the second conductive layer may be electrically connected to each other and have the same potential. In this case, in the cross section in the channel width direction, the left, right, top, and bottom sides of the semiconductor layer are electrically surrounded by the plurality of conductive layers whose potentials are the same.

In the transistor of one embodiment of the present invention, the second conductive layer functioning as a gate electrode has a function of electrically surrounding side surfaces of a semiconductor film in a cross section in a channel width direction. With this structure, on-state current of the transistor can be increased. This transistor structure is referred to as a surrounded channel (s-channel) structure. Note that in the s-channel structure, current flows in the whole (bulk) of the semiconductor film. Specifically, in the case where an n-channel transistor, that is, an accumulation-type transistor, is used, bulk current flows when the impurity density in a channel formation region is lower than or equal to Nd ($=1E15$ cm$^{-3}$) (Nd is activated dopant density). Even in the case where a p-channel transistor, that is, an inversion-type transistor, is used, bulk current flows when the impurity density is lower than or equal to Nd ($=1E15$ cm$^{-3}$). Since current flows in an inner part of the semiconductor film, the current is hardly affected by interface scattering, and high on-state current can be obtained. In addition, by making the semiconductor film thick, on-state current can be increased. In addition, with the s-channel structure, an excellent S value can be obtained. The relationship between the drain current and the gate voltage at around $V_{TH}$ or lower is also referred to as subthreshold characteristics, which are important to determine the performance of the transistor as a switching element. As a constant representing the subthreshold characteristics, a subthreshold swing (hereinafter abbreviated to an S value) is used. As the S value is smaller, the transistor can operate at high speed with low power consumption.

In the case where an amorphous silicon film is irradiated with laser light to be a polycrystalline silicon film and the polycrystalline silicon film is used for the channel formation region of the transistor, the grain boundary formed by irradiating with laser light reaches below the polycrystalline silicon film; thus, a larger amount of current flows in the bulk of the semiconductor film as compared with at the interface of the semiconductor film. Therefore, with the s-channel structure, an adverse effect of variations in irradiation energy of the laser light can be reduced.

In the transistor of one embodiment of the present invention, a gate electric field is applied to the semiconductor film not only in the vertical direction but also from the lateral direction. That is, the gate electric field is applied to the whole of the semiconductor film, whereby current flows in the bulk of the semiconductor film. It is thus possible to increase the field-effect mobility of the transistor. With the s-channel structure, distribution of impurities is uniform in the whole of the bulk; thus, variations in electrical characteristics can be reduced.

In the transistor of one embodiment of the present invention, in a region where the semiconductor layer and the first conductive layer overlap with each other, a distance D between the semiconductor layer and the first conductive layer is the same as the thickness t of the first conductive layer or larger than the thickness t. Furthermore, in a cross section in a channel width direction of the semiconductor layer in the above-described structure, an end portion of the first conductive layer preferably projects as compared with an end surface of the semiconductor layer. When the semiconductor layer is positioned as described above, the s-channel structure can be sufficiently effective.

When the transistor has the s-channel structure, an effect of eliminating the influence of an impurity that enters to the semiconductor film from above and below is obtained as well.

In addition, when the transistor has the s-channel structure, the semiconductor film can be prevented from being irradiated with downward and upward light and photoexcitation can be suppressed, so that an increase in off-state current can be prevented.

With the s-channel structure, the gate capacitance of the transistor is increased, and even when the impurity (donor) density in a channel portion varies, variations in electrical characteristics, such as a threshold voltage ($V_{TH}$), between a plurality of transistors on the substrate surface can be reduced to half.

With the s-channel structure, an external electric field is blocked by two upper and lower gates between which the channel portion is sandwiched; thus, drain induced barrier lowering (DIBL) can be suppressed.

Moreover, with the LDD region of the transistor, DIBL and hot-carrier degradation can be suppressed. Note that in the semiconductor film, the region overlapping with the sidewall insulating film may also serve as an offset region. Also with the offset region of the transistor, DIBL and hot-carrier degradation can be suppressed.

Furthermore, with the s-channel structure, an external electric field is blocked by the two upper and lower gates between which the channel portion is sandwiched; thus, the saturation characteristics of the Id-Vd characteristics are improved.

In the transistor using a polysilicon film, when voltage (Vd) applied to the drain electrode becomes high, electron-hole pairs are generated in the vicinity of the polysilicon film surface due to impact ionization. The generated electrons are accelerated by an electric field applied to the drain region and flow into the drain electrode. Through the impact ionization, transistor characteristics in which the amount of current flowing into the drain electrode at a high voltage is increased are obtained.

Furthermore, with the s-channel structure, the controllability of the channel is improved by the two gates surrounding the channel portion, so that the S value can be small.

In the case where the first conductive layer functioning as the first gate electrode and the second conductive layer functioning as the second gate electrode have different potentials, in the cross section in the channel width direction, it is preferable that the side surfaces of the first gate electrode also be covered with the second gate electrode. In this case, a semiconductor device includes a first insulating layer over a first conductive layer, a semiconductor layer including a channel formation region over the first insulating layer, a second insulating layer over the semiconductor layer, and a second conductive layer over the second insulating layer. In the structure, the second conductive layer covers side surfaces of the semiconductor layer and side surfaces of the first conductive layer, and the semiconductor layer is surrounded by the first conductive layer and the second conductive layer in a cross section in a channel width direction.

With the structure in which the first gate electrode and the second gate electrode have different potentials, these potentials can be controlled separately; thus, the threshold voltage can be controlled. Since these potentials can be controlled separately, the off-state current can be further reduced in an off state of the transistor. Therefore, a transistor which is suitable for a switching element in a pixel portion of a liquid crystal display device can be achieved.

To achieve a semiconductor device with less hot-carrier degradation, the gate electrode preferably has a tapered portion.

In this specification, for convenience, an angle formed by an inclined surface and a horizontal surface of a conductive layer is referred as a taper angle, a cross-sectional shape including the inclined surface having the taper angle is referred to as a tapered shape, and a portion having the tapered shape is referred to as a tapered portion.

A gate electrode having a tapered portion is used and a semiconductor layer is doped with an impurity element, whereby an impurity region can be formed in a self-aligned manner. The length of the LDD region overlapping with the gate electrode is determined by the shape of the conductive layer, which serves as a mask in the ion doping.

In one invention disclosed in this specification, the gate electrode can serve as a mask in ion doping, the LDD region overlapping with the gate electrode can be formed in a self-aligned manner, and the length (Lov) can be adjusted to a desired length. In addition, the length of the LDD region overlapping with the gate electrode can be accurately determined and the lifetime against hot-carrier degradation can be extended, so that a highly reliable semiconductor device can be manufactured with high yield.

In each of the above-described structures, the semiconductor layer includes a low-concentration impurity region (LDD region) in contact with the channel formation region and a high-concentration impurity region in contact with the low-concentration impurity region, and the low-concentration impurity region partly overlaps with the second conductive layer.

Furthermore, in an active matrix organic EL display device, a transistor used as a constant current source has the s-channel structure, whereby the deterioration can be suppressed; thus, the structure is a particularly effective structure.

Furthermore, when a transistor used in a driver circuit of an active matrix display device has the s-channel structure, the channel width W can be reduced, so that the area of the driver circuit can be reduced. For example, the width of the driver circuit is reduced to 0.5 mm, preferably 0.3 mm, and a narrower frame width can be achieved.

With the s-channel structure, high electrical characteristics (such as a high on-state current value) and a highly reliable semiconductor device can be achieved. The high on-state current value can achieve a further decrease in channel width (W). A highly integrated semiconductor device can be provided. A semiconductor device which can operate at high speed can be provided. With the s-channel structure, an excellent S value can be obtained. A semiconductor device with low power consumption can be provided. A semiconductor device with high productivity can be provided. A semiconductor device with high yield can be provided. A noble semiconductor device can be provided. A module including any of the above semiconductor devices can be provided. An electronic device including any of the above semiconductor devices or the module can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 1A to 1C are a top view and cross-sectional views illustrating one embodiment of the present invention;

FIGS. 2A to 2C are a top view and cross-sectional views illustrating one embodiment of the present invention;

FIGS. 4A to 4C are a top view and cross-sectional views illustrating one embodiment of the present invention;

FIGS. 7A to 7E are cross-sectional views illustrating steps of one embodiment of the present invention;

FIGS. 8A to 8D are cross-sectional views illustrating steps of one embodiment of the present invention;

FIGS. 9A and 9B are cross-sectional views illustrating steps of one embodiment of the present invention;

FIGS. 13A to 13C are cross-sectional views illustrating steps of one embodiment of the present invention;

FIGS. 15A to 15C are cross-sectional views illustrating steps of one embodiment of the present invention;

FIGS. 19A to 19C are a top view and cross-sectional views illustrating one embodiment of the present invention;

DETAILED DESCRIPTION OF THE INVENTION

Figure 3A:
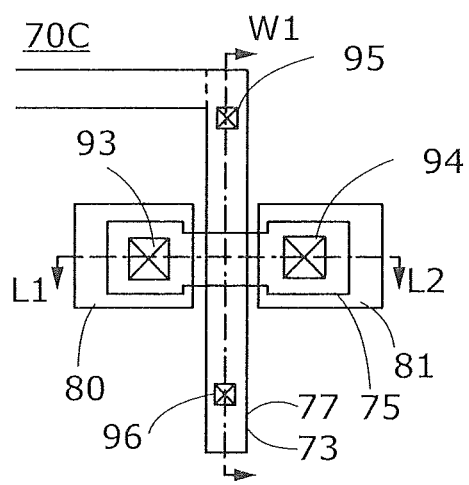
FIGS. 3A to 3C are a top view and cross-sectional views illustrating one embodiment of the present invention.

Embodiments of the present invention will be described below in detail with reference to the drawings. However, the present invention is not limited to the description below, and it is easily understood by those skilled in the art that modes and details disclosed herein can be modified in various ways. Further, the present invention is not construed as being limited to description of the embodiments below.

Embodiment 1

FIG. 1B is a cross-sectional view (in a channel length direction) of an example of an n-channel transistor 70A including a thin polysilicon film, which is one embodiment of the present invention. FIG. 1A is a top view of the transistor 70A and FIG. 1C is a cross-sectional view of the transistor 70A in a channel width W direction.

The transistor 70A includes, over a substrate 72 having an insulating surface, a conductive film 73 functioning as a gate, an insulating film 74 over the conductive film 73, a semiconductor film 75 overlapping with the conductive film 73 with the insulating film 74 provided therebetween, an insulating film 76 over the semiconductor film 75, a conductive film 77 overlapping with the semiconductor film 75 with the insulating film 76 provided therebetween and functioning as a gate, an insulating film 78 over the conductive film 77, an insulating film 79 over the insulating film 78, and a conductive film 80 and a conductive film 81 which are electrically connected to the semiconductor film 75 through openings in the insulating films 76, 78, and 79 and function as a source and a drain.

The semiconductor film 75 includes a channel formation region 82 overlapping with the conductive film 77, a pair of lightly doped drain (LDD) regions 83 between which the channel formation region 82 is sandwiched, and a pair of impurity regions 84 between which the channel formation region 82 and the LDD regions 83 are sandwiched. The pair of impurity regions 84 functions as a source region and a drain region. An impurity element imparting n-type conductivity to the semiconductor film 75, such as phosphorus (P) or arsenic (As), is added to the LDD regions 83 and the impurity regions 84.

The transistor 70A includes a first insulating layer (the insulating film 74) over a first conductive layer (the conductive film 73), the semiconductor film 75 including the channel formation region 82 over the first insulating layer (the insulating film 74), a second insulating layer (the insulating film 76) over the semiconductor film 75, and a second conductive layer (the conductive film 77) over the second insulating layer (the insulating film 76). In the cross section in the channel width direction, the second conductive layer (the conductive film 77) covers side surfaces of the semiconductor film 75 with the second insulating layer (the insulating film 76) provided therebetween. In addition, the semiconductor film 75 is surrounded by the first conductive layer (the conductive film 73) and the second conductive layer (the conductive film 77); that is, the transistor 70A has an s-channel structure.

With the structure in FIG. 1C, current flows in the whole (bulk) of the semiconductor film 75. Since current flows through the semiconductor film 75, an adverse effect of interface scattering is unlikely to occur, leading to a high on-state current. Note that an increase in the thickness of the semiconductor film 75 enables the on-state current to increase.

In the transistor 70A, a gate electric field is applied to the semiconductor film 75 not only in the vertical direction but also from the lateral direction. That is, the gate electric field is applied to the whole of the semiconductor film 75, whereby current flows in the bulk of the semiconductor film 75. It is thus possible to increase the field-effect mobility of the transistor 70A. Distribution of impurities is uniform in the whole of the bulk; thus, variations in electrical characteristics can be reduced.

When the transistor has an s-channel structure, an effect of eliminating the influence of an impurity that enters to the semiconductor film 75 from above and below is obtained as well. Moreover, the first conductive layer (the conductive film 73) and the second conductive layer (the conductive film 77) can prevent the semiconductor film 75 from being irradiated with downward and upward light to suppress photoexitation, so that an increase in off-state current can be prevented.

Here, an example where an n-channel transistor is used is shown; however, a p-channel transistor can be fabricated if an impurity element imparting p-type conductivity to the semiconductor film 75, such as boron (B), aluminum (Al), or gallium (Ga), is added instead of the impurity element imparting n-type conductivity to the semiconductor film 75. Alternatively, an impurity element imparting p-type conductivity may be slightly added to the channel formation region 82 of the n-channel transistor 70A.

Note that the semiconductor film 75 may be crystallized by various techniques. Examples of the various techniques of crystallization are a laser crystallization method using a laser beam and a crystallization method using a catalytic element. Alternatively, a crystallization method using a catalytic element and a laser crystallization method may be used in combination. In the case of using a thermally stable substrate such as quartz for the substrate 72, any of the following crystallization methods can be used in combination: a thermal crystallization method with an electrically-heated oven, a lamp anneal crystallization method with infrared light, a crystallization method with a catalytic element, and high temperature annealing at about 950° C.

In the case where an amorphous silicon film is irradiated with laser light to be a polycrystalline silicon film and the polycrystalline silicon film is used for the channel formation region 82 of the transistor 70A, the grain boundary formed by irradiating with laser light reaches below the polycrystalline silicon film; thus, a larger amount of current flows in the bulk of the semiconductor film as compared with at the interface of the semiconductor film. Therefore, an adverse effect of variations in irradiation energy of the laser light can be reduced.

In the past, the threshold voltage has been controlled so that an impurity element is added to a channel region at a low concentration. In the case where a semiconductor layer is sandwiched between a pair of gate electrodes, there has been a problem in that the probability of generating carriers at the interface between the semiconductor layer and an insulating film is high, the carriers are injected into the insulating film and the interface between the semiconductor layer and the insulating film, and the threshold voltage is increased. In addition, from an energy band structure of the channel region, it is found that a carrier path is formed only at the interface between the semiconductor layer and the insulating film and in the vicinity of the interface. Thus, a big problem has been a reduction in mobility and drain current due to the injection of hot carriers accelerated by voltage applied to the drain into the insulating film and the interface between the insulating film and the semiconductor layer.

In the transistor 70A of one embodiment of the present invention, a gate electric field is applied to the semiconductor film not only in the vertical direction but also from the lateral direction. That is, the gate electric field is applied to the whole of the semiconductor film, whereby current flows in the bulk of the semiconductor film. It is thus possible to increase the field-effect mobility of the transistor. Distribution of impurities is uniform in the whole of the bulk; thus, variations in electrical characteristics can be reduced.

Although the structure in which the conductive film 77 functioning as a gate and the conductive film 73 functioning as a back gate electrode are included is shown in FIGS. 1A and 1B, another structure may be employed. For example, depending on a circuit to be used, a transistor in which the conductive film 73 functioning as a back gate electrode is not provided may be partly provided.

In addition, as in FIGS. 1B and 1C, the conductive film 77 functioning as a gate has a tapered portion. When a gate electrode having a tapered portion is used and a semiconductor layer is doped with an impurity element to form an impurity region in a self-aligned manner, a semiconductor device with less hot-carrier degradation can be achieved.

Furthermore, the example where the conductive film 77 functioning as a gate and the conductive film 73 functioning as a back gate electrode are electrically connected to each other is shown in FIG. 1A, and a structure in which the potentials thereof can be separately controlled is shown in FIG. 2A.

FIG. 2A is a top view of a transistor 70B. FIG. 2B is a cross-sectional view taken along line L1-L2 in the channel length direction of the transistor 70B. FIG. 2C is a cross-sectional view taken along line W1-W2 in the channel width direction of the transistor 70B.

The transistor 70B in FIG. 2B is different from the transistor 70A in FIG. 1B in the kind of the insulating film 74. FIG. 2B shows an example where an insulating film obtained by a plasma CVD method or the like is used as the insulating film 74. In FIG. 2B, the surface of the insulating film has a projection because of the conductive film 73 functioning as the back gate electrode and a semiconductor film is formed over the insulating film; thus, the surface shape of the base is reflected also in the surface of the semiconductor film.

In FIG. 2C, as in FIG. 1C, an s-channel structure in which the channel formation region is surrounded by the conductive film 77 functioning as the gate and the conductive film 73 functioning as the back gate electrode is shown.

Figure 3C:
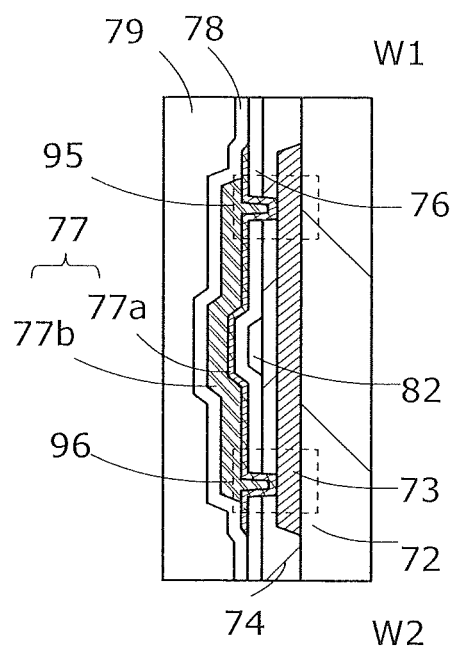
Figure 3B:
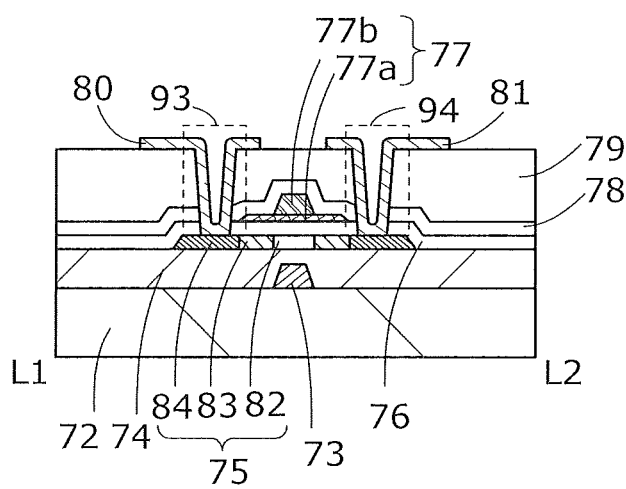

FIG. 3A is a top view of a transistor 70C. FIG. 3B is a cross-sectional view taken along line L1-L2 in the channel length direction of the transistor 70C. FIG. 3C is a cross-sectional view taken along line W1-W2 in the channel width direction of the transistor 70C.

FIG. 3A shows the conductive film 77, the conductive film 73, the semiconductor film 75, the conductive film 80, the conductive film 81, an opening 93, an opening 94, an opening 95, and an opening 96. The conductive film 77 functions as a gate. The conductive film 73 functions as a back gate. Details of the components denoted by the same reference numerals as those in FIG. 1A are omitted in the description of FIG. 3A. The openings 93 and 94 are openings for connecting the semiconductor film 75 and the conductive films 80 and 81. The openings 95 and 96 are openings for electrically connecting the conductive films 77 and 73.

FIG. 3B shows, over the substrate 72, the conductive film 73, the insulating film 74, the semiconductor film 75 overlapping with the conductive film 73 with the insulating film 74 provided therebetween, the insulating film 76 over the semiconductor film 75, conductive films 77a and 77b overlapping with the semiconductor film 75 with the insulating film 76 provided therebetween and functioning as a gate, the insulating film 78 over the conductive films 77a and 77b, the insulating film 79 over the insulating film 78, and the conductive films 80 and 81 electrically connected to the semiconductor film 75 through the openings 93 and 94 in the insulating films 76, 78, and 79 and functioning as a source and a drain. Details of the components denoted by the same reference numerals as those in FIG. 1B are omitted in the description of FIG. 3B.

FIG. 3C shows, over the substrate 72, the conductive film 73, the insulating film 74, the channel formation region 82, the insulating film 76, the conductive film 77a and the conductive film 77b which are electrically connected to the conductive film 73 in the openings 95 and 96, the insulating film 78 over the conductive films 77a and 77b, and the insulating film 79 over the insulating film 78. The semiconductor film 75 includes the channel formation region 82, the LDD region 83, and the impurity region 84. The structure of the conductive films 77a and 77b allows doping through a region of the conductive film 77a which does not overlap with the conductive film 77b, whereby the impurity regions can be formed in a self-aligned manner. The length of the LDD region overlapping with the conductive film 77a is determined by the conductive film 77b, which serves as a mask in the ion doping. The conductive films 77a and 77b can serve as masks in the ion doping, the LDD region overlapping with the conductive film 77a can be formed in a self-aligned manner, and the length (Lov) can be adjusted to a desired length. In addition, the length of the LDD region overlapping with the conductive film 77a can be accurately determined and the lifetime against hot-carrier degradation can be extended, so that a highly reliable semiconductor device can be manufactured with high yield.

Details of the components denoted by the same reference numerals as those in FIG. 1C are omitted in the description of FIG. 3C.

In the structure illustrated in the top view and the cross-sectional views of FIGS. 3A to 3C, the conductive film 77 functioning as a gate and the conductive film 73 electrically connected to the conductive film 77 and functioning as a back gate electrically surround the channel formation region 82 of the semiconductor film 75 in the channel width direction. In other words, in this structure, the conductive films wrap around the top surface, the bottom surface, and the side surfaces of the channel formation region. Such a structure can increase the on-state current and reduce the size in the channel width direction. Besides, such a structure that the channel formation region is surrounded by the conductive films can easily block light and thus can suppress photoexcitation caused by undesired light irradiation on the channel formation region.

In addition, the structure shown in the top view and the cross-sectional views of FIGS. 3A to 3C can avoid an electrical connection at the ends of the semiconductor film 75 in the W1-W2 direction caused by an undesired increase in conductivity. The influence of non-uniform distribution of impurity elements added to the LDD region 83 and the impurity region 84 can be reduced.

The influence of non-uniform distribution of impurity elements added to the semiconductor film 75 can be reduced.

Although the structure shown in the top view and the cross-sectional view of FIGS. 3A to 3C includes a gate and a back gate electrically connected to each other, different potentials may be supplied to them as shown in FIGS. 2A to 2C, which is particularly effective in the case where all transistors in the circuit have n-channel conductivity. In such a structure, the threshold voltage of a transistor can be controlled by applying voltage to a back gate; thus, a logic circuit, such as an inverter circuit, can be formed using ED-MOS transistors whose threshold voltages are different from each other. The area occupied by a pixel driver circuit using such a logic circuit can be reduced, leading to narrowing the bezel of a display device. In addition, when the voltage of the back gate is set so that a transistor is turned off, the off-state current of the transistor can be further reduced. Therefore, even when the refresh rate of the display device is increased, written voltages can be maintained and accordingly the number of writings can be reduced, leading to low power consumption of the display device.

Note that the top view and the cross-sectional views of FIGS. 3A to 3C show just one example, and another structure can be employed. FIGS. 4A to 4C are a top view and cross-sectional views different from those of FIGS. 3A to 3C.

Different points of the structure shown in FIGS. 4A to 4C from the structure shown in FIGS. 3A to 3C are that the conductive film 77 functioning as a gate is a single layer and that the openings 95 and 96 are closer to the channel formation region 82. Such a structure facilitates application of electric field to the channel formation region from the top, bottom, and side surfaces of the channel formation region of a transistor 70D. Effects similar to those of the structure in FIGS. 3A to 3C can be obtained from the s-channel structure shown in FIGS. 4A to 4C.

Figure 5A:
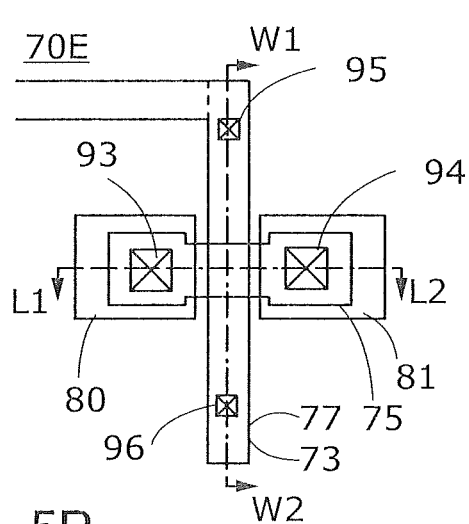
FIGS. 5A to 5C are a top view and cross-sectional views illustrating one embodiment of the present invention.
Figure 5C:
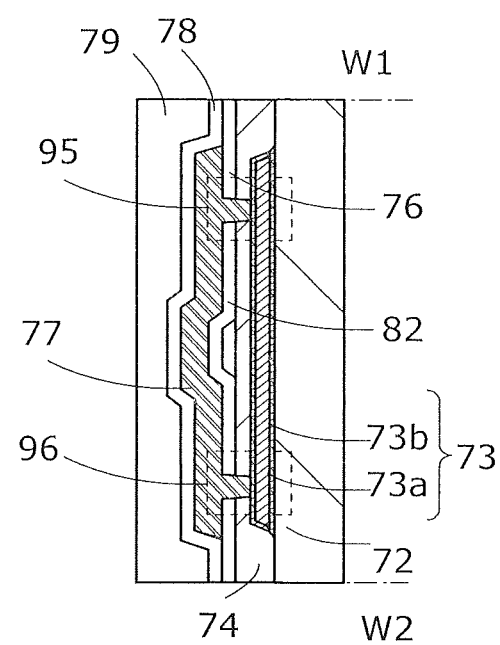
Figure 5B:
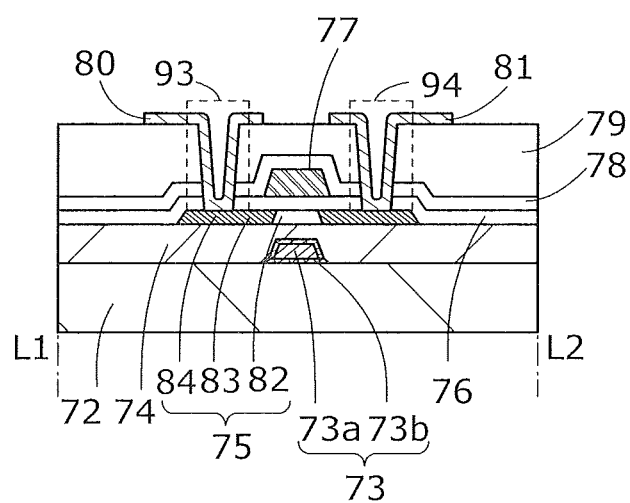

FIGS. 5A to 5C show a top view and cross-sectional views of a structure different from the structures shown in FIGS. 3A to 3C and FIGS. 4A to 4C.

A different point of the structure shown in FIGS. 5A to 5C from the structures shown in FIGS. 3A to 3C and FIGS. 4A to 4C is that the conductive film 73 functioning as a back gate of a transistor 70E is composed of a conductive film 73a and a conductive film 73b which is surrounded by the conductive film 73a. Effects similar to those of the structure in FIGS. 3A to 3C can be obtained from the s-channel structure shown in FIGS. 5A to 5C.

In addition, even when the conductive film 73b contains a movable element (e.g., copper (Cu)), the structure shown in FIGS. 5A to 5C can prevent the movable element from entering the semiconductor film causing degradation of the semiconductor film.

As materials of the conductive film 73a, which serves as a barrier film and provided on the formation surface of the wiring, any of tungsten (W), molybdenum (Mo), chromium (Cr), titanium (Ti), and tantalum (Ta), which are high melting point materials, an alloy thereof (e.g., W—Mo, Mo—Cr, or Ta—Mo) or a nitride thereof (e.g., tungsten nitride, titanium nitride, tantalum nitride, or TiSiN$_x$), or the like can be used. A sputtering method, a CVD method, or the like can be adopted as the formation method. As the materials of the conductive film 73b, copper (Cu) is preferable; however, there is no particular limitation as long as they are low resistance materials. For example, silver (Ag), aluminum (Al), gold (Au), an alloy thereof, or the like can be used. As the formation method of the conductive film 73b, a sputtering method is preferable; however, a CVD method can be adopted as long as conditions that do not damage the resist mask are selected.

Embodiment 2

In this embodiment, an example where an n-channel transistor 70 and a p-channel transistor 71 are provided over the same substrate is shown. When the n-channel transistor 70 and the p-channel transistor 71 are combined, a CMOS circuit or the like can be fabricated.

Figure 6A:
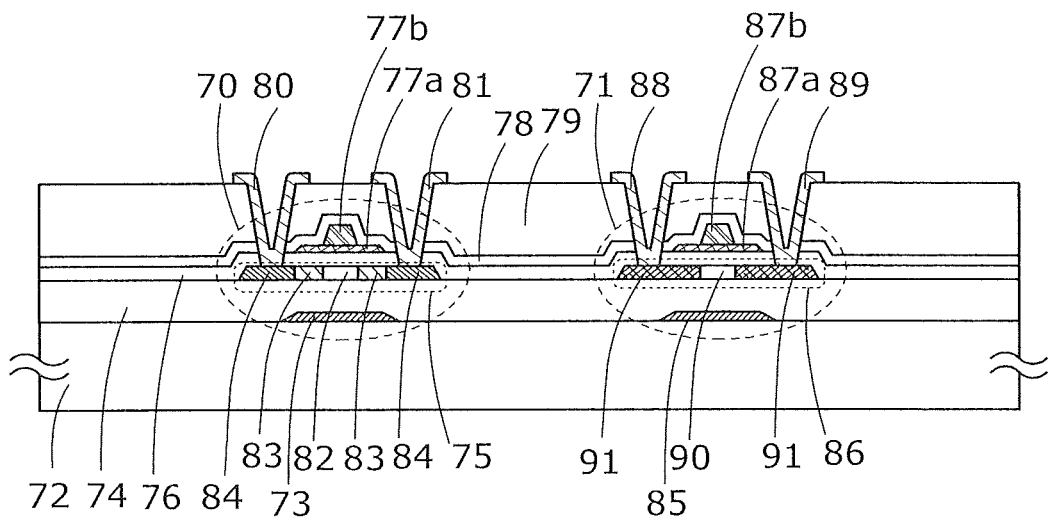
FIGS. 6A and 6B are cross-sectional views each illustrating one embodiment of the present invention.
Figure 6B:
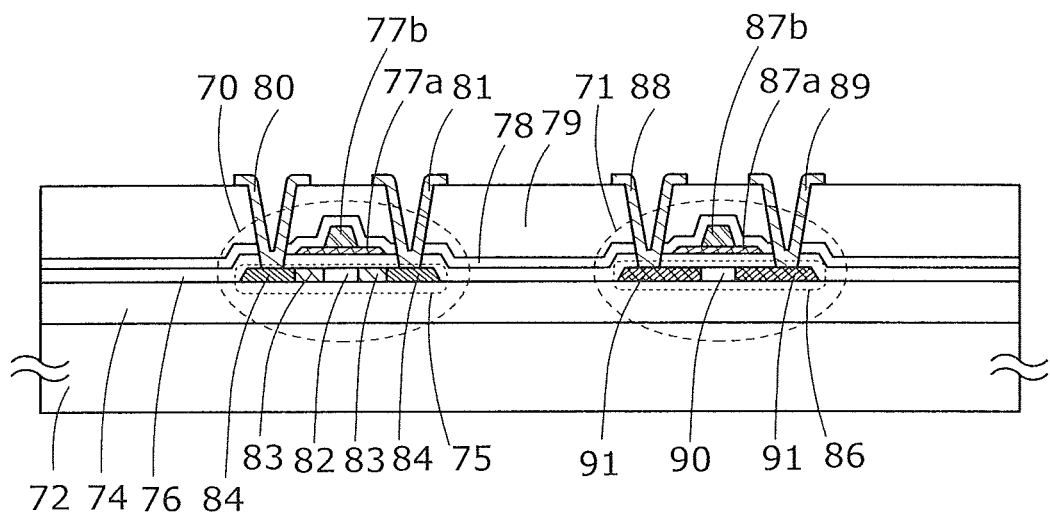

FIGS. 6A and 6B are cross-sectional views of transistors each including a thin silicon film, which can be used in the display device of one embodiment of the present invention. FIGS. 6A and 6B show n-channel transistors 70 and p-channel transistors 71.

The transistor 70 includes, over a substrate 72 having an insulating surface, a conductive film 73 functioning as a gate, an insulating film 74 over the conductive film 73, a semiconductor film 75 overlapping with the conductive film 73 with the insulating film 74 provided therebetween, an insulating film 76 over the semiconductor film 75, conductive films 77a and 77b overlapping with the semiconductor film 75 with the insulating film 76 provided therebetween and functioning as a gate, an insulating film 78 over the conductive films 77a and 77b, an insulating film 79 over the insulating film 78, and conductive films 80 and 81 electrically connected to the semiconductor film 75 through openings in the insulating films 76, 78, and 79 and functioning as a source and a drain.

The width of the conductive film 77b in the channel length direction is shorter than that of the conductive film 77a. The conductive films 77a and 77b are stacked in this order from the insulating film 76 side. The semiconductor film 75 includes a channel formation region 82 overlapping with the conductive film 77b, a pair of lightly doped drain (LDD) regions 83 between which the channel formation region 82 is sandwiched, and a pair of impurity regions 84 between which the channel formation region 82 and the LDD regions 83 are sandwiched. The pair of impurity regions 84 serves as a source region and a drain region. An impurity element imparting n-type conductivity to the semiconductor film 75, such as phosphorus (P) or arsenic (As), is added to the LDD regions 83 and the impurity regions 84.

The transistor 71 includes, over the substrate 72 having an insulating surface, a conductive film 85 functioning as a gate, the insulating film 74 over the conductive film 85, a semiconductor film 86 overlapping with the conductive film 85 with the insulating film 74 provided therebetween, the insulating film 76 over the semiconductor film 86, conductive films 87a and 87b overlapping with the semiconductor film 86 with the insulating film 76 provided therebetween and functioning as a gate, the insulating film 78 over the conductive films 87a and 87b, the insulating film 79 over the insulating film 78, and conductive films 88 and 89 electrically connected to the semiconductor film 86 through openings in the insulating films 76, 78, and 79 and functioning as a source and a drain.

The width of the conductive film 87b in the channel length direction is shorter than that of the conductive film 87a. The conductive films 87a and 87b are stacked in this order from the insulating film 76 side. The semiconductor film 75 includes a channel formation region 90 overlapping with the conductive film 87b and a pair of impurity regions 91 between which the channel formation region 90 is sandwiched. The pair of impurity regions 91 functions as a source region and a drain region. An impurity element imparting p-type conductivity to the semiconductor film 86, such as boron (B), aluminum (Al), or gallium (Ga), is added to the impurity regions 91.

Although FIG. 6A shows a structure in which the conductive films 77a and 77b function as a gate and the conductive film 73 functions as a back gate electrode, another structure may be employed. For example, the conductive film 73 functioning as a back gate electrode may be omitted as shown in FIG. 6B. Although FIG. 6A shows a structure in which the conductive films 87a and 87b function as a gate and the conductive film 85 functions as a back gate electrode, one embodiment of the present invention is not limited thereto. For example, the conductive film 85 functioning as a back gate electrode may be omitted as shown in FIG. 6B.

The n-channel transistor 70 in FIG. 6A has an s-channel structure as in Embodiment 1 and corresponds to the transistor 70C in FIG. 3B. A top view of the n-channel transistor 70 in FIG. 6A corresponds to the top view of the transistor 70C in FIG. 3A. A cross-sectional view in the channel width direction of the n-channel transistor 70 in FIG. 6A corresponds to the cross-sectional view of the transistor 70C in FIG. 3C.

This embodiment can be freely combined with Embodiment 1.

Embodiment 3

In this embodiment, cross-sectional views of transistors each including a back gate electrode, which are shown in FIGS. 1A to 1C, FIGS. 2A to 2C, FIGS. 3A to 3C, FIGS. 4A to 4C, FIGS. 5A to 5C, and FIGS. 6A and 6B, and a pixel electrode provided over the transistors is illustrated to show an example of a fabrication process thereof. Although FIGS. 7A to 7E, FIGS. 8A to 8D, and FIGS. 9A and 9B show a process of fabricating a p-channel transistor and an n-channel transistor over a substrate as an example, in the case where a circuit is configured by transistors having the same conductivity, the process of fabricating either one of the transistors is used.

First, a conductive film 502 functioning as a back gate electrode is formed on an insulating surface of a substrate 501 as shown in FIG. 7A. The conductive film 502 can be formed using a conductive material containing one or more selected from Al, W, Mo, Ti, and Ta. Although tungsten is used for the conductive film 502 in this embodiment, a film in which tungsten is stacked on tantalum nitride may be used. The conductive film 502 may be composed of a plurality of films without limitation to a single film.

As the substrate 501, for example, a glass substrate made of barium-borosilicate glass or alumino-borosilicate glass, a quartz substrate, a ceramic substrate, or the like can be used. A silicon substrate or a metal substrate, each having an insulating film formed thereover may be used. Although a substrate formed of a flexible synthetic resin such as plastic generally has a lower resistance temperature than the aforementioned substrates, it may be used as long as being resistant to a processing temperature during manufacturing steps.

Next, an insulating film 503 is formed to cover the conductive film 502. The insulating film 503 is composed of an insulating film 503a and an insulating film 503b stacked thereon. A silicon oxynitride film is used as the insulating film 503a, for example. A silicon oxide film or a silicon oxynitride film is used as the insulating film 503b, for example. Note that the insulating film 503 is not limited to the structure and may be composed of a single insulating film or three or more insulating films. Also, the materials are not limited thereto.

The surface of the insulating film 503 (i.e., the surface of the insulating film 503b) may have projections and depressions because of the conductive film 502 that has been formed. In this case, it is desirable to planarize the projections and depressions. In this embodiment, chemical-mechanical polishing (CMP) is performed for the planarization.

Next, an amorphous semiconductor film 504 is formed on the insulating film 503 by a plasma CVD method. Depending on the amount of hydrogen contained in the amorphous semiconductor film 504, a dehydrogenation treatment is desirably performed before a crystallization step. The dehydrogenation treatment is preferably performed for several hours at a heating temperature of 400° C. to 550° C. so that the amount of hydrogen is reduced to 5 atom % or less. Alternatively, a sputtering method, an evaporation method, or the like may be used for forming the amorphous semiconductor film. In any case, impurity elements contained in the film, such as oxygen and nitrogen, are desirably reduced to a sufficient level.

For example, silicon germanium can be used as the semiconductor without limitation to silicon. In the case of using silicon germanium, the concentration of germanium is preferably approximately 0.01 atomic % to 4.5 atomic %.

Note that when the insulating film 503 and the amorphous semiconductor film 504 are formed by a plasma CVD method, these films can be successively formed without exposure to the air. Such a successive deposition can minimize contamination of the surface with the air, so that variations in characteristics of the transistors can be reduced.

Next, a catalyst is added to the amorphous semiconductor film 504. In this embodiment, a nickel acetate solution containing nickel of 1 ppm to 100 ppm by weight is applied by a spinner. Note that such a treatment may be performed so as to apply the nickel acetate solution sufficiently that the surface of the amorphous semiconductor film 504 is processed using an ozone water solution to form an extremely thin oxide film thereon. The oxide film is etched away with a mixed solution of hydrofluoric acid and hydrogen peroxide water to obtain a clean surface. Then, the treatment using an ozone water solution is performed again to form an extremely thin oxide film. As a result of oxidizing the surface of the semiconductor film, which is originally hydrophobic, the nickel acetate solution can be applied evenly. The above is the description of FIG. 7A.

Needless to say, the method for adding a catalyst to the amorphous semiconductor film is not limited to the above, and a sputtering method, an evaporation method, a plasma treatment, or the like may be used.

Next, heat treatment is performed at 500° C. to 650° C. for 4 hours to 24 hours (e.g., at 570° C. for 14 hours), whereby the nickel-containing layer 505 enhances the crystallization. Thus, a highly crystallized semiconductor film is formed.

As a method of the heat treatment, a furnace annealing method using an electrically heated furnace; an RTA method using a lamp, such as a halogen lamp, a metal halide lamp, a xenon arc lamp, a carbon arc lamp, a high-pressure sodium lamp, or a high-pressure mercury lamp, can be employed. Alternatively, a gas heating RTA using a heated inert gas can be used.

In the case of an RTA method, a lamp light source for heating is turned on for 1 second to 60 seconds, preferably 30 seconds to 60 seconds, which is repeated 1 to 10 times, preferably 2 to 6 times. The lamp light source may have any light intensity as long as the amorphous semiconductor film 504 can be heated instantaneously to about 600° C. to 1000° C., preferably about 650° C. to 750° C. The semiconductor film is just instantaneously subjected to such high temperature, and there is no change in shape of the substrate 501.

In the case of a furnace annealing method, heat treatment at 500° C. for about one hour is first performed to expel hydrogen from the amorphous semiconductor film 504. Then, heat treatment is performed in an electrically heated furnace under a nitrogen atmosphere at 550° C. to 600° C., preferably 580° C., for four hours, thereby crystallizing the amorphous semiconductor film 504.

Note that catalyst elements other than nickel (Ni), which is used in this embodiment, such as germanium (Ge), iron (Fe), palladium (Pd), tin (Sn), lead (Pb), cobalt (Co), platinum (Pt), copper (Cu), or gold (Au) may be used.

Next described is gettering using catalyst elements which exist in the crystalline semiconductor film 506. After the crystallization using a catalyst element, the crystalline semiconductor film 506 probably contains residual catalyst elements (i.e., nickel) at an average concentration of more than $1 \times 10^{19}/cm^3$. Such residual catalyst elements can adversely affect the transistor characteristics, and thus, a process of reducing the concentration of catalyst elements is required.

Among a variety of gettering methods, an example described in this embodiment is gettering before the crystalline semiconductor film 506 is patterned. First, a barrier layer 507 is formed on the surface of the crystalline semiconductor film 506 as shown in FIG. 7B. The barrier layer 507 is provided to prevent the crystalline semiconductor film 506 from being etched in a later step of removing a gettering site.

The thickness of the barrier layer 507 is about 1 nm to 10 nm. Chemical oxide formed by treatment using ozone water may be used as the barrier layer. Chemical oxide can also be formed by treatment using a mixed aqueous solution of hydrogen peroxide water and sulfuric acid, hydrochloric acid, nitric acid, or the like. Alternatively, a plasma treatment under an oxygen atmosphere, an oxidation treatment where ozone is generated by ultraviolet light irradiation under an oxygen-containing atmosphere, or the like can be used. A thin oxide film formed in a clean oven at a heating temperature of about 200° C. to 350° C. may be used as the barrier layer. Alternatively, an oxide film serving as the barrier layer may be deposited by a plasma CVD method, a sputtering method, an evaporation method, or the like to have a thickness of about 1 nm to 5 nm. In any cases, a film in which catalyst elements can move to the gettering site side in the gettering step and which serves as a barrier against an etchant in the step of removing the gettering site (i.e., protects the crystalline semiconductor film 506 from an etchant) should be used. Examples of such a film include a chemical oxide film formed by a treatment using ozone water, a silicon oxide film ($SiO_x$), and a porous film.

Next, as a gettering site 508, a gettering semiconductor film (typically, an amorphous silicon film) containing a rare gas element at a concentration of $1 \times 10^{20}/cm^3$ or more and having a thickness of 25 nm to 250 nm is formed on the barrier layer 507 by a sputtering method. A low-density film is preferably formed so that the gettering site 508, which is removed later, is etched more preferentially than the crystalline semiconductor film 506.

Note that a rare gas element does not adversely affect the crystalline semiconductor film 506 because the rare gas element itself is inert in the semiconductor film. The rare gas element may be one or more of helium (He), neon (Ne), argon (Ar), krypton (Kr), and xenon (Xe).

Then, heat treatment is performed for gettering (FIG. 7B). A furnace annealing method, an RTA method, or the like is used for the heat treatment. In the case of a furnace annealing method, the heat treatment is conducted at 450° C. to 600° C. for 0.5 hours to 12 hours in a nitrogen atmosphere. In the case of an RTA method, a lamp light source for the heating is turned on for 1 second to 60 seconds, preferably 30 seconds to 60 seconds, which is repeated 1 to 10 times, preferably 2 to 6 times. The lamp light source may have any light intensity as long as the semiconductor film can be heated instantaneously to about 600° C. to 1000° C., preferably about 700° C. to 750° C.

By the heat treatment, the catalyst elements in the crystalline semiconductor film 506 are diffused by thermal energy toward the gettering site 508 as shown by the arrows. Thus, the gettering efficiency depends on a treatment temperature; the higher the treatment temperature is, the faster the gettering proceeds.

After the gettering process is finished, the gettering site 508 is selectively etched and removed. As the etching, dry etching using $ClF_3$ without plasma or wet etching using an alkaline solution such as a water solution containing hydrazine or tetramethyl ammonium hydroxide (chemical formula $(CH_3)_4NOH$) can be performed. The barrier layer 507 serves as an etching stopper in this step and is removed using fluoric acid after that (FIG. 7C).

After the barrier layer 507 is removed, the crystalline semiconductor film 506 is patterned to form island-shaped semiconductor films 509 and 510 (FIG. 7D). The thickness of the semiconductor films 509 and 510 is 25 nm to 100 nm preferably 30 nm to 60 nm. Then, an insulating film 511 is formed so as to cover the semiconductor films 509 and 510. Since about 10 nm to 40 nm of the insulating film 511 will be reduced by dry etching which is performed later for forming an electrode functioning as a gate electrode, the thickness of the insulating film 511 is desirably determined in consideration of the reduction in thickness. Specifically, the insulating film 511 is formed to have a thickness of 40 nm to 150 nm (preferably 60 nm to 120 nm).

For example, silicon oxide, silicon nitride, silicon oxide containing nitrogen, or the like can be used for the insulating film 511. Note that the case where the insulating film 511 is formed using a single insulating film is described as an example in this embodiment; however, the insulating film 511 may be formed using two or more insulating films. As the film-forming method, a plasma CVD method, a sputtering method, or the like can be used. For example, in the case where the insulating film 511 is formed using silicon oxide by plasma enhanced CVD, a mixed gas of TEOS (tetraethyl orthosilicate) and $O_2$ is used; reaction pressure is 40 Pa; substrate temperatures are 300° C. to 400° C.; and high-frequency (13.56 MHz) power densities are 0.5 W/cm² to 0.8 W/cm².

Aluminum nitride can be used for the insulating film 511. Aluminum nitride has comparatively high thermal conductivity and can efficiently diffuse heat generated in a transistor. Further alternatively, silicon oxide, silicon oxynitride, or the like containing no aluminum may be formed and then aluminum nitride may be stacked thereon to form the insulating film 511.

Then, a conductive film is deposited on the insulating film 511 (FIG. 7E). In this embodiment, a tantalum nitride conductive film 512*a* and a tungsten conductive film 512*b* are deposited to have a thickness of 20 nm to 100 nm and a thickness of 100 nm to 400 nm, respectively. Specific deposition conditions of the tantalum nitride conductive film 512*a* are as follows: the purity of Ta target is 99.99%; the temperature in a chamber is room temperature; the flow rates of Ar and $N_2$ are 50 ml/min and 10 ml/min, respectively; the pressure in the chamber is 0.6 Pa; the deposition power is 1 kW; and the deposition rate is approximately 40 nm/min. The deposition conditions of the second film, the tungsten conductive film 512b are as follows: the purity of tungsten target is 99.99%; the temperature in a chamber is 230° C.; the flow rate of Ar is 100 ml/min; the pressure in the chamber is 1.5 Pa; the deposition power is 6 kW; and the deposition rate is approximately 390 nm/min.

Although the non-limiting example is described in this embodiment in which such a two-layer conductive film is used as an electrode functioning as a gate electrode, the conductive film may be composed of a single layer or three layers or more. In addition, the materials of the conductive layers are not limited to those described in this embodiment.

Specifically, the conductive films can each be composed of an element selected from Ta, W, Ti, Mo, Al, and Cu, or an alloy or a compound containing the element as its main component. In the case where any of the conductive films overlaps with a semiconductor film, the conductive film is preferably formed using a light-blocking material to block entry of light to the semiconductor film. For example, tantalum and tungsten may be used for the first layer and the second layer, respectively; tantalum nitride and aluminum may be used for the first layer and the second layer, respectively; and tantalum nitride and copper may be used for the first layer and the second layer, respectively. A silver-palladium-copper alloy may be used for either the first layer or the second layer. Alternatively, a three-layer structure in which tungsten, an aluminum-silicon (Al—Si) alloy, and titanium nitride are stacked in this order may be used. Instead of tungsten, tungsten nitride may be used. Instead of the aluminum-silicon (Al—Si) alloy, an aluminum-titanium (Al—Ti) alloy may be used. Instead of titanium nitride, titanium may be used. Note that in order to make a difference between the widths of the plurality of conductive films in the channel length direction, materials of the conductive films are selected in consideration of the etching selectivity.

Note that it is important to select an optimal etching gas for the materials of the conductive films.

Next, a mask 514 is formed, and the conductive films 512a and 512b are etched as shown in FIG. 8A (a first etching process). In this embodiment, an inductively coupled plasma (ICP) etching method is used. A mixed gas of $Cl_2$, $CF_4$, and $O_2$ is used as an etching gas. The etching gas pressure in a chamber is 1.0 Pa. An RF (13.56 MHz) power of 500 W is applied to a coiled electrode to generate plasma. An RF (13.56 MHz) power of 150 W is applied to a substrate stage (lower electrode) so that self-bias voltage is applied to the substrate. Then, the etching gas is replaced with a mixed gas of $Cl_2$ and $CF_4$, and the total pressure is set to 1.0 Pa. An RF (13.56 MHz) power of 500 W and that of 20 W are applied to the coiled electrode and to the substrate (sample stage), respectively.

With the use of the etching gas of $Cl_2$ and $CF_4$, the etching rate of the tantalum nitride conductive film 512a is substantially equal to that of the tungsten conductive film 512b, so that the films are etched to a similar thickness.

By the first etching process, a first shape conductive film 515 composed of a lower layer 515a and an upper layer 515b and a first shape conductive film 516 composed of a lower layer 516a and an upper layer 516b are each formed. Note that the first etching process makes each side surface of the lower layers 515a and 516a and the upper layers 515b and 516b slightly tapered. In addition, as a result of etching so as not to leave residuals of the conductive films, the surface of the insulating film 511 which is not covered by the first shape conductive films 515 and 516 might be reduced in thickness by about 5 nm to 10 nm or more.

Next, the first shape conductive films 515 and 516 are etched (a second etching process) using the mask 514 whose surface is etched by the first etching process to be reduced in width. The ICP etching method is used in the second etching process as in the first etching process. A mixed gas of $Cl_2$, $SF_6$, and $O_2$ is used as an etching gas. The etching gas pressure in the chamber is 1.3 Pa. An RF (13.56 MHz) power of 700 W is applied to the coiled electrode to generate plasma. An RF (13.56 MHz) power of 10 W is applied to the substrate stage (lower electrode) so that self-bias voltage is applied to the substrate.

The addition of $O_2$ to the mixed gas of $SF_6$ and $Cl_2$ increases the etching rate of tungsten and dramatically decreases the etching rate of tantalum nitride contained in the lower layers 515a and 516a of the first shape conductive films 515 and 516, so that their etching selectivity is secured.

By the second etching process, a second shape conductive film 517 (a lower layer 517a and an upper layer 517b) and a second shape conductive film 518 (a lower layer 518a and an upper layer 518b) are formed. The width in the channel length direction of the upper layers 517b and 518b is smaller than that of the lower layers 517a and 518a. Note that by the second etching process, the surface of the insulating film 511 which is not covered by the second shape conductive films 517 and 518 is reduced in thickness by about 5 nm to 10 nm or more.

Next, as shown in FIG. 8B, an impurity which imparts n-type conductivity to the semiconductor films 509 and 510 is added using the second shape conductive films 517 and 518 as masks (a first doping process). An ion implantation method is used for the doping. The doping is performed under the conditions where the dosage is $1 \times 10^{13}$ atoms/cm$^2$ to $5 \times 10^{14}$ atoms/cm$^2$ and the accelerating voltage is in the range of from 40 kV to 80 kV. As an impurity element imparting n-type conductivity, an element belonging to Group 5 such as P, As, or Sb; an element belonging to Group 6 such as S, Te, or Se; or the like which functions as a donor is used. In this embodiment, P is used. By the first doping process, impurity regions 520 and 521 are formed in a self-aligned manner. The impurity element imparting n-type conductivity is added to the impurity regions 520 and 521 at a concentration of $1 \times 10^{18}$ atoms/cm$^3$ to $1 \times 10^{20}$ atoms/cm$^3$.

Next, as shown in FIG. 8C, a second doping process is performed using the upper layers 517b and 518b of the second shape conductive films 517 and 518 as masks. The acceleration voltage in the second doping process is higher than that in the first doping process so that an impurity is transmitted through the lower layers 517a and 518a of the second shape conductive films 517 and 518. In addition, in order to form an LDD region, the dosage of an n-type impurity in the second doping process is lower than that in the first doping process. Specifically, the acceleration voltage is 60 kV to 120 kV and the dosage is $1 \times 10^{13}$ atoms/cm$^2$ to $1 \times 10^{15}$ atoms/cm$^2$.

After the second doping process, the acceleration voltage is lowered to perform a third doping process, so that the state shown in FIG. 8C is obtained. In the third doping process, the acceleration voltage is 50 kV to 100 kV and the dosage is $1 \times 10^{15}$ atoms/cm$^2$ to $1 \times 10^{17}$ atoms/cm$^2$. By the second doping process and the third doping process, impurity regions 522 and 523 overlapping with the lower layers 517a and 518a of the second shape conductive films 517 and 518, and impurity regions 524 and 525 that are formed after the impurity is further added to the impurity regions 520 and 521. The impurity element imparting n-type conductivity is added to the impurity regions 522 and 523 in the concentration range of from $1 \times 10^{18}$ atoms/cm$^3$ to $5 \times 10^{19}$ atoms/ cm$^3$. The impurity element imparting n-type conductivity is added to the impurity regions 524 and 525 in the concentration range of from $1\times10^{19}$ atoms/cm$^3$ to $5\times10^{21}$ atoms/cm$^3$.

The impurity regions 522 and 523 are formed on the inside of the impurity regions 524 and 525. The impurity regions 522 and 523 function as LDD regions. The impurity regions 524 and 525 function as source/drain regions.

Needless to say, the second doping process and the third doping process may be combined into one doping process by adjusting the acceleration voltage appropriately, so that a low-concentration impurity region and a high-concentration impurity region can be formed by one doping process.

Note that there is no need to dope the island-shaped semiconductor film 510, where a p-channel transistor is to be formed with an n-type impurity, by the second and third doping processes shown in FIGS. 8B and 8C; thus, the island-shaped semiconductor film 510 may be covered by a mask in doping an n-type impurity. In addition, in order to reduce the number of masks, a mask can be omitted, in which case the concentration of an impurity imparting p-type conductivity is increased to inverse the polarity of the island-shaped semiconductor film to p-type. In the description in this embodiment, the polarity of the island-shaped semiconductor film is inversed to p-type.

As shown in FIG. 8D, the island-shaped semiconductor film 509 which is used in an n-channel transistor is covered by a resist mask 526, and the island-shaped semiconductor film 510 is doped with an impurity imparting p-type conductivity (this is a fourth doping process). In the fourth doping process, the upper layers 517b and 518b of the second shape conductive films 517 and 518 serve as masks, so that an impurity region 527 to which the impurity element imparting p-type conductivity is added is formed in the island-shaped semiconductor film 510, which is used in a p-channel transistor. In this embodiment, an ion doping method using diborane (B$_2$H$_6$) is performed. The concentration of impurity elements imparting p-type conductivity and n-type conductivity in regions of the impurity region 527 overlapping with the lower layers 517a and 518a of the second shape conductive films 517 and 518 is actually different from that in regions other than the regions. However, the doping process is conducted so that each region can have a concentration of the impurity element imparting p-type conductivity of $2\times10^{20}$ atoms/cm$^3$ to $2\times10^{21}$ atoms/cm$^3$, which is higher than that of the impurity element imparting n-type conductivity; thus, there is no problem for the regions to serve as a source region and a drain region of the p-channel transistor.

By the aforementioned steps, impurity regions are formed in the island-shaped semiconductor films.

Next, an interlayer insulating film 530 is formed to cover the island-shaped semiconductor films 509 and 510, the insulating film 511, and the second shape conductive films 517 and 518 (FIG. 9A). The interlayer insulating film 530 can be formed of an insulating film containing silicon made of silicon oxide, silicon nitride, silicon oxynitride, or the like to have a thickness of about 100 nm to 200 nm.

Next, heat treatment is performed to activate the impurity elements which have been added into the island-shaped semiconductor films 509 and 510. This step can use a thermal annealing method using an annealing furnace, a laser annealing method, or a rapid thermal annealing method (an RTA method). For example, activation is performed by a thermal annealing method in a nitrogen atmosphere in which the oxygen concentration is 1 ppm or less, and preferably 0.1 ppm or less, at 400° C. to 700° C. (preferably 500° C. to 600° C.). Furthermore, hydrogenation of the island-shaped semiconductor films is performed by heat treatment at 300° C. to 450° C. for 1 hour to 12 hours in an atmosphere containing hydrogen at 3% to 100%. This step is performed for the purpose of termination of dangling bonds by thermally excited hydrogen. Alternatively, plasma hydrogenation (using hydrogen excited by plasma) may be performed for hydrogenation. The activation treatment may be performed before the interlayer insulating film 530 is formed.

Through the sequence of processes, an n-channel transistor 531 and a p-channel transistor 532 can be fabricated. FIG. 9A used for the description of this embodiment illustrates a cross-sectional view in the channel length direction, and a cross section of the n-channel transistor 531 in the channel width direction corresponds to the cross section in FIG. 3C; that is, the s-channel structure is preferably used. In the case where a CMOS circuit is formed as a driver circuit using twelve masks, an n-channel transistor and a p-channel transistor can be formed over the same substrate through the same process. Alternatively, to reduce the number of masks, a driver circuit may have a circuit configuration in which only an n-channel transistor is used, and in this case, the number of masks is ten.

Although the entire impurity region 522 serving as an LDD region overlaps with the lower layers 517a and 518a of the second shape conductive films 517 and 518 in this embodiment, one embodiment of the present invention is not limited thereto. For example, a doping process is performed between the first etching process and the second etching process to form source/drain regions, and in addition, the lower layers are shortened in the channel length direction by the second etching process, thereby forming both regions overlapping with the lower layers 517a and 518a of the second shape conductive films 517 and 518 and regions other than the regions.

Note that methods other than the ICP etching method can also be used for the plasma etching without limitation, such as an electron cyclotron resonance (ECR) etching method, an RIE etching method, a helicon wave etching method, a helical resonance etching method, a pulse modulated etching method, or other plasma etching methods.

Although only crystallization using a catalyst element is used in the example, one embodiment of the present invention is not limited thereto. After the crystallization using a catalyst element, irradiation with pulse-oscillation laser light may be carried out to further increase the crystallinity. In addition, the gettering process is not limited to the method described in this embodiment. Another method may be used to decrease the concentration of the catalyst element in the semiconductor film.

Next, an interlayer insulating film 533 and an interlayer insulating film 534 are formed to cover the interlayer insulating film 530. In this embodiment, organic resin, such as nonphotosensitive acrylic, is used for the interlayer insulating film 533. For the interlayer insulating film 534, typically, it is desirable to use a DLC film, a carbon nitride film, a silicon nitride film formed by an RF sputtering method, or the like.

Next, the insulating film 511 and the interlayer insulating films 530, 533, and 534 are etched to form openings. Then, wirings 535 to 538 electrically connected to the island-shaped semiconductor films 509 and 510 are formed.

Next, a transparent conductive film covering the interlayer insulating film 534 and the wirings 535 to 538 is formed and patterned to be a pixel electrode 540 connected to the wiring 538 which is connected to the island-shaped semiconductor film 509 of the n-channel transistor 531 (FIG. 9B). As the transparent conductive film used for the pixel electrode 540, an ITO film or a transparent conductive film formed of a mixture of indium oxide and 2% to 20% of zinc oxide (ZnO) can be used.

By the above-described manufacturing method, a transistor including a back gate electrode and a pixel electrode over the transistor can be formed over one substrate.

In this embodiment, an example of the transmissive liquid crystal display device in which the transparent conductive film is used for the pixel electrode 540 is shown; however, the present invention is not limited thereto, and a reflective liquid crystal display device in which part or the whole of the pixel electrode 540 serves as a reflective electrode may be used. In the case where the reflective liquid crystal display device is used, a backlight is not necessarily provided, so that the power consumption can be reduced. In the case where the reflective liquid crystal display device is used, a storage circuit such as an SRAM can also be provided below the reflective electrode. Thus, the power consumption can be further reduced. For a material used for a reflective electrode that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film that transmits visible light and a film containing any of the above metal materials may be stacked. For example, a stacked film of silver and ITO or a stacked film of an alloy of silver and magnesium and ITO can be used.

At least part of this embodiment can be implemented in combination with any of the embodiments described in this specification as appropriate.

This embodiment can be combined with any of the other embodiments disclosed in this specification as appropriate.

Embodiment 4

In this embodiment, examples of transistors whose back gate electrodes are provided over the same substrate, which is the substrate shown in Embodiment 3, and a liquid crystal display device formed using a pixel electrode provided over the transistors are described.

Figure 10A:
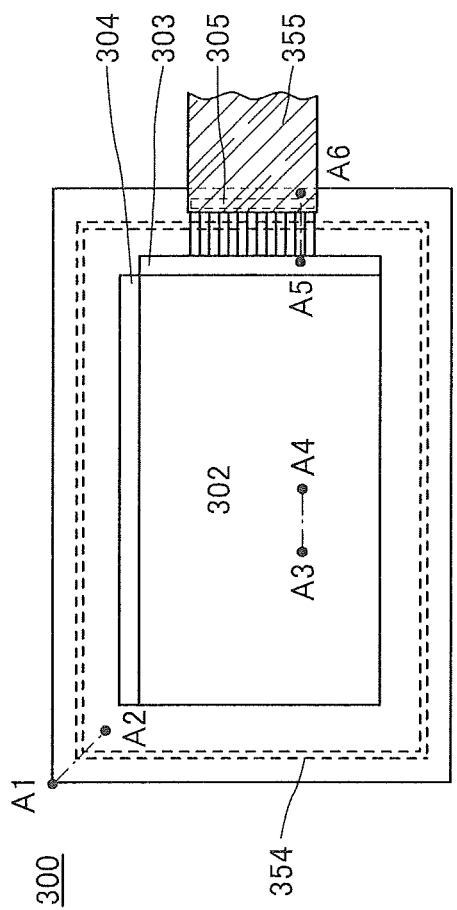
FIGS. 10A and 10B illustrate a structure example of a display device of an embodiment.
Figure 10B:
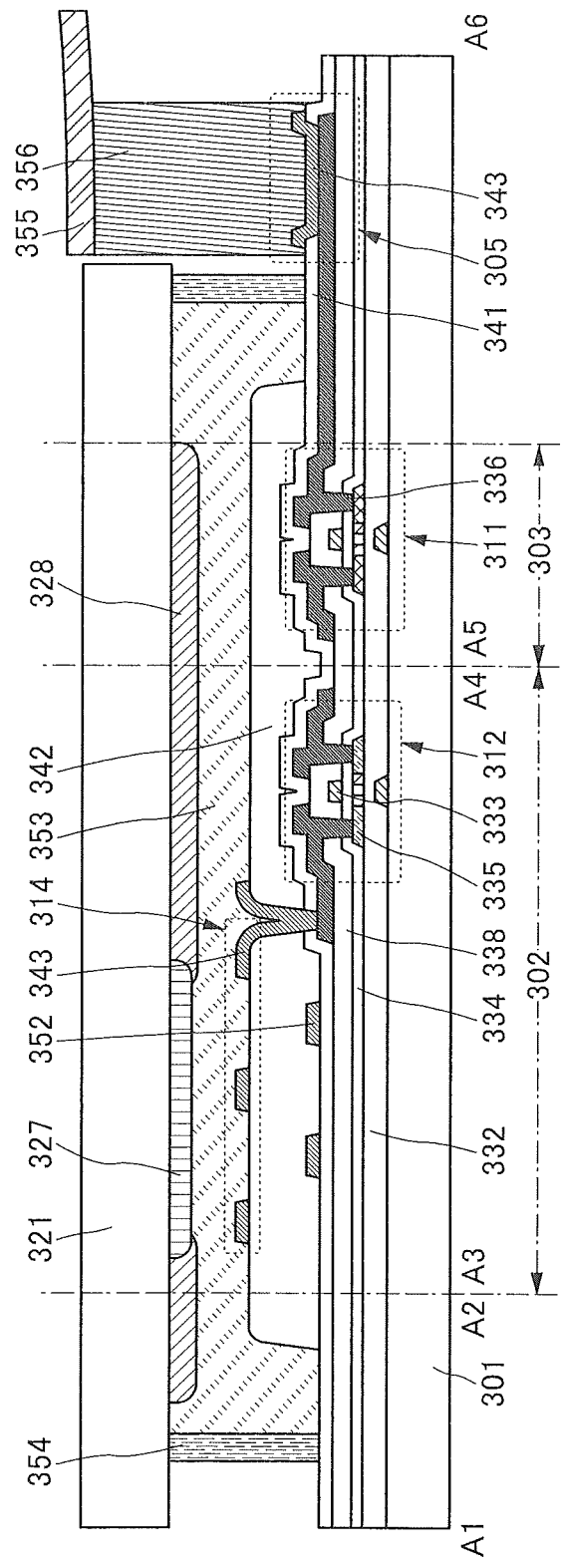

FIG. 10A is a schematic top view of a display device 300. FIG. 10B is a schematic cross-sectional view taken along lines A1-A2, A3-A4, and A5-A6 in FIG. 10A. Note that in FIG. 10A, some components are not illustrated for clarity.

The display device 300 includes, over a top surface of a substrate 301, a display portion 302, a signal line driver circuit 303, a scan line driver circuit 304, and an external connection terminal 305.

The display portion 302 includes a liquid crystal element 314. In the liquid crystal element 314, the orientation of liquid crystal is controlled by an electric field generated in a direction parallel to the substrate surface.

The display device 300 includes an insulating layer 332, an insulating layer 334, an insulating layer 338, an insulating layer 341, an insulating layer 342, a transistor 311, a transistor 312, the liquid crystal element 314, a first electrode 343, a second electrode 352, a liquid crystal 353, a color filter 327, a light-blocking layer 328, a sealant 354, an FPC 355, an anisotropic conductive connection layer 356, and the like. The transistor 311 is a p-channel transistor that is used for a driver circuit, and specifically, the p-channel transistor 71 described in Embodiment 4 may be used. FIG. 10B shows a cross-sectional view of the transistor 311 in the channel length direction. In a cross section in the channel width direction, the transistor 311 preferably has a structure in which the left, right, top, and bottom sides of a semiconductor layer are electrically surrounded by a plurality of conductive layers whose potentials are the same, that is, an s-channel structure. Note that in the s-channel structure, current flows in the whole (bulk) of the semiconductor film. Since current flows in an inner part of the semiconductor film, the current is hardly affected by interface scattering, and high on-state current can be obtained. In addition, by making the semiconductor film thick, on-state current can be increased.

A pixel includes at least one switching transistor 312 and a storage capacitor that is not illustrated. A comb-shaped second electrode 352 and a comb-shaped first electrode 343 electrically connected to one of a source electrode and a drain electrode of the transistor 312 are provided apart from each other over the insulating layer 342. The comb-shaped first electrode 343 can be called a pixel electrode. As the transistor 312, an n-channel transistor is used, and specifically, the n-channel transistor 531 described in Embodiment 3 may be used. FIG. 10B shows a cross-sectional view of the transistor 312 in the channel length direction. A cross section of the transistor 312 in the channel width direction corresponds to the cross section of the n-channel transistor 531 in FIG. 3C, and the transistor 312 preferably has an s-channel structure. When the transistor 312 has an s-channel structure, the semiconductor film can be prevented from being irradiated with downward and upward light and photoexcitation can be suppressed, so that an increase in off-state current can be prevented. In addition, with a structure in which the potential of the first gate electrode and the potential of the second gate electrode are different from each other in the transistor 312, these potentials can be controlled separately, whereby the off-state current can be further reduced in an off state of the transistor. Therefore, a transistor which is suitable for a switching element in a pixel portion of the liquid crystal display device can be achieved.

For at least one of the first electrode 343 and the second electrode 352, a light-transmitting conductive material is used. It is preferable to use a light-transmitting conductive material for both of these electrodes because the aperture ratio of the pixel can be increased.

The color filter 327 is provided such that it overlaps with the first electrode 343 and the second electrode 352. The light-blocking layer 328 is provided to cover a side surface of the color filter 327. The color filter 327 is provided on a substrate 321 in FIG. 10B, but the position of the color filter is not limited to this position.

The liquid crystal 353 is provided between the substrate 301 and the substrate 321. An image can be displayed in the following way: voltage is applied between the first electrode 343 and the second electrode 352 to generate an electric field in the substantially horizontal direction, orientation of the liquid crystal 353 is controlled by the electric field, and polarization of light from a backlight provided outside the display device is controlled in each pixel.

Alignment films for controlling the orientation of the liquid crystal 353 are preferably provided on surfaces in contact with the liquid crystal 353. A light-transmitting material is used for the alignment films. Although not illustrated here, polarizing plates are provided on the surfaces of the substrate 321 and the substrate 301 that do not face the liquid crystal element 314.

As the liquid crystal 353, a thermotropic liquid crystal, a low-molecular liquid crystal, a high-molecular liquid crystal, a ferroelectric liquid crystal, or an anti-ferroelectric liquid crystal can be used, for example. Moreover, a liquid crystal exhibiting a blue phase is preferably used, in which case an alignment film is not needed and a wide viewing angle can be obtained.

A high-viscosity and low-fluidity material is preferably used for the liquid crystal 353.

Although the liquid crystal element 314 using an IPS mode is described in this structural example, the mode of the liquid crystal element is not limited to this, and a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Figure 11A:
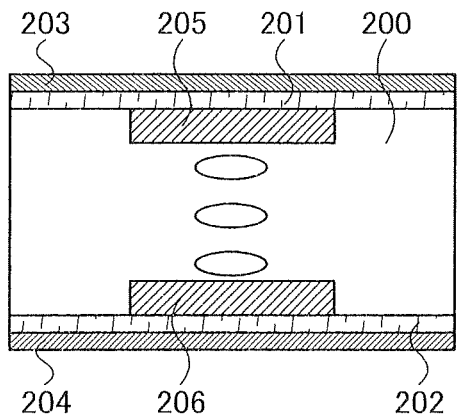
FIGS. 11A to 11F are cross-sectional views of liquid crystal elements.
Figure 11B:
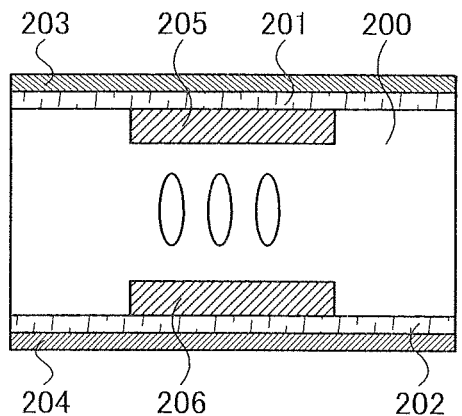

FIGS. 11A and 11B illustrate cross-sectional structure examples of a VA liquid crystal element.

A liquid crystal layer 200 is provided between a first substrate 201 provided with a transistor and a second substrate 202. A first electrode 205 is formed on the first substrate 201. A second electrode 206 is formed over the second substrate 202. A first polarizing plate 203 is provided over the first substrate 201 on a side opposite to the liquid crystal layer 200. A second polarizing plate 204 is provided on the second substrate 202 on a side opposite to the liquid crystal layer 200. Note that the first polarizing plate 203 and the second polarizing plate 204 are provided to be in a cross nicol state.

FIG. 11A is a schematic view of a cross section where voltage is applied to the first electrode 205 and the second electrode 206 (referred to as a vertical electric field mode). Since liquid crystal molecules are aligned laterally, light emitted from a backlight is affected by birefringence of the liquid crystal molecules. In addition, since the first polarizing plate 203 and the second polarizing plate 204 are provided to be in a cross nicol state, light emitted from the backlight passes through the substrate.

FIG. 11B is a schematic view of a cross section where voltage is not applied to the first electrode 205 and the second electrode 206. Since liquid crystal molecules are aligned longitudinally, light emitted from the backlight is not affected by birefringence of the liquid crystal molecules. In addition, since the first polarizing plate 203 and the second polarizing plate 204 are provided to be in a cross nicol state, light emitted from the backlight does not pass through the substrate.

Figure 11C:
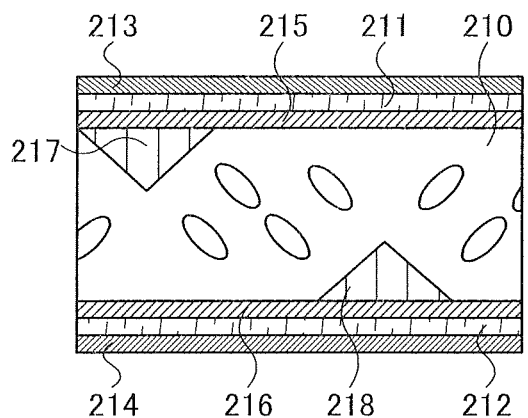
Figure 11D:
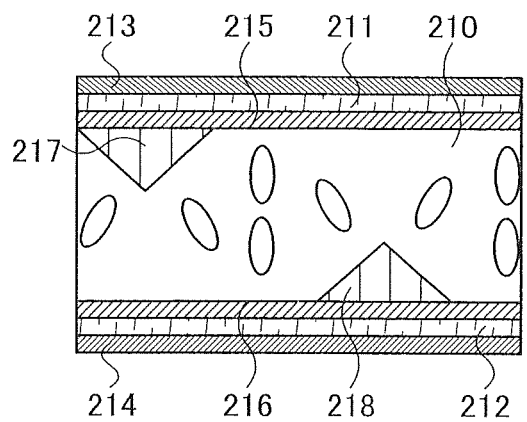

FIGS. 11C and 11D illustrate cross-sectional structure examples of an MVA liquid crystal element.

A liquid crystal layer 210 is provided between a first substrate 211 provided with a transistor and a second substrate 212. A first electrode 215 is formed on the first substrate 211. A second electrode 216 is formed over the second substrate 212. A first projection 217 for controlling alignment is formed on the first electrode 215. A second projection 218 for controlling alignment is formed over the second electrode 216. A first polarizing plate 213 is provided over the first substrate 211 on a side opposite to the liquid crystal layer 210. A second polarizing plate 214 is provided on the second substrate 212 on a side opposite to the liquid crystal layer 210. Note that the first polarizing plate 213 and the second polarizing plate 214 are provided to be in a cross nicol state.

FIG. 11C is a schematic view of a cross section where voltage is applied to the first electrode 215 and the second electrode 216 (referred to as a vertical electric field mode). Since liquid crystal molecules are aligned to tilt toward the first projection 217 and the second projection 218, light emitted from a backlight is affected by birefringence of the liquid crystal molecules. In addition, since the first polarizing plate 213 and the second polarizing plate 214 are provided to be in a cross nicol state, light emitted from the backlight passes through the substrate.

FIG. 11D is a schematic view of a cross section where voltage is not applied to the first electrode 215 and the second electrode 216. Since liquid crystal molecules are aligned longitudinally, light emitted from the backlight is not affected by birefringence of the liquid crystal molecules. In addition, since the first polarizing plate 213 and the second polarizing plate 214 are provided to be in a cross nicol state, light emitted from the backlight does not pass through the substrate.

Figure 11E:
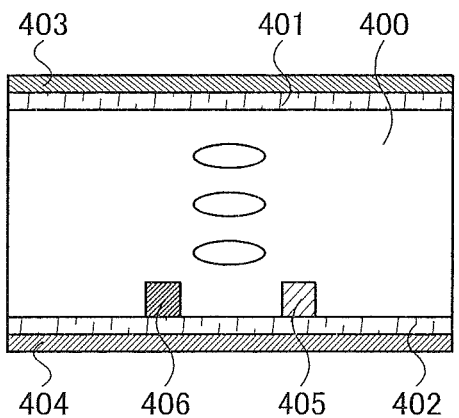
Figure 11F:
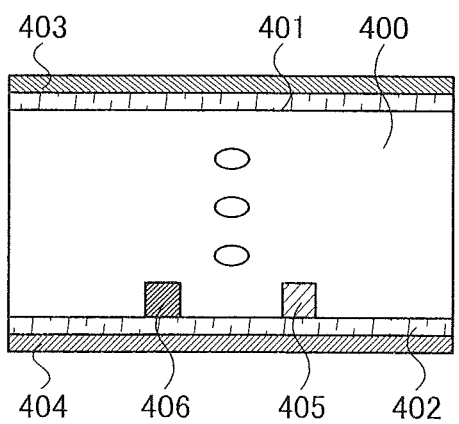

FIGS. 11E and 11F illustrate cross-sectional structure examples of an IPS liquid crystal element.

A liquid crystal layer 400 is provided between a first substrate 401 provided with a transistor and a second substrate 402. A first electrode 405 and a second electrode 406 are formed over the second substrate 402. A first polarizing plate 403 is provided over the first substrate 401 on a side opposite to the liquid crystal layer 400. A second polarizing plate 404 is provided on the second substrate 402 on a side opposite to the liquid crystal layer 400. Note that the first polarizing plate 403 and the second polarizing plate 404 are provided to be in a cross nicol state.

FIG. 11E is a schematic view of a cross section where voltage is applied to the first electrode 405 and the second electrode 406 (referred to as a vertical electric field mode). Since liquid crystal molecules are aligned along a line of electric force that is deviated from a rubbing direction, light emitted from a backlight is affected by birefringence of the liquid crystal molecules. In addition, since the first polarizing plate 403 and the second polarizing plate 404 are provided to be in a cross nicol state, light emitted from the backlight passes through the substrate.

FIG. 11F is a schematic view of a cross section where voltage is not applied to the first electrode 405 and the second electrode 406. Since liquid crystal molecules are aligned laterally in a rubbing direction, light emitted from the backlight is not affected by birefringence of the liquid crystal molecules. In addition, since the first polarizing plate 403 and the second polarizing plate 404 are provided to be in a cross nicol state, light emitted from the backlight does not pass through the substrate. Thus, black display is performed.

The liquid crystal display device according to one embodiment of the present invention may include an optical compensation layer for achieving a wide viewing angle. The optical compensation layer may have an optical indicatrix whose light axis is parallel to a surface of a panel, or may have a predetermine angle θ between the light axis of the optical indicatrix and the surface of the panel.

The transistors (e.g., the transistor 311 and the transistor 312) provided in the display device 300 are top-gate transistors. Each of the transistors includes a semiconductor layer 335 having an impurity region serving as a source or drain region, an insulating layer 334 serving as a gate insulating layer, and a gate electrode 333. In addition, an insulating layer 338 and an insulating layer 339 are stacked to cover the gate electrode 333. A pair of electrodes 336 is provided so as to reach the source or drain region of the semiconductor layer 335 through an opening formed in the insulating layers 334, 338, and 339.

At least part of this embodiment can be implemented in combination with any of the embodiments described in this specification as appropriate.

Embodiment 5

In this embodiment, the configuration of a pixel that can be used for a display device applicable to the display system of one embodiment of the present invention will be described with reference to FIGS. 12A to 12C.

Figure 12A:
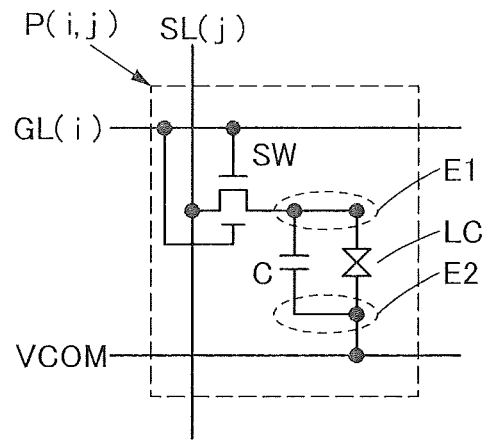
FIGS. 12A to 12C illustrate structures of a pixel of an embodiment.

FIG. 12A is a circuit diagram illustrating an example of a pixel circuit P(i,j) for a pixel including a liquid crystal display element.

Figure 12B:
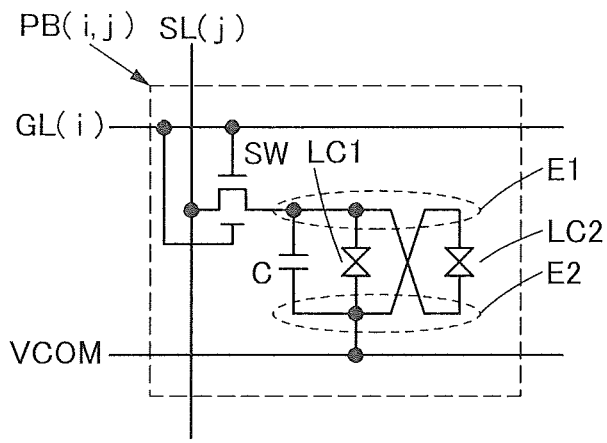
Figure 12C:
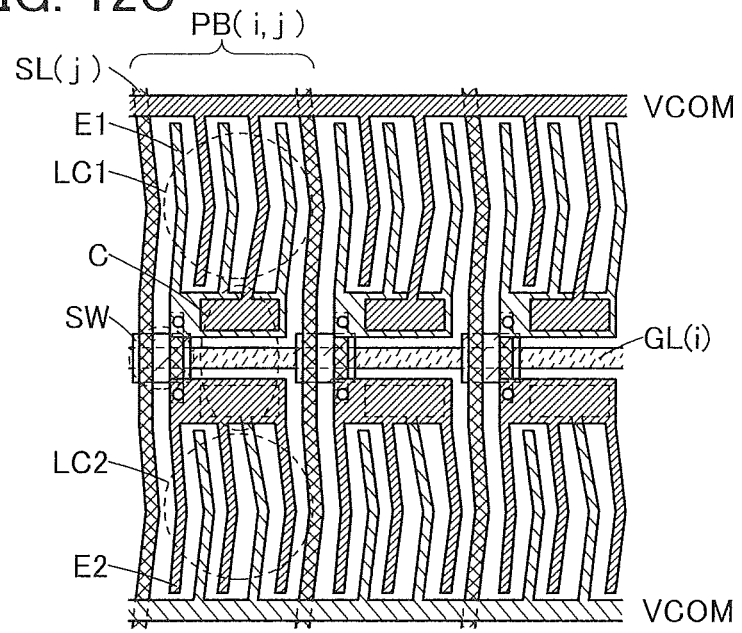

FIG. 12B is a circuit diagram illustrating an example of a pixel circuit PB(i,j) that has a configuration different from that of the pixel circuit P(i,j) in FIG. 12A. FIG. 12C is a top view illustrating an example of the layout of pixel circuits PB(i,j) in FIG. 12B.

<Configuration Example 1 of Pixel Circuit>

The pixel circuit P(i,j) is electrically connected to a control line GL(i), a signal line SL(j), and a wiring VCOM and includes a transistor SW, a liquid crystal element LC, and a capacitor C (see FIG. 12A).

A gate of the transistor SW is electrically connected to the control line GL(i), and a first electrode of the transistor SW is electrically connected to the signal line SL(j).

A first electrode of the liquid crystal element LC is electrically connected to a second electrode of the transistor SW, and a second electrode of the liquid crystal element LC is electrically connected to the wiring VCOM.

A first electrode of the capacitor C is electrically connected to the second electrode of the transistor SW, and a second electrode of the capacitor C is electrically connected to the wiring VCOM.

The pixel circuit P(i,j) is provided over a substrate and includes the substrate, a second conductive film E2, and a first conductive film E1 between the substrate and the second conductive film E2.

For example, a light-transmitting conductive film can be used as the first conductive film and/or the second conductive film.

For example, the first conductive film E1 can be used for the first electrode of the liquid crystal element LC, and the second conductive film E2 can be used for the second electrode of the liquid crystal element LC.

For example, the first conductive film E1 can be used for the first electrode of the capacitor C, and the second conductive film E2 can be used for the second electrode of the capacitor C.

<Configuration Example 2 of Pixel Circuit>

The pixel circuit PB(i,j) is different from the pixel circuit P(i,j) in FIG. 12A in that a liquid crystal element LC1 and a liquid crystal element LC2 connected in parallel are provided instead of the liquid crystal element LC. Different structures will be described in detail below, and the above description is referred to for other similar structures (see FIG. 12B).

A first electrode of the liquid crystal element LC1 is electrically connected to the second electrode of the transistor SW, and a second electrode of the liquid crystal element LC1 is electrically connected to the wiring VCOM.

A second electrode of the liquid crystal element LC2 is electrically connected to the second electrode of the transistor SW, and a first electrode of the liquid crystal element LC2 is electrically connected to the wiring VCOM.

For example, the first conductive film E1 can be used for the first electrode of the liquid crystal element LC1, and the second conductive film E2 can be used for the second electrode of the liquid crystal element LC1. In addition, the first conductive film E1 can be used for the first electrode of the liquid crystal element LC2, and the second conductive film E2 can be used for the second electrode of the liquid crystal element LC2 (see FIG. 12C).

The pixel circuit PB(i,j) includes the liquid crystal element LC1 and the liquid crystal element LC2. The first electrode of the liquid crystal element LC1 includes the first conductive film E1 connected to the second electrode of the transistor SW, and the second electrode of the liquid crystal element LC1 includes the second conductive film E2 electrically connected to the wiring VCOM. The second electrode of the liquid crystal element LC2 includes the second conductive film E2 connected to the second electrode of the transistor SW, and the first electrode of the liquid crystal element LC2 includes the first conductive film E1 electrically connected to the wiring VCOM.

The liquid crystal element LC1 and the liquid crystal element LC2 are connected in parallel as described above. Accordingly, characteristics of the liquid crystal elements can be prevented from being asymmetric due to the positions of the first conductive film E1 and the second conductive film E2 even in the case where the liquid crystal elements are driven with the applied voltage inverted.

At least part of this embodiment can be implemented in combination with any of the embodiments described in this specification as appropriate.

Embodiment 6

In this embodiment, with reference to cross-sectional views of transistors each including a back gate electrode and a light-emitting element provided over the transistors, an example of a fabrication process thereof is described. FIGS. 13A to 13C, FIGS. 14A to 14D, and FIGS. 15A to 15C show a process of fabricating a p-channel transistor electrically connected to a light-emitting element and an n-channel transistor in a driver circuit. An n-channel transistor and a p-channel transistor are fabricated in a driver circuit, and an n-channel transistor and a p-channel transistor are also fabricated in a pixel. Here, only one of the n-channel transistor and the p-channel transistor in each of the driver circuit and the pixel is illustrated for simplicity.

First, a conductive film 502 serving as a back gate electrode is formed on an insulating surface of a substrate 501. The conductive film 502 can be formed using a conductive material containing one or more selected from Al, W, Mo, Ti, and Ta. Although tungsten is used for the conductive film 502 in this embodiment, a film in which tungsten is stacked on tantalum nitride may be used. The conductive film 502 may be composed of a plurality of films without limitation to a single film.

As the substrate 501, for example, a glass substrate made of barium-borosilicate glass or alumino-borosilicate glass, a quartz substrate, a ceramic substrate, or the like can be used. A silicon substrate or a metal substrate, each having an insulating film formed thereover may be used. Although a substrate formed of a flexible synthetic resin such as plastic generally has a lower resistance temperature than the aforementioned substrates, it may be used as long as being resistant to a processing temperature during manufacturing steps.

Next, an insulating film 503 is formed to cover the conductive film 502. The insulating film 503 is composed of an insulating film 503a and an insulating film 503b stacked thereon. A silicon oxynitride film is used as the insulating film 503a, for example. A silicon oxide film or a silicon oxynitride film is used as the insulating film 503b, for example. Note that the insulating film 503 is not limited to the structure and may be composed of a single insulating film or three or more insulating films. Also, the materials are not limited thereto.

Next, an amorphous semiconductor film 504 is formed on the insulating film 503 by a plasma CVD method. Depending on the amount of hydrogen contained in the amorphous semiconductor film 504, a dehydrogenation treatment is desirably performed before a crystallization step. The dehydrogenation treatment is preferably performed for several hours at a heating temperature of 400° C. to 550° C. so that the amount of hydrogen is reduced to 5 atom % or less. Alternatively, a sputtering method, an evaporation method, or the like may be used for forming the amorphous semiconductor film. In any case, impurity elements contained in the film, such as oxygen and nitrogen, are desirably reduced to a sufficient level.

For example, silicon germanium can be used as the semiconductor without limitation to silicon. In the case of using silicon germanium, the concentration of germanium is preferably approximately 0.01 atomic % to 4.5 atomic %.

Note that when the insulating film 503 and the amorphous semiconductor film 504 are formed by a plasma CVD method, these films can be successively formed without exposure to the air. Such a successive deposition can minimize contamination of the surface with the air, so that variations in characteristics of the transistors can be reduced.

Next, as illustrated in FIG. 13A, the semiconductor film is formed into the crystalline semiconductor film 506 by laser crystallization. For the laser crystallization, in addition to a continuous wave laser, a pulsed laser whose oscillation frequency is higher than or equal to 10 MHz can be used.

Next, the crystalline semiconductor film 506 is patterned to form island-shaped semiconductor films 509 and 510 (FIG. 13B). The thickness of the semiconductor films 509 and 510 is 25 nm to 100 nm preferably 30 nm to 60 nm. Then, an insulating film 511 is formed so as to cover the semiconductor films 509 and 510. Since about 10 nm to 40 nm of the insulating film 511 will be reduced by dry etching which is performed later for forming an electrode serving as a gate electrode, the thickness of the insulating film 511 is desirably determined in consideration of the reduction in thickness. Specifically, the insulating film 511 is formed to have a thickness of 40 nm to 150 nm (preferably 60 nm to 120 nm).

For example, silicon oxide, silicon nitride, silicon oxide containing nitrogen, or the like can be used for the insulating film 511. Note that the case where the insulating film 511 is formed using a single insulating film is described as an example in this embodiment; however, the insulating film 511 may be formed using two or more insulating films. As the film-forming method, a plasma CVD method, a sputtering method, or the like can be used.

Then, a conductive film is deposited on the insulating film 511 (FIG. 13C). In this embodiment, a tantalum nitride conductive film 512a and a tungsten conductive film 512b are deposited to have a thickness of 20 nm to 100 nm and a thickness of 100 nm to 400 nm, respectively. Specific deposition conditions of the tantalum nitride conductive film 512a are as follows: the purity of Ta target is 99.99%; the temperature in a chamber is room temperature; the flow rates of Ar and $N_2$ are 50 ml/min and 10 ml/min, respectively; the pressure in the chamber is 0.6 Pa; the deposition power is 1 kW; and the deposition rate is approximately 40 nm/min. The deposition conditions of the second film, the tungsten conductive film 512b are as follows: the purity of tungsten target is 99.99%; the temperature in a chamber is 230° C.; the flow rate of Ar is 100 ml/min; the pressure in the chamber is 1.5 Pa; the deposition power is 6 kW; and the deposition rate is approximately 390 nm/min.

Although the non-limiting example is described in this embodiment in which such a two-layer conductive film is used as an electrode serving as a gate electrode, the conductive film may be composed of a single layer or three layers or more. In addition, the materials of the conductive layers are not limited to those described in this embodiment.

Specifically, the conductive films can each be composed of an element selected from Ta, W, Ti, Mo, Al, and Cu, or an alloy or a compound containing the element as its main component. For example, tantalum and tungsten may be used for the first layer and the second layer, respectively; tantalum nitride and aluminum may be used for the first layer and the second layer, respectively; and tantalum nitride and copper may be used for the first layer and the second layer, respectively. A silver-palladium-copper alloy may be used for either the first layer or the second layer. Alternatively, a three-layer structure in which tungsten, an aluminum-silicon (Al—Si) alloy, and titanium nitride are stacked in this order may be used. Instead of tungsten, tungsten nitride may be used. Instead of the aluminum-silicon (Al—Si) alloy, an aluminum-titanium (Al—Ti) alloy may be used. Instead of titanium nitride, titanium may be used. Note that in order to make a difference between the widths of the plurality of conductive films in the channel length direction, materials of the conductive films are selected in consideration of the etching selectivity.

Note that it is important to select an optimal etching gas for the materials of the conductive films.

Figure 14A:
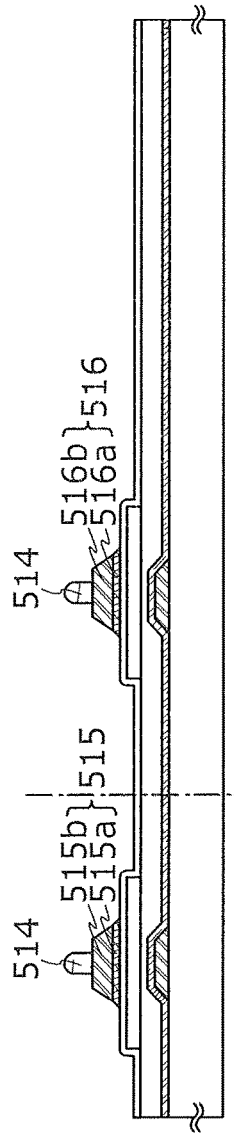
FIGS. 14A to 14D are cross-sectional views illustrating steps of one embodiment of the present invention.

Next, a mask 514 is formed, and the conductive films 512a and 512b are etched as shown in FIG. 14A (a first etching process). In this embodiment, an inductively coupled plasma (ICP) etching method is used. A mixed gas of $Cl_2$, $CF_4$, and $O_2$ is used as an etching gas. The etching gas pressure in a chamber is 1.0 Pa. An RF (13.56 MHz) power of 500 W is applied to a coiled electrode to generate plasma. An RF (13.56 MHz) power of 150 W is applied to a substrate stage (lower electrode) so that self-bias voltage is applied to the substrate. Then, the etching gas is replaced with a mixed gas of $Cl_2$ and $CF_4$, and the total pressure is set to 1.0 Pa. An RF (13.56 MHz) power of 500 W and that of 20 W are applied to the coiled electrode and to the substrate (sample stage), respectively.

With the use of the etching gas of $Cl_2$ and $CF_4$, the etching rate of the tantalum nitride conductive film 512a is substantially equal to that of the tungsten conductive film 512b, so that the films are etched to a similar thickness.

By the first etching process, a first shape conductive film 515 composed of a lower layer 515a and an upper layer 515b and a first shape conductive film 516 composed of a lower layer 516a and an upper layer 516b are each formed. Note that the first etching process makes each side surface of the lower layers 515a and 516a and the upper layers 515b and 516b slightly tapered. In addition, as a result of etching so as not to leave residuals of the conductive films, the surface of the insulating film 511 which is not covered by the first shape conductive films 515 and 516 might be reduced in thickness by about 5 nm to 10 nm or more.

Next, the first shape conductive films 515 and 516 are etched (a second etching process) using the mask 514 whose surface is etched by the first etching process to be reduced in width. The ICP etching method is used in the second etching process as in the first etching process. A mixed gas of $Cl_2$, $SF_6$, and $O_2$ is used as an etching gas. The etching gas pressure in the chamber is 1.3 Pa. An RF (13.56 MHz) power of 700 W is applied to the coiled electrode to generate plasma. An RF (13.56 MHz) power of 10 W is applied to the substrate stage (lower electrode) so that self-bias voltage is applied to the substrate.

The addition of $O_2$ to the mixed gas of $SF_6$ and $Cl_2$ increases the etching rate of tungsten and dramatically decreases the etching rate of tantalum nitride contained in the lower layers 515a and 516a of the first shape conductive films 515 and 516, so that their etching selectivity is secured.

By the second etching process, a second shape conductive film 517 (a lower layer 517a and an upper layer 517b) and a second shape conductive film 518 (a lower layer 518a and an upper layer 518b) are formed. The width in the channel length direction of the upper layers 517b and 518b is smaller than that of the lower layers 517a and 518a. Note that by the second etching process, the surface of the insulating film 511 which is not covered by the second shape conductive films 517 and 518 is reduced in thickness by about 5 nm to 10 nm or more.

Figure 14B:
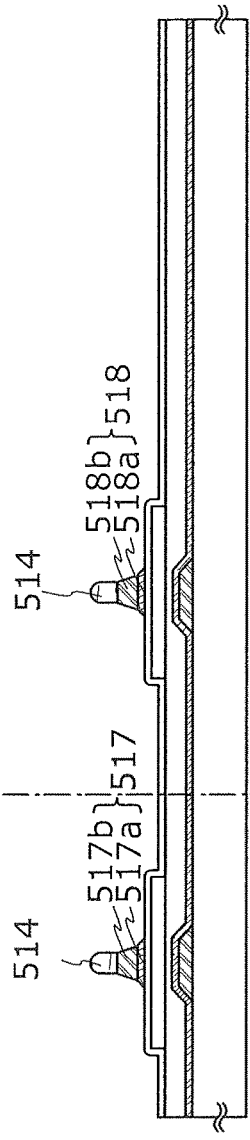

Next, as shown in FIG. 14B, an impurity which imparts n-type conductivity to the semiconductor films 509 and 510 is added using the second shape conductive films 517 and 518 as masks (a first doping process). An ion implantation method is used for the doping. The doping is performed under the conditions where the dosage is $1 \times 10^{13}$ atoms/cm$^2$ to $5 \times 10^{14}$ atoms/cm$^2$ and the accelerating voltage is in the range of from 40 kV to 80 kV. As an impurity element imparting n-type conductivity, an element belonging to Group 5 such as P, As, or Sb; an element belonging to Group 6 such as S, Te, or Se; or the like which functions as a donor is used. In this embodiment, P is used. By the first doping process, impurity regions 520 and 521 are formed in a self-aligned manner. The impurity element imparting n-type conductivity is added to the impurity regions 520 and 521 at a concentration of $1 \times 10^{18}$ atoms/cm$^3$ to $1 \times 10^{20}$ atoms/cm$^3$.

Figure 14C:
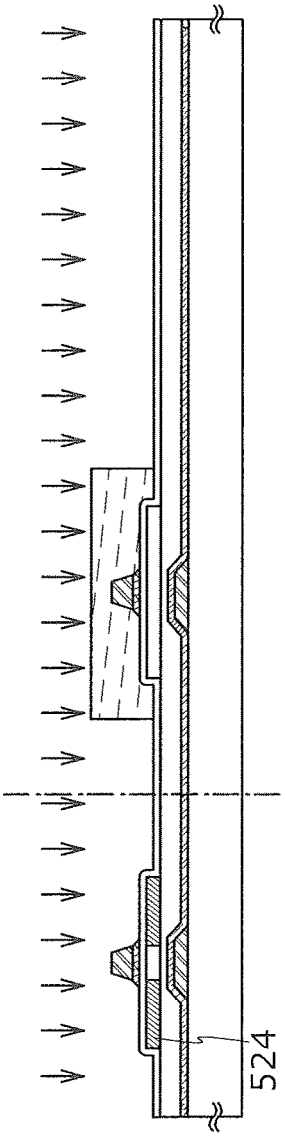

Next, as shown in FIG. 14C, a second doping process is performed using the upper layers 517b and 518b of the second shape conductive films 517 and 518 as masks. The acceleration voltage in the second doping process is higher than that in the first doping process so that an impurity is transmitted through the lower layers 517a and 518a of the second shape conductive films 517 and 518. In addition, in order to form an LDD region, the dosage of an n-type impurity in the second doping process is lower than that in the first doping process. Specifically, the acceleration voltage is 60 kV to 120 kV and the dosage is $1 \times 10^{13}$ atoms/cm$^2$ to $1 \times 10^{15}$ atoms/cm$^2$.

Figure 14D:
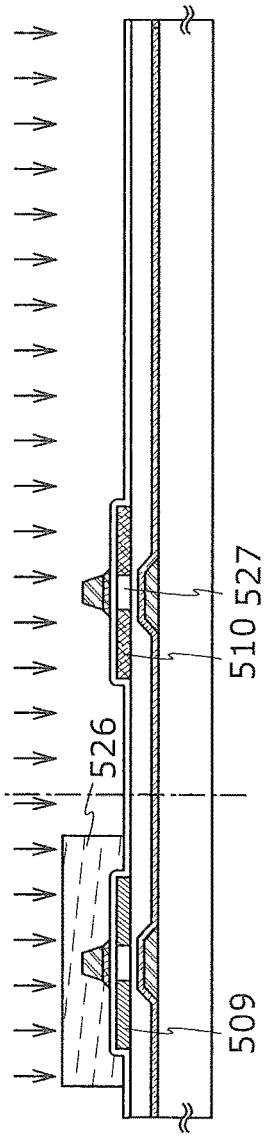

After the second doping process, the acceleration voltage is lowered to perform a third doping process, so that the state shown in FIG. 14D is obtained. In the third doping process, the acceleration voltage is 50 kV to 100 kV and the dosage is $1 \times 10^{15}$ atoms/cm$^2$ to $1 \times 10^{17}$ atoms/cm$^2$. By the second doping process and the third doping process, impurity regions 522 and 523 overlapping with the lower layers 517a and 518a of the second shape conductive films 517 and 518, and impurity regions 524 and 525 that are formed after the impurity is further added to the impurity regions 520 and 521. The impurity element imparting n-type conductivity is added to the impurity regions 522 and 523 in the concentration range of from $1 \times 10^{18}$ atoms/cm$^3$ to $5 \times 10^{19}$ atoms/cm$^3$. The impurity element imparting n-type conductivity is added to the impurity regions 524 and 525 in the concentration range of from $1 \times 10^{19}$ atoms/cm$^3$ to $5 \times 10^{21}$ atoms/cm$^3$.

The impurity regions 522 and 523 are formed on the inside of the impurity regions 524 and 525. The impurity regions 522 and 523 function as LDD regions. The impurity regions 524 and 525 function as source/drain regions.

Needless to say, the second doping process and the third doping process may be combined into one doping process by adjusting the acceleration voltage appropriately, so that a low-concentration impurity region and a high-concentration impurity region can be formed by one doping process.

Note that there is no need to dope the island-shaped semiconductor film 510, where a p-channel transistor is to be formed with an n-type impurity, by the second and third doping processes shown in FIGS. 14B and 14C; thus, the island-shaped semiconductor film 510 may be covered by a mask in doping an n-type impurity. In addition, in order to reduce the number of masks, a mask can be omitted, in which case the concentration of an impurity imparting p-type conductivity is increased to inverse the polarity of the island-shaped semiconductor film to p-type. In the description in this embodiment, the polarity of the island-shaped semiconductor film is inversed to p-type.

As shown in FIG. 14D, the island-shaped semiconductor film 509 which is used in an n-channel transistor is covered by a resist mask 526, and the island-shaped semiconductor film 510 is doped with an impurity imparting p-type conductivity (this is a fourth doping process). In the fourth doping process, the upper layers 517b and 518b of the second shape conductive films 517 and 518 serve as masks, so that an impurity region 527 to which the impurity element imparting p-type conductivity is added is formed in the island-shaped semiconductor film 510, which is used in a p-channel transistor. In this embodiment, an ion doping method using diborane ($B_2H_6$) is performed. The concentration of impurity elements imparting p-type conductivity and n-type conductivity in regions of the impurity region 527 overlapping with the lower layers 517a and 518a of the second shape conductive films 517 and 518 is actually different from that in regions other than the regions. However, the doping process is conducted so that each region can have a concentration of the impurity element imparting p-type conductivity of $2 \times 10^{20}$ atoms/cm$^3$ to $2 \times 10^{21}$ atoms/cm$^3$, which is higher than that of the impurity element imparting n-type conductivity; thus, there is no problem for the regions to serve as a source region and a drain region of the p-channel transistor.

By the aforementioned steps, impurity regions are formed in the island-shaped semiconductor films.

Next, an interlayer insulating film 530 is formed to cover the island-shaped semiconductor films 509 and 510, the insulating film 511, and the second shape conductive films 517 and 518 (FIG. 15A). The interlayer insulating film 530 can be formed of an insulating film containing silicon made of silicon oxide, silicon nitride, silicon oxynitride, or the like to have a thickness of about 100 nm to 200 nm.

Next, heat treatment is performed to activate the impurity elements which have been added into the island-shaped semiconductor films 509 and 510. This step can use a thermal annealing method using an annealing furnace, a laser annealing method, or a rapid thermal annealing method (an RTA method). For example, activation is performed by a thermal annealing method in a nitrogen atmosphere in which the oxygen concentration is 1 ppm or less, and preferably 0.1 ppm or less, at 400° C. to 700° C. (preferably 500° C. to 600° C.). Furthermore, hydrogenation of the island-shaped semiconductor films is performed by heat treatment at 300° C. to 450° C. for 1 hour to 12 hours in an atmosphere containing hydrogen at 3% to 100%. This step is performed for the purpose of termination of dangling bonds by thermally excited hydrogen. Alternatively, plasma hydrogenation (using hydrogen excited by plasma) may be performed for hydrogenation. The activation treatment may be performed before the interlayer insulating film 530 is formed.

Through the sequence of processes, an n-channel transistor 531 and a p-channel transistor 532 can be fabricated.

Although the entire impurity region 522 serving as an LDD region overlaps with the lower layers 517a and 518a of the second shape conductive films 517 and 518 in this embodiment, one embodiment of the present invention is not limited thereto. For example, a doping process is performed between the first etching process and the second etching process to form source/drain regions, and in addition, the lower layers are shortened in the channel length direction by the second etching process, thereby forming both regions overlapping with the lower layers 517a and 518a of the second shape conductive films 517 and 518 and regions other than the regions.

Next, an interlayer insulating film 533 and an interlayer insulating film 534 are formed to cover the interlayer insulating film 530. In this embodiment, organic resin, such as nonphotosensitive acrylic, is used for the interlayer insulating film 533. A film used as the interlayer insulating film 534 penetrates a substance that can accelerate deterioration of an OLED, such as moisture or oxygen, in lesser amount than those of other insulating films. Typically, for example, it is desirable to use a DLC film, a carbon nitride film, a silicon nitride film formed by an RF sputtering method, or the like.

Next, the insulating film 511 and the interlayer insulating films 530, 533, and 534 are etched to form openings. Then, wirings 535 to 538 electrically connected to the island-shaped semiconductor films 509 and 510 are formed.

Next, a transparent conductive film covering the interlayer insulating film 534 and the wirings 535 to 538 is formed and patterned to be a pixel electrode (anode) 540 connected to the wiring 538 which is connected to the island-shaped semiconductor film 510 of the p-channel transistor 532 (FIG. 15B). As the transparent conductive film used for the pixel electrode 540, an ITO film or a transparent conductive film formed of a mixture of indium oxide and 2% to 20% of zinc oxide (ZnO) can be used. The surface of the pixel electrode 540 may be polished by a CMP method or by cleaning with a polyvinyl alcohol-based porous body. Furthermore, after the polishing by a CMP method, ultraviolet light irradiation, oxygen plasma treatment, and the like may be carried out on the surface of the pixel electrode 340.

Then, an organic resin film 541 used as a partition wall is formed over the interlayer insulating film 534. The organic resin film 541 includes an opening in a region overlapping with the pixel electrode 540. The organic resin film 541 is heated in a vacuum atmosphere to remove adsorbed moisture, oxygen, or the like before an electroluminescent layer is formed. Specifically, heat treatment is performed at a temperature of 100° C. to 200° C. for about 0.5 hours to 1 hour in a vacuum atmosphere. The pressure is preferably $3\times10^{-7}$ Torr or lower, and $3\times10^{-8}$ Torr or lower is the best if possible. In addition, in the case where the electroluminescent layer is formed after the organic resin film 541 is subjected to the heat treatment in a vacuum atmosphere, the vacuum atmosphere is maintained just before the formation of the electroluminescent layer; thus, the reliability can be further improved.

An end portion of the organic resin film 541 in the opening is preferably rounded so that the electroluminescent layer, which will be formed over the end portion, does not have a hole. Specifically, the radius of curvature of a curve drawn by a cross section of the organic insulating film 541 in the opening is desirably approximately 0.2 μm to 2 μm.

A positive photosensitive acrylic resin is used for the organic resin film 541 in the example shown in FIG. 15C. A photosensitive organic resin is classified into a positive type and a negative type. A portion subjected to exposure to energy-ray, such as light, electron, or ion, is removed in the former case and is left in the latter case. Such a negative photosensitive organic resin film may be used in this embodiment. Alternatively, a photosensitive polyimide may be used for the organic resin film 541.

The end portion of the organic resin film 541 formed of a negative acrylic resin has an S-shape cross section in the opening. Each curvature radius of the upper and lower end portions of the opening is preferably 0.2 μm to 2 μm.

Such a structure enables the electroluminescent layer and a cathode, which are formed later, with good coverage and can prevent the short circuit between the pixel electrode 540 and the cathode in a hole formed in the electroluminescent layer. In addition, stress applied to the electroluminescent layer can be relieved, and occurrence of defects called shrink, that is, decrease in light-emitting area can be decreased, so that the reliability can be improved.

Next, a light-emitting layer 542 is formed over the pixel electrode 540. The electroluminescent layer 542 may be composed of a single layer or a plurality of layers and each layer may contain an inorganic material as well as an organic material.

Then, a cathode 543 is formed to cover the light-emitting layer 542. The cathode 543 can be formed of a conductive film composed of a known material with low work function. For example, Ca, Al, CaF, MgAg, or AlLi is preferably used.

The pixel electrode 540, the light-emitting layer 542, and the cathode 543 overlap with each other in the opening in the organic resin film 541, and this overlapping portion corresponds to a light-emitting element 544.

Next, a protective film 545 is formed over the organic resin film 541 and the cathode 543. Similarly to the interlayer insulating film 534, a film which is less likely to transmit a substance which accelerates deterioration of a light-emitting element, such as moisture or oxygen, than other insulating films is used as the protective film 545. Typical and preferred examples are a DLC film, a carbon nitride film, a silicon nitride film formed by an RF sputtering method, and the like. Alternatively, the film which is less likely to transmit the substance, such as moisture or oxygen, and a film which is more likely to transmit the substance, such as moisture or oxygen, than the former film may be stacked to be used as a protective film.

Note that, in FIG. 15C, a structure in which light emitted from the light-emitting element is emitted to the substrate 501 side is shown; however, a light-emitting element having a structure such that light is emitted to the side opposite to the substrate may be used.

In practice, when a process is completed up to and including FIG. 15C, packaging (filling and sealing) is preferably performed by using a protective film (a laminate film, an ultraviolet curable resin film, or the like) which has small degas and high airtightness so as not to be further exposed to the outside air, or a light-transmitting cover member. At that time, if the inside the member for covering is made an inert atmosphere or a hygroscopic material (e.g., barium oxide) is provided in the inside, reliability of the display device including the light-emitting element is improved.

By the above-described manufacturing method, a p-channel transistor including a back gate electrode, a light-emitting element over the p-channel transistor, and a driver circuit including an n-channel transistor and a p-channel transistor can be formed over one substrate.

The light-emitting element in this specification represents an element of which luminance is controlled by a current or a voltage; specifically, an organic light-emitting diode (OLED), an MIM type electron source element (electron-emitting element) used in a field emission display (FED), and the like are included.

An OLED has a layer (hereinafter referred to as an organic light-emitting layer) including an organic compound (an organic luminescent material) that provides luminescence (Electroluminescence) generated by applying an electric field, an anode layer, and a cathode layer. Luminescence in an organic compound includes luminescence when returning from a single excited state to the ground state (fluorescence) and luminescence when returning from a triplet excited state to the ground state (phosphorescence). For the light-emitting device of the present invention, any one or both of the luminescences described above may be used.

It is to be noted that all layers provided between an anode and a cathode of an OLED are defined as an organic light-emitting layer in the specification. The organic light-emitting layer specifically includes a light-emitting layer, a hole-injection layer, an electron-injection layer, a hole-transport layer, an electron-transport layer, and, the like. Basically, an OLED has a structure in which an anode, a light-emitting layer, and a cathode are stacked in order, or besides this structure, may have a structure in which an anode, a hole-injection layer, a light-emitting layer, and a cathode are laminated in order, a structure in which an anode, a hole-injection layer, a light-emitting layer, an electron-transport layer, and a cathode are laminated in order, or the like.

Current flows through the light-emitting element 544 through the channel formation region of the p-channel transistor 532. Thus, the amount of driving current flowing through the light-emitting element 544 depends on a signal current Ic determined by a constant current source. The light-emitting element emits light with a luminance corresponding to the amount of driving current. When the transistor used as the constant current source has an s-channel structure, the deterioration can be suppressed; thus, the structure is a particularly effective structure.

Furthermore, when the transistor used in the driver circuit has an s-channel structure, the channel width can be reduced, so that the area of the driver circuit can be reduced. For example, the width of the driver circuit is reduced to 0.5 mm, preferably 0.3 mm, and a narrower frame width can be achieved.

<Pixel Layout Including Transistor>

Figure 16A:
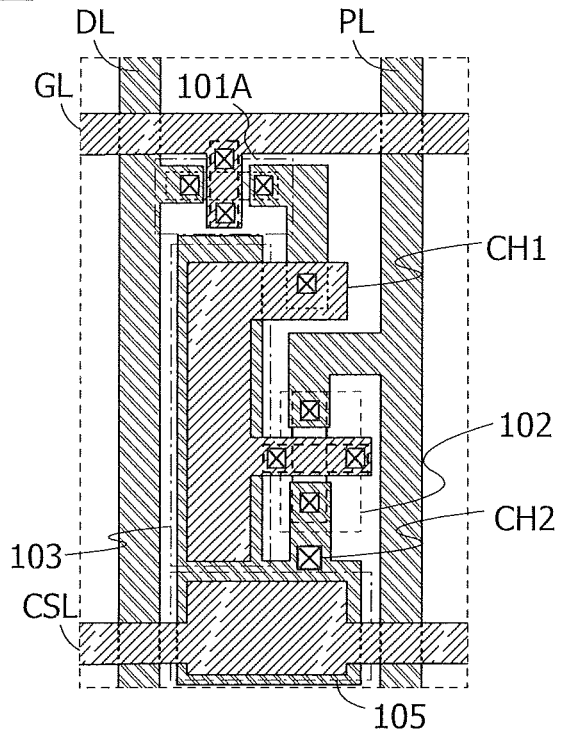
FIGS. 16A and 16B are top views illustrating a structure of a pixel of an embodiment.
Figure 16B:
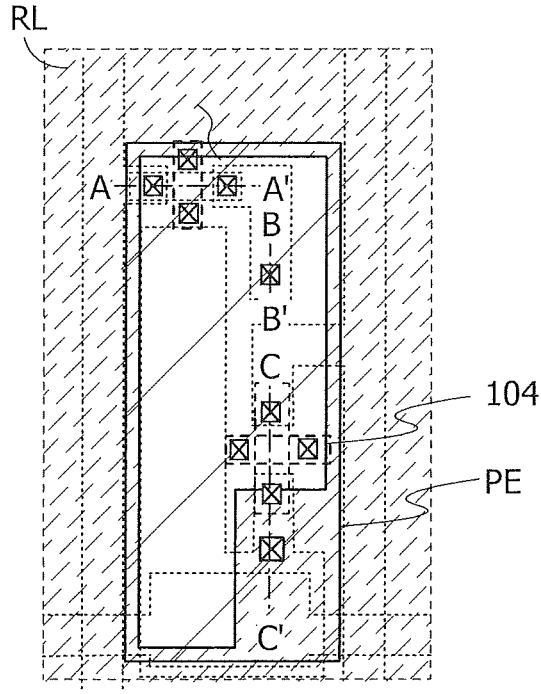

FIGS. 16A and 16B show examples of top views of pixels including the transistors. FIG. 16B shows the light-emitting element 104 stacked over a pixel 100C, which is shown separately from FIG. 16A.

The top view of FIG. 16A shows a transistor 101A, a transistor 102, a capacitor 103, a capacitor 105, a gate line GL, a data line DL, a current supply line PL, a capacitor line CSL, an opening CH1, and an opening CH2.

The top view of FIG. 16B shows an electrode PE serving as the anode of the light-emitting element and a partition layer RL. Although the light-emitting layer and an electrode serving as the cathode of the light-emitting element are not shown, they are provided in an opening in the partition layer RL. Note that a region where the electrode PE, the light-emitting layer, and the electrode serving as the cathode of the light-emitting element corresponds to the light-emitting element 104.

As the transistor 101A, an n-channel transistor is used, and as the transistor 102, a p-channel transistor is used. Both these transistors have an s-channel structure. The above fabrication method of the transistors in this embodiment is used as fabrication methods of the transistors 101A and 102.

At least part of this embodiment can be implemented in combination with any of the embodiments described in this specification as appropriate.

Embodiment 7

In this embodiment, a configuration example of a light-emitting device in which the structure in Embodiment 6 can be used is described with reference to FIG. 17 and FIGS. 18A and 18B.

<Configuration Example of Light-Emitting Device>

Figure 17:
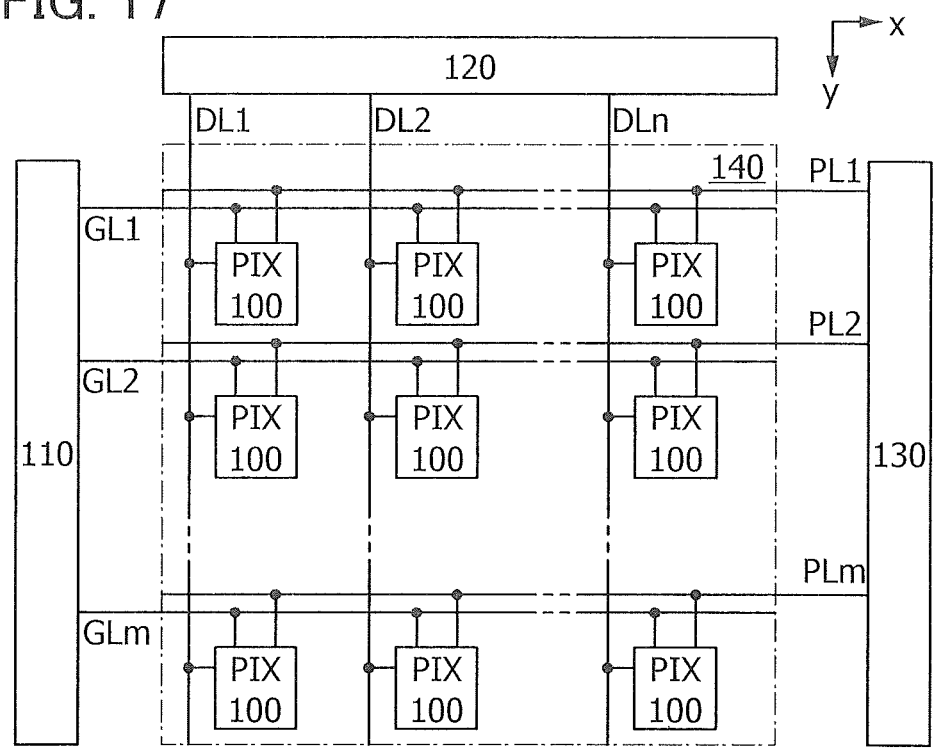
FIG. 17 is a block diagram illustrating one embodiment of the present invention.

FIG. 17 is an example of a block diagram showing a configuration of the light-emitting device.

FIG. 17 is a block diagram illustrating a gate line driver circuit 110, a data line driver circuit 120, a current supply line control circuit 130, and a pixel portion 140 including a pixel 100.

A plurality of pixels 100 in the pixel portion 140 is arranged in x and y directions in a matrix.

In the pixel portion 140, gate lines GL1 to GLm (m is a natural number) connected to the gate line driver circuit 110 are arranged in the x direction. The gate lines GL1 to GLm are connected to respective pixels 100.

In the pixel portion 140, data lines DL1 to DLn (n is a natural number) connected to the data line driver circuit 120 are arranged in the y direction. The data lines DL1 to DLn are connected to respective pixels 100.

Current supply lines PL1 to PLm connected to the current supply line control circuit 130 can be arranged in the x direction to be connected to respective pixels 100 as shown in FIG. 17. The current supply line control circuit 130 can scan the current supply lines PL1 to PLm row by row.

<Circuit Configuration of Pixel>

The pixel 100 included in the light-emitting device is described.

Figure 18A:
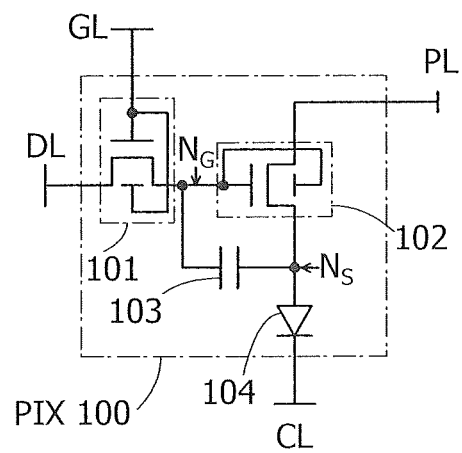
FIGS. 18A and 18B are a circuit diagram and a timing chart illustrating one embodiment of the present invention.

FIG. 18A illustrates an example of a circuit configuration of the pixel 100. The pixel 100 (a pixel is denoted by PIX in drawings) includes a transistor 101, a transistor 102, a capacitor 103, and a light-emitting element 104.

A node $N_G$ represents a gate of the transistor 102 in FIG. 18A. A node $N_S$ represents a node between the transistor 102 and the light-emitting element 104 in FIG. 18A.

A gate of the transistor 101 is connected to the gate line GL. One of a source and a drain of the transistor 101 is connected to the data line DL. The other of the source and the drain of the transistor 101 is connected to the node $N_G$.

The gate line GL is a wiring having a function of supplying (or transmitting) a signal that controls on and off of the transistor 101 functioning as a switch. In the case where the transistor 101 is an n-channel transistor, the transistor is on when the gate line GL is at an H level and the transistor is off when the gate line GL is at an L level.

The data line DL has a function of applying (or transmitting) an initialization voltage in an initialization period and a threshold voltage acquiring period. Furthermore, an example of the function of the data line DL include applying (or transmitting) a video signal (also referred to as an image signal voltage, a data voltage, or the like) to the pixel 100 in a video signal writing period and a mobility correction period.

The video signal is a voltage for making the light-emitting element 104 emit light with desired shades of gray. The video signal can be denoted by $V_{IN}$.

The initialization voltage applied to the data line DL is a voltage for initializing a voltage of each terminal of the capacitor 103. The voltage of the data line DL at an L level can be the initialization voltage.

The gate of the transistor 102 is connected to the node $N_G$. One of a source and a drain of the transistor 102 is connected to the node $N_S$. The other of the source and the drain of the transistor 102 is connected to the current supply line PL.

Note that the transistor 101 and the transistor 102 are assumed to be n-channel transistors in the following description. The threshold voltage of the transistor 102 is denoted by $V_{TH}$ in the description.

The transistors 101 and 102 each have an s-channel structure. With such a structure, the channel width W can be reduced, reducing the area of the pixel. Moreover, the amount of current flowing through the transistors can be increased, achieving high-speed operation.

Examples of the function of the current supply line PL include applying an initialization voltage for initializing the voltage of each terminal of the capacitor 103 in the initialization period and applying a voltage for supplying current in accordance with $V_{GS}$ of the transistor 102 in the threshold voltage acquiring period, the video signal writing period and the mobility correction period, and an emission period.

The initialization voltage applied to the current supply line PL is a voltage for initializing the voltage of each terminal of the capacitor 103. The voltage of the current supply line PL at an L level can be the initialization voltage.

The voltage for supplying current in accordance with $V_{GS}$ of the transistor 102, which is applied to the current supply line PL, is a voltage for changing the voltage held at each terminal of the capacitor 103 to the threshold voltage of the transistor 102, supplying current to the transistor 102 to correct a mobility, and making the light-emitting element 104 emit light. The voltage of the current supply line PL at an H level can be the voltage for supplying current in accordance with $V_{GS}$ of the transistor 102.

One electrode of the capacitor 103 is connected to the node $N_G$. The other electrode of the capacitor 103 is connected to the node $N_S$.

One electrode of the light-emitting element 104 is connected to the node $N_S$. The other electrode of the capacitor 103 is connected to a cathode line CL. Note that the capacitor 103 can be omitted when the gate capacitance (parasitic capacitance) of the transistor 102 is utilized instead.

<Operation of Pixel>

Next, an example of the operation of the pixel 100 in FIG. 18A is described.

Figure 18B:
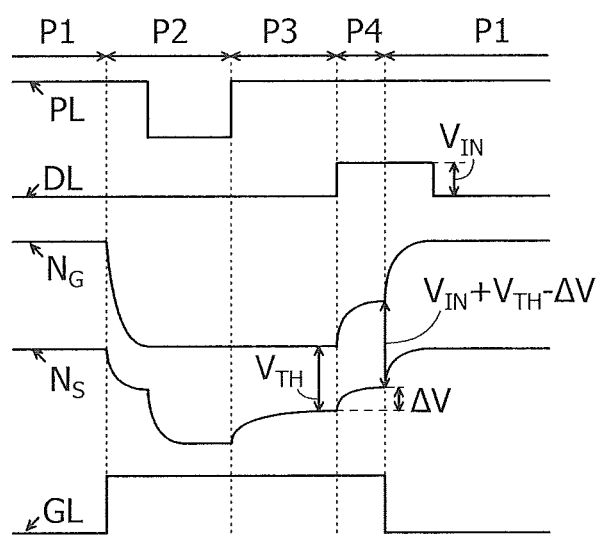

FIG. 18B is a timing chart for the operation of the pixel 100.

In the timing chart of FIG. 18B, an emission period P1, an initialization period P2, a threshold voltage acquiring period P3, and a video signal writing and a mobility correction period (P4) are separately shown.

The timing chart of FIG. 18B shows an example of variations in each voltage of the current supply line PL, the data line DL, the node $N_G$, the node $N_S$, and the gate line GL.

In FIG. 18B, $V_{TH}$ denoting the threshold voltage of the transistor 102, a voltage $V_{IN}$ of the video signal, and a voltage $\Delta V$ for correcting the mobility of the transistor 102 are shown.

First, in the initialization period P2, the voltage of the node $N_G$ that has been held in the previous emission period P1 is initialized. First, for example, the gate line GL is set at an H level and the voltage of the data line DL is set to an initialization voltage. When the transistor 101 is turned on, the voltage of the data line DL is transmitted to the node $N_G$, and the voltage of the node $N_G$ is lowered. After that, the voltage of the node $N_S$ is also lowered.

In addition, in the initialization period P2, the voltage held in the node $N_S$ is initialized. First, for example, the voltage of the current supply line PL is set to an initialization voltage. Current flows through the transistor 102 with the lowering voltage of the current supply line PL to further lower the voltage of the node $N_S$. As a result, the voltage of each terminal of the capacitor 103 is initialized. Then, the initialization period P2 is completed.

Next, in the threshold voltage acquiring period P3, current is supplied into the transistor 102 to increase the voltage of the node $N_S$ to hold $V_{TH}$ at each electrode of the capacitor 103. First, the voltage of the current supply line PL is a voltage for supplying current in accordance with $V_{GS}$ of the transistor 102. The voltage of the current supply line PL is increased, whereby current is supplied to the transistor 102, and accordingly the voltage of the node $N_S$ is increased. That is, electric charge accumulated in the capacitor 103 is released.

At this time, since the gate line GL is at an H level, in other words, the transistor 101 is on, the voltage of the node $N_G$ is not changed. When $V_{GS}$ of the transistor 102 becomes $V_{TH}$, the current flowing through the transistor 102 is gradually decreased and the current flow is finally stopped. That is, the voltage of the node $N_S$ becomes lower than the voltage of the node $N_G$ by $V_{TH}$. Thus, $V_{TH}$ of the transistor 102 can be obtained.

Next, in the video signal writing period and the mobility correction period (P4), the gate line GL is at an H level, that is, the transistor 101 is on, and the data line DL is set to $V_{IN}$. The voltage of the node $N_G$ becomes $V_{IN}$. The voltage of each terminal of the capacitor 103 is set to a voltage corresponding to the sum of $V_{TH}$ and $V_{IN}$. When current flows through the transistor 102, electric charge is accumulated in the parasitic capacitance of the light-emitting element 104; thus, the voltage of the node $N_S$ is increased by $\Delta V$. That is, the voltage of each terminal of the capacitor 103 becomes $V_{IN}+V_{TH}-\Delta V$.

The voltage change $\Delta V$ of the node $N_S$ is increased as the current flowing through the transistor 102 becomes larger. The amount of current flowing through the transistor 102 is proportional to the mobility of the transistor 102. Thus, the voltage of the node $N_S$ is changed, whereby the influence of variations in the mobility of the transistors 102 in the pixels can be reduced.

In the video signal writing period and the mobility correction period (P4), the mobility correction is not necessarily performed. In the case where the mobility correction is not performed, the voltage of the node $N_S$ is not necessarily increased through the transistor 102. Therefore, a period during which the voltage of the node $N_S$ is increased can be omitted, so that undesired light emission from the light-emitting element 104 can be inhibited.

In the case where the mobility is not corrected, the voltage of the current supply line PL does not need to be a voltage for supplying current in accordance with $V_{GS}$ of the transistor 102. For example, the voltage of the current supply line PL is preferably a voltage which does not increase the voltage of the node $N_S$, for example, a voltage which is lower than or equal to that of the cathode line CL. With the structure, when the video signal is written, undesired light emission of the light-emitting element can be inhibited.

In another effective structure, for example, an electrically floating state is established between the current supply line PL and the transistor 102. For example, a switch is provided between the transistor 102 and the current supply line PL and the switch is turned off in the video signal writing period, whereby such a structure can be achieved. With the structure, when the video signal is written, undesired light emission of the light-emitting element can be inhibited.

Then, in the emission period P1, the voltage of the gate line GL is at an L level; that is, the transistor 101 is turned off. The node $N_G$ is brought into an electrically floating state. Current flows through the transistor 102 as in the previous period, so that the voltage of the node $N_S$ is increased. Since the node $N_G$ is in the electrically floating state, while the voltage of each terminal of the capacitor 103 is retained at $V_{IN}+V_{TH}-\Delta V$, the voltage of the node $N_G$ is increased as the voltage of the node $N_S$ is increased. Thus, into the light-emitting element 104, current in accordance with the amount of $V_{TH}$ and $\Delta V$ is supplied. That is, the current flowing through the light-emitting element 104 can reduce the influence of variations in $V_{TH}$ and $\Delta V$.

With the above-described structure, the amount of current flowing through the light-emitting element 104 can include the threshold voltage and the mobility of the transistor 102. With such a structure, the influence of variations in electrical characteristics of the transistors can be reduced, and variations in luminance of the light-emitting elements in the pixels can be inhibited.

At least part of this embodiment can be implemented in combination with any of the embodiments described in this specification as appropriate.

Embodiment 8

In this embodiment, an example that is partly different from FIGS. 2A to 2C will be described with reference to FIGS. 19A to 19C.

FIG. 19A is a top view of a transistor 70F. FIG. 19B is a cross-sectional view taken along line L1-L2 in the channel length direction of the transistor 70F. FIG. 19C is a cross-sectional view taken along line W1-W2 in the channel width direction of the transistor 70F.

In FIG. 19C, as in FIG. 2C, an s-channel structure in which the channel formation region is surrounded by the conductive film 77 functioning as the gate and the conductive film 73 functioning as the back gate electrode is shown.

In the transistor 70F in FIGS. 19A to 19C, a gate electric field is applied to the semiconductor film not only in the vertical direction but also from the lateral direction. That is, the gate electric field is applied to the whole of the semiconductor film, whereby current flows in the bulk of the semiconductor film. It is thus possible to increase the field-effect mobility of the transistor. Distribution of impurities is uniform in the whole of the bulk; thus, variations in electrical characteristics can be reduced.

FIG. 19C is a conceptual diagram illustrating a position of the channel formation region 82 in the semiconductor film 75. The thicknesses and the shapes of the insulating films 74 and 76 are devised so that a thickness D between the channel formation region 82 and the conductive film 73 is the same as a thickness t of the conductive film 73 or the distance D is larger than the thickness t of the conductive film 73. Note that, in FIGS. 19A to 19C, the insulating films 74 and 76 are formed using the same material; thus, the border is not illustrated.

In addition, as illustrated in FIG. 19C, an end portion of the conductive film 73 projects as compared with an end surface of the channel formation region 82.

With the arrangement illustrated in FIG. 19C, the s-channel structure can be sufficiently effective.

Furthermore, in the channel width direction in FIG. 19C, the conductive film 77 functioning as the gate is provided to cover the side surfaces of the channel formation region 82, and the conductive film 77 is also provided at a region where a parasitic channel is easily formed due to a reduction in resistance.

The conductive film 73 and the conductive film 77 are electrically connected to each other, and an opening 97 is an opening for electrically connecting the conductive film 73 and the conductive film 77. In this embodiment, an example where the conductive film 73 and the conductive film 77 are electrically connected to each other is shown; however, a structure where the conductive films 73 and 77 are not electrically connected to each other may be employed, and in this case, the threshold voltage can be controlled by separately controlling the voltages.

This embodiment can be combined with any of the other embodiments disclosed in this specification as appropriate.

Embodiment 9

In this embodiment, a display module and electronic devices that include the display device of one embodiment of the present invention or a display system will be described with reference to FIG. 20 and FIGS. 21A to 21H.

Figure 20:
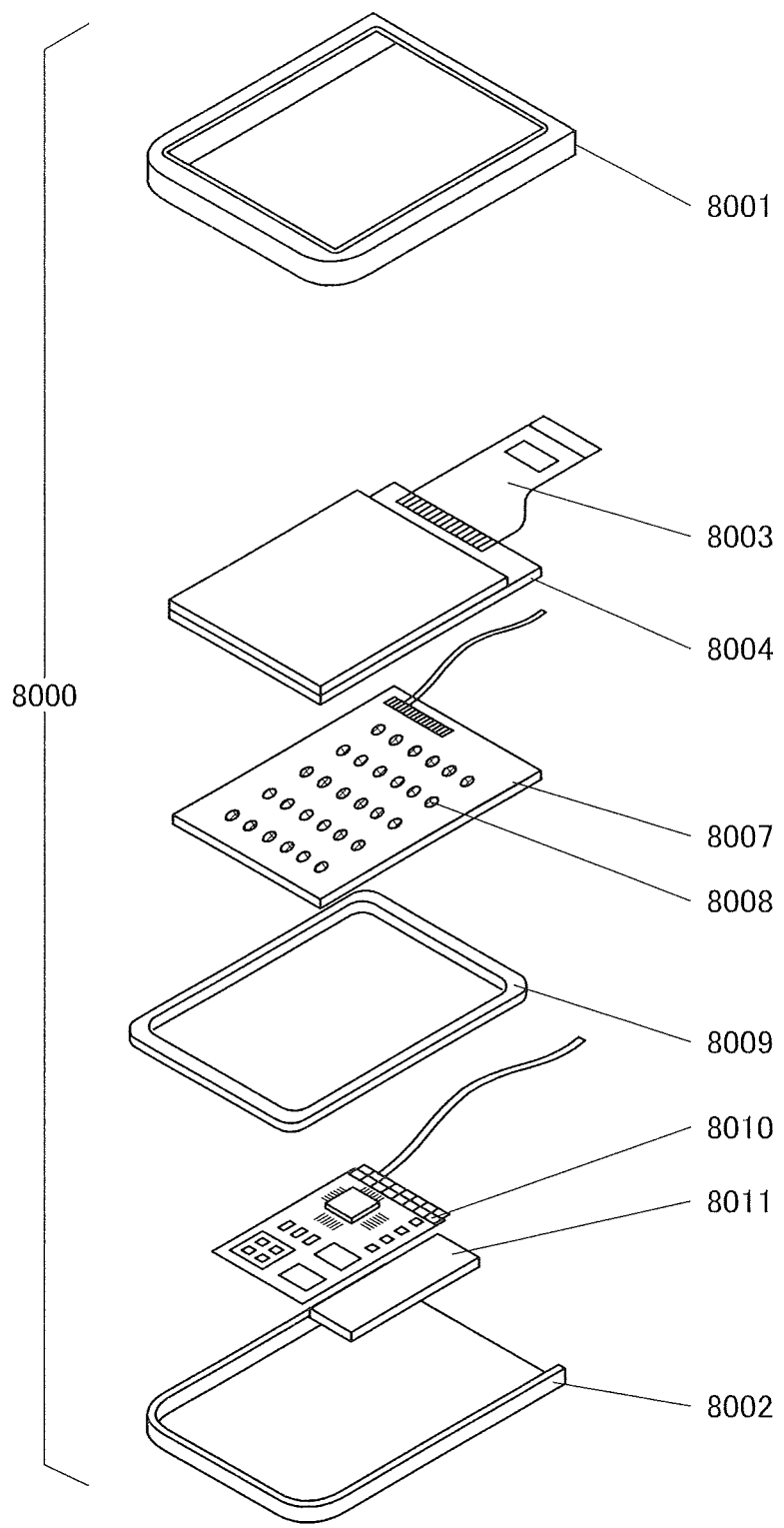
FIG. 20 illustrates a display module of an embodiment.

In a display module 8000 illustrated in FIG. 20, a touch panel 8004 connected to an FPC 8003, a frame 8009, a printed board 8010, and a battery 8011 are provided between an upper cover 8001 and a lower cover 8002.

The touch panel module of one embodiment of the present invention can be used for, for example, the touch panel 8004.

The shapes and sizes of the upper cover 8001 and the lower cover 8002 can be changed as appropriate in accordance with the size of the touch panel 8004.

The touch panel 8004 can be a resistive touch panel or a capacitive touch panel and may be formed so as to overlap with a display panel. Alternatively, a counter substrate (sealing substrate) of the touch panel 8004 can have a touch panel function. Further alternatively, a photosensor may be provided in each pixel of the touch panel 8004 to form an optical touch panel.

In the case of a transmissive liquid crystal element, a backlight 8007 may be provided as illustrated in FIG. 20. The backlight 8007 includes a light source 8008. Although the light source 8008 is provided over the backlight 8007 in FIG. 20, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and functions as an electromagnetic shield for blocking electromagnetic waves generated by the operation of the printed board 8010. The frame 8009 can also function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The touch panel 8004 may be additionally provided with a component such as a polarizing plate, a retardation plate, or a prism sheet.

FIGS. 21A to 21H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, and the like.

Figure 21A:
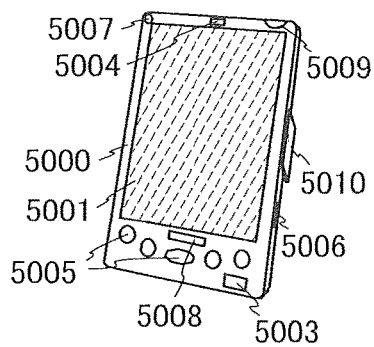
FIGS. 21A to 21H each illustrate an electronic device of an embodiment.
Figure 21B:
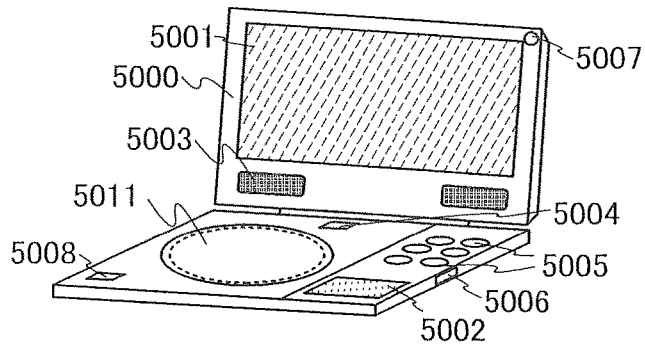
Figure 21C:
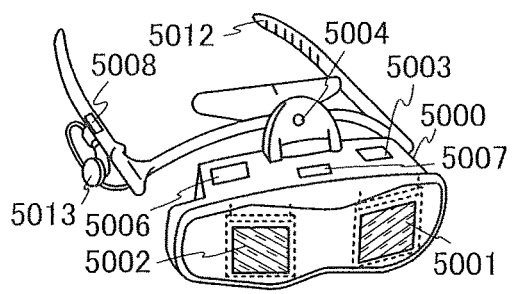
Figure 21D:
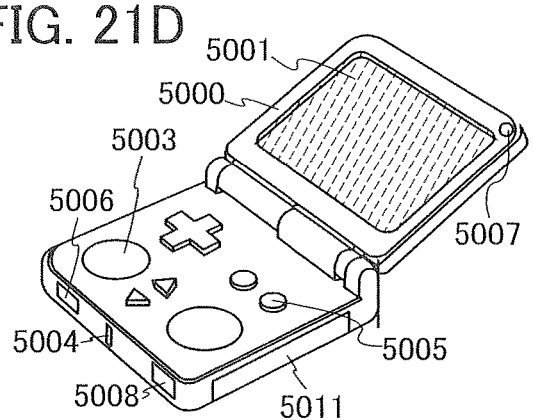
Figure 21E:
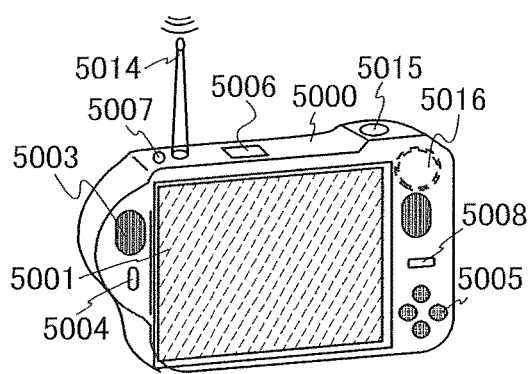
Figure 21F:
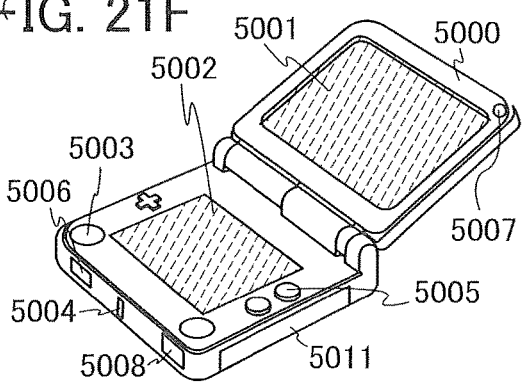
Figure 21G:
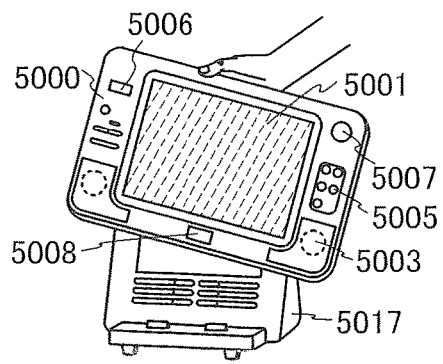
Figure 21H:
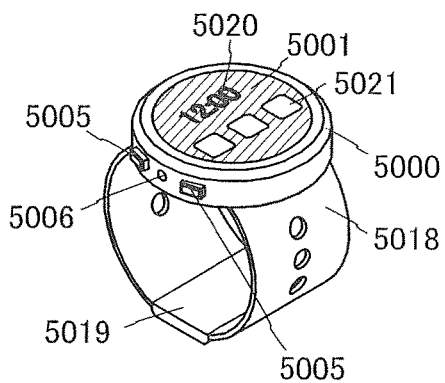

FIG. 21A illustrates a mobile computer, which can include a switch 5009, an infrared port 5010, and the like in addition to the above components. FIG. 21B illustrates a portable image reproducing device provided with a recording medium (e.g., a DVD reproducing device), which can include a second display portion 5002, a recording medium read portion 5011, and the like in addition to the above components. FIG. 21C illustrates a goggle-type display, which can include the second display portion 5002, a support 5012, an earphone 5013, and the like in addition to the above components. FIG. 21D illustrates a portable game machine, which can include the recording medium read portion 5011 and the like in addition to the above components. FIG. 21E illustrates a digital camera which has a television reception function and can include an antenna 5014, a shutter button 5015, an image receiving portion 5016, and the like in addition to the above components. FIG. 21F illustrates a portable game machine, which can include the second display portion 5002, the recording medium read portion 5011, and the like in addition to the above components. FIG. 21G illustrates a portable television receiver, which can include a charger 5017 capable of transmitting and receiving signals, and the like in addition to the above components. FIG. 21H illustrates a wrist-watch-type information terminal, which includes a band 5018, a clasp 5019, and the like in addition to the above components. The display portion 5001 mounted in the housing 5000 serving as a bezel includes a non-rectangular display region. The display portion 5001 can display an icon 5020 indicating time, another icon 5021, and the like.

The electronic devices illustrated in FIGS. 21A to 21H can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an imaging portion can have a function of photographing a still image, a function of photographing a moving image, a function of automatically or manually correcting a photographed image, a function of storing a photographed image in a recording medium (an external recording medium or a recording medium incorporated in a camera), a function of displaying a photographed image on the display portion, or the like. Note that functions that can be provided for the electronic devices illustrated in FIGS. 21A to 21H are not limited to the above, and the electronic devices can have a variety of functions.

The electronic devices described in this embodiment are characterized by including a display portion for displaying some sort of information. The display device described in the above embodiment can be employed for the display portion.

At least part of this embodiment can be implemented in combination with any of the embodiments described in this specification as appropriate.

Embodiment 10

Figure 22A:
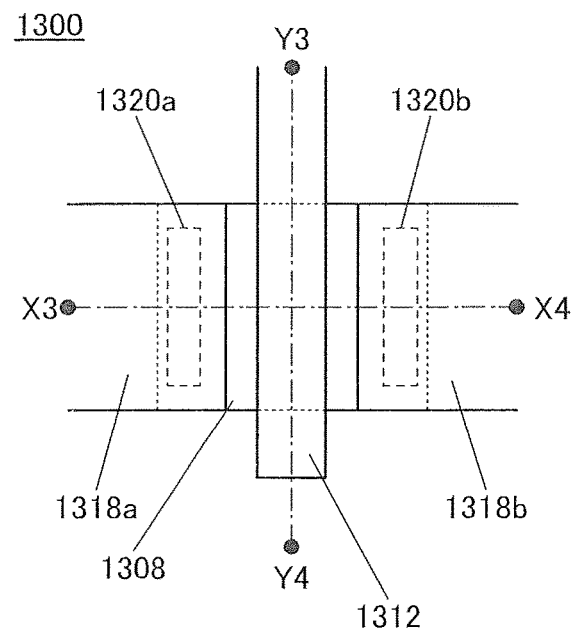
FIGS. 22A to 22C illustrate a top view and cross-sectional views of a semiconductor device (a comparative example)
Figure 22B:
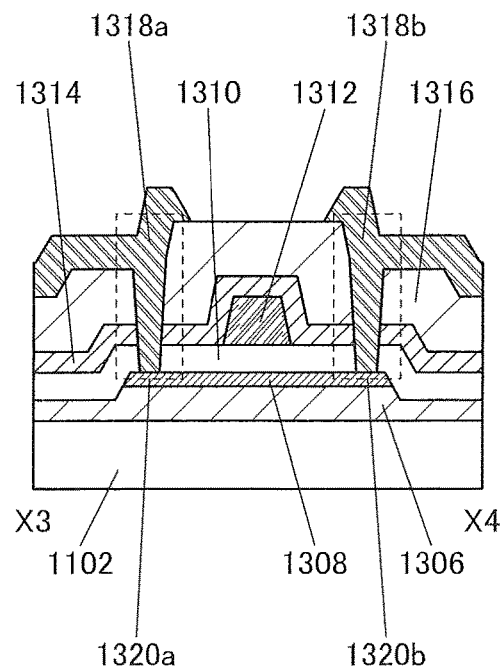
Figure 22C:
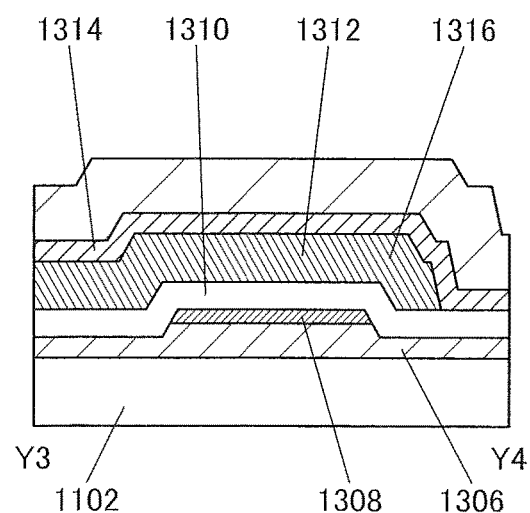
Figure 23A:
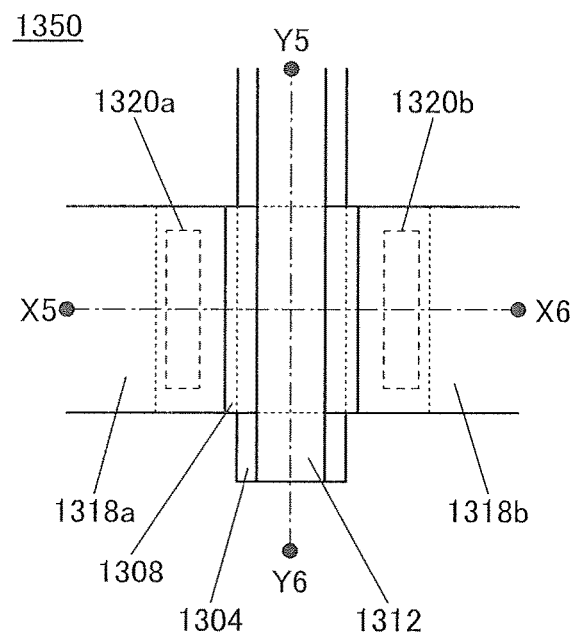
FIGS. 23A to 23C illustrate a top view and cross-sectional views of a semiconductor device.
Figure 23B:
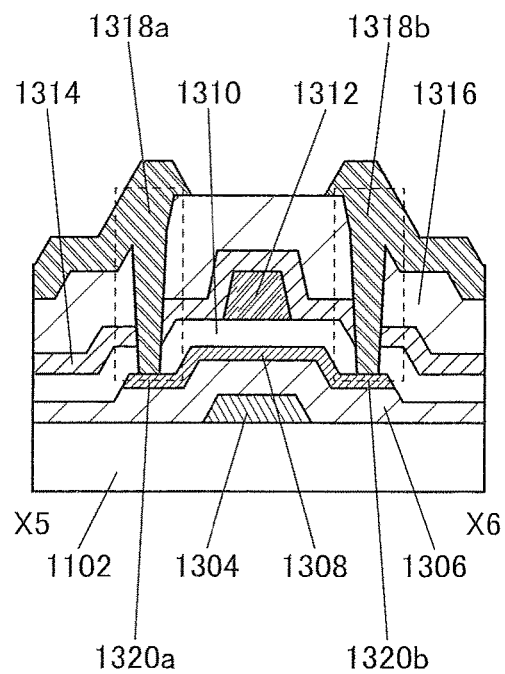
Figure 23C:
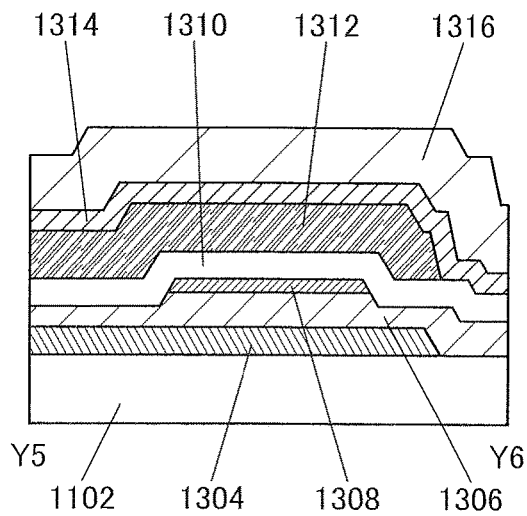

In this embodiment, a transistor 1300 illustrated in FIGS. 22A to 22C and a transistor 1350 illustrated in FIGS. 23A to 23C were fabricated, and the Id-Vg characteristics of these transistors were compared with each other.

In this embodiment, Samples A1 to A14 were fabricated: Samples A1, A2, A5, A6, A9, A10, and A11 each have the structure of the transistor 1300; and Samples A3, A4, A7, A8, A12, A13, and A14 each have the structure of the transistor 1350.

The transistor 1300 illustrated in FIGS. 22A to 22C is described. The transistor 1300 has a so-called staggered structure.

The transistor 1300 includes an insulating film 1306 over a substrate 1102, a semiconductor film 1308 over the insulating film 1306, an insulating film 1310 over the insulating film 1306 and the semiconductor film 1308, a conductive film 1312 over the insulating film 1310, an insulating film 1314 over the insulating film 1310 and the conductive film 1312, an insulating film 1316 over the insulating film 1314, and conductive films 1318a and 1318b over the insulating film 1316.

The conductive film 1318a is electrically connected to the semiconductor film 1308 through an opening portion 1320a provided in the insulating films 1310, 1314, and 1316. The conductive film 1318b is electrically connected to the semiconductor film 1308 through an opening portion 1320b provided in the insulating films 1310, 1314, and 1316.

The insulating film 1306 functions as a base insulating film. The insulating film 1310 functions as a gate insulating film, and the conductive film 1312 functions as a gate electrode. The insulating film 1314 and the insulating film 1316 function as an interlayer insulating film. The conductive film 1318a and the conductive film 1318b function as a source electrode and a drain electrode, respectively. Although not illustrated in FIGS. 22A to 22C, a source region and a drain region are formed in the semiconductor film 1308 in a region not overlapping with the conductive film 1312. That is, the transistor 1300 has a self-aligned structure.

In this embodiment, as the insulating film 1306, a 140-nm-thick silicon nitride oxide film and a 100-nm-thick silicon oxynitride film were formed. As the semiconductor film 1308, a 50-nm-thick polysilicon film was formed. As the insulating film 1310, a 110-nm-thick silicon oxynitride film was formed. As the conductive film 1312, a 30-nm-thick tantalum nitride film and a 370-nm-thick tungsten film were formed. As the insulating film 1314, a 50-nm-thick silicon oxynitride film and a 140-nm-thick silicon nitride oxide film were formed. As the insulating film 1316, a 520-nm-thick silicon oxynitride film was formed. As each of the conductive films 1318a and 1318b, a 100-nm-thick titanium film, a 700-nm-thick aluminum film, and a 100-nm-thick titanium film were formed.

Note that the transistor 1300 is a transistor with a single-gate structure.

Next, the transistor 1350 illustrated in FIGS. 23A to 23C is described. The transistor 1350 has a so-called staggered structure in which a back gate electrode is provided for the above-described transistor 1300.

The transistor 1350 includes a conductive film 1304 over a substrate 1102, an insulating film 1306 over the substrate 1102 and the conductive film 1304, a semiconductor film 1308 over the insulating film 1306, an insulating film 1310 over the insulating film 1306 and the semiconductor film 1308, a conductive film 1312 over the insulating film 1310, an insulating film 1314 over the insulating film 1310 and the conductive film 1312, an insulating film 1316 over the insulating film 1314, and conductive films 1318a and 1318b over the insulating film 1316.

The conductive film 1318a is electrically connected to the semiconductor film 1308 through an opening portion 1320a provided in the insulating films 1310, 1314, and 1316. The conductive film 1318b is electrically connected to the semiconductor film 1308 through an opening portion 1320b provided in the insulating films 1310, 1314, and 1316.

The conductive film 1304 functions as a first gate electrode. The insulating film 1306 functions as a first gate insulating film and a base insulating film. The insulating film 1310 functions as a second gate insulating film, and the conductive film 1312 functions as a second gate electrode. The insulating film 1314 and the insulating film 1316 function as an interlayer insulating film. The conductive film 1318a and the conductive film 1318b function as a source electrode and a drain electrode, respectively. Although not illustrated in FIGS. 23A to 23C, a source region and a drain region are formed in the semiconductor film 1308 in a region not overlapping with the conductive film 1312. That is, the transistor 1350 has a self-aligned structure.

In this embodiment, as the conductive film 1304, a 30-nm-thick tungsten film was formed. Components other than the conductive film 1304 are similar to those of the above-described transistor 1300.

The transistor 1350 has the s-channel structure described above. Although not illustrated in FIGS. 23A to 23C, the conductive film 1304 is electrically connected to the conductive film 1312.

Samples A1 to A4 each have a channel length L of 6 μm and a channel width W of 50 μm. Samples A1 and A3 are n-channel transistors, and Samples A2 and A4 are p-channel transistors.

Note that the measurement of Id-Vg characteristics was performed by measuring drain current (Id: [A]) when gate voltage (Vg: [V]) was swept in the range of −15 V to 10 V at 0.25 V intervals. A horizontal axis indicates gate voltage (Vg: [V]) and a vertical axis indicates drain current (Id: [A]). Note that "drain voltage (Vd: [V])" refers to a potential difference between a drain and a source when the potential of the source is used as a reference potential, and "gate voltage (Vg: [V])" refers to a potential difference between a gate and a source when the potential of the source is used as a reference potential.

FIG. 24A, FIG. 24B, FIG. 24C, and FIG. 24D respectively show Id-Vg characteristics of Sample A1, Sample A3, Sample A2, and Sample A4.

Figure 24B:
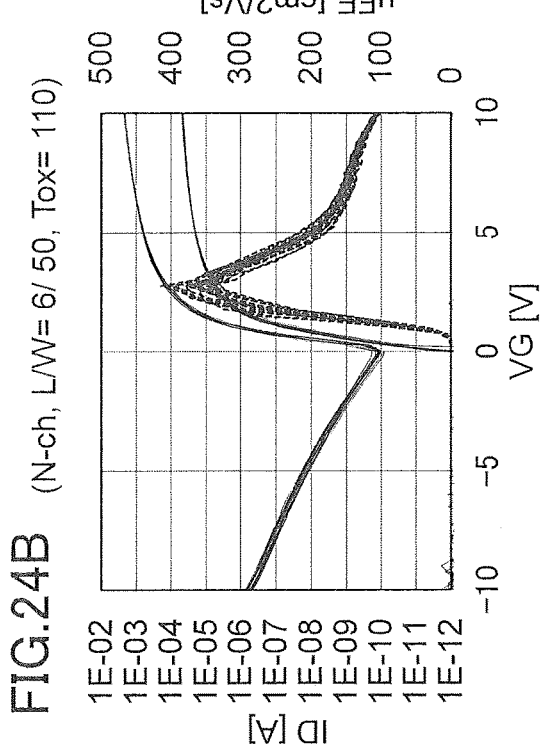
FIGS. 24A to 24D show Id-Vg characteristics of transistors.
Figure 24D:
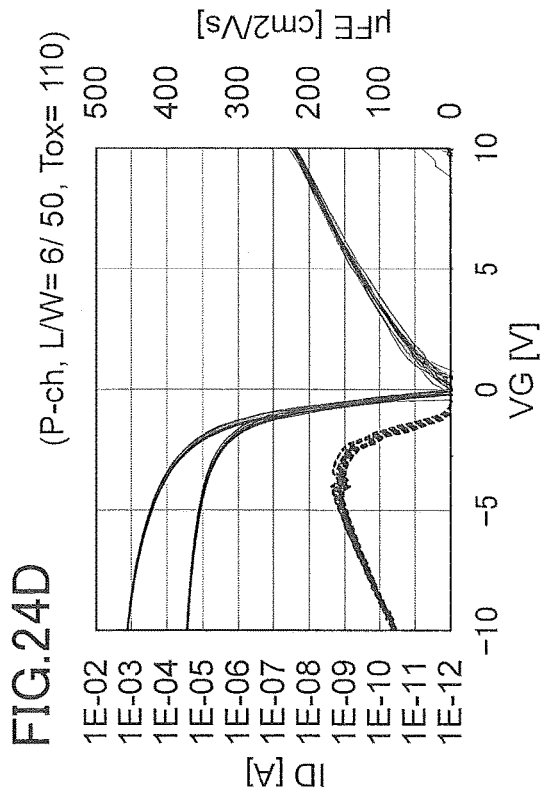
Figure 24A:
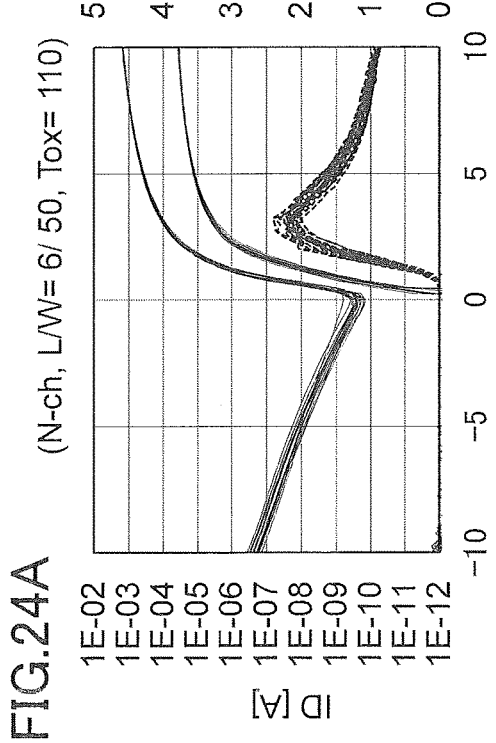
Figure 24C:
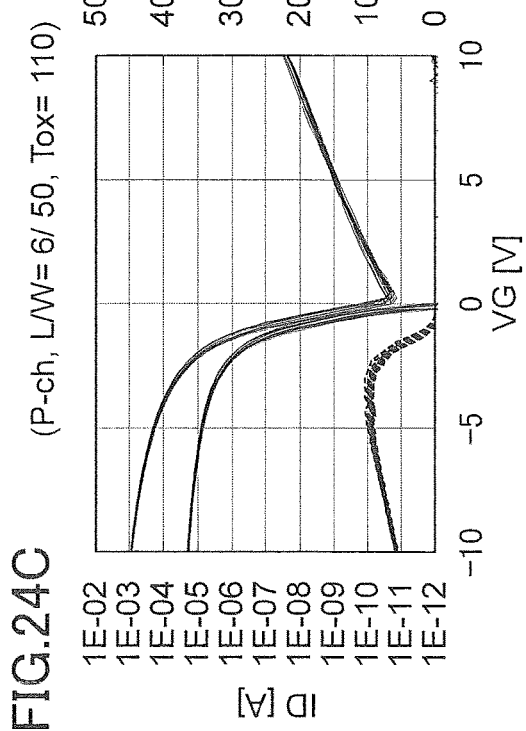

As shown in FIGS. 24A to 24D, an improvement in field effect mobility due to an increase in gate capacitance is observed in FIGS. 24B and 24D of s-channel structures as compared with FIGS. 24A and 24C of single-gate structures. In addition, FIGS. 24A to 24D indicate that, with the s-channel structure, an external electric field is blocked by two upper and lower gates between which a channel portion is sandwiched; thus, DIBL can be suppressed.

Samples A5 to A8 each have a channel length L of 3 μm and a channel width W of 50 μm. Samples A5 and A7 are n-channel transistors, and Samples A6 and A8 are p-channel transistors.

Figure 25:
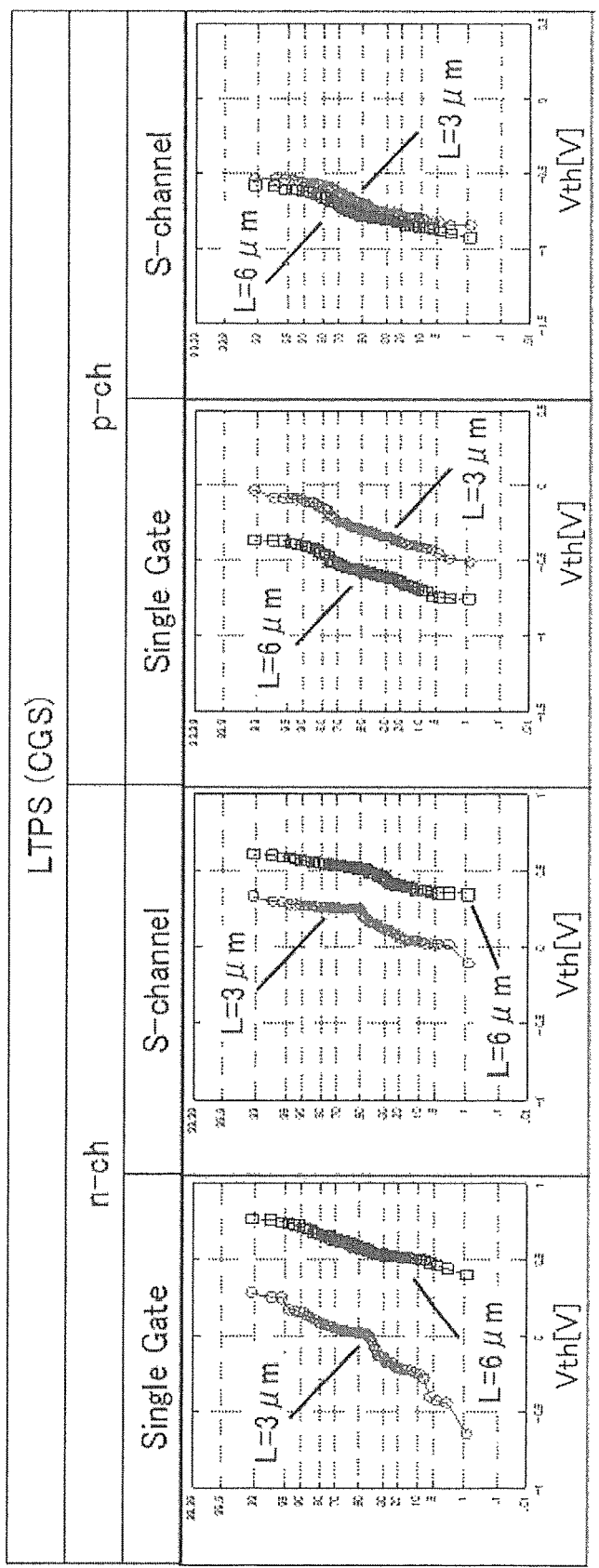
FIG. 25 shows variations in threshold voltage of transistors on substrate surfaces.

FIG. 25 shows measurement results of variations in threshold voltage ($V_{TH}$) of each of the transistors at 60 points on the substrate surface. As shown in FIG. 25, in the case where the transistor has the channel length L of 3 μm and the s-channel structure, variations in threshold voltage can be reduced.

Here, a threshold voltage in this specification is described. Threshold voltage ($V_{TH}$) is defined as, in the Vg-Id curve where the horizontal axis represents gate voltage (Vg: [V]) and the vertical axis represents the square root of drain current ($Id^{1/2}$ [A]), gate voltage at the intersection point of the line of $Id^{1/2}=0$ (Vg axis) and the tangent to the curve at a point where the slope of the curve is the steepest. Note that here, the threshold voltage is calculated with a drain voltage Vd of 10 V.

Sample A9 has a channel length L of 6 μm and a channel width W of 3 μm. Sample A10 has a channel length L of 10 μm and a channel width W of 3 μm. Sample A11 has a channel length L of 50 μm and a channel width W of 3 μm. Samples A9 to A11 are transistors each having a single-gate structure.

Sample A12 has a channel length L of 6 μm and a channel width W of 3 μm. Sample A13 has a channel length L of 10 μm and a channel width W of 3 μm. Sample A14 has a channel length L of 50 μm and a channel width W of 3 μm. Samples A12 to A14 are transistors each having an s-channel structure.

In the transistor with the s-channel structure in which a channel portion is sandwiched between two upper and lower gates, variations in threshold voltage are more reduced than in the transistor with the single-gate structure, as shown in experimental results in FIG. 25.

Figure 26:
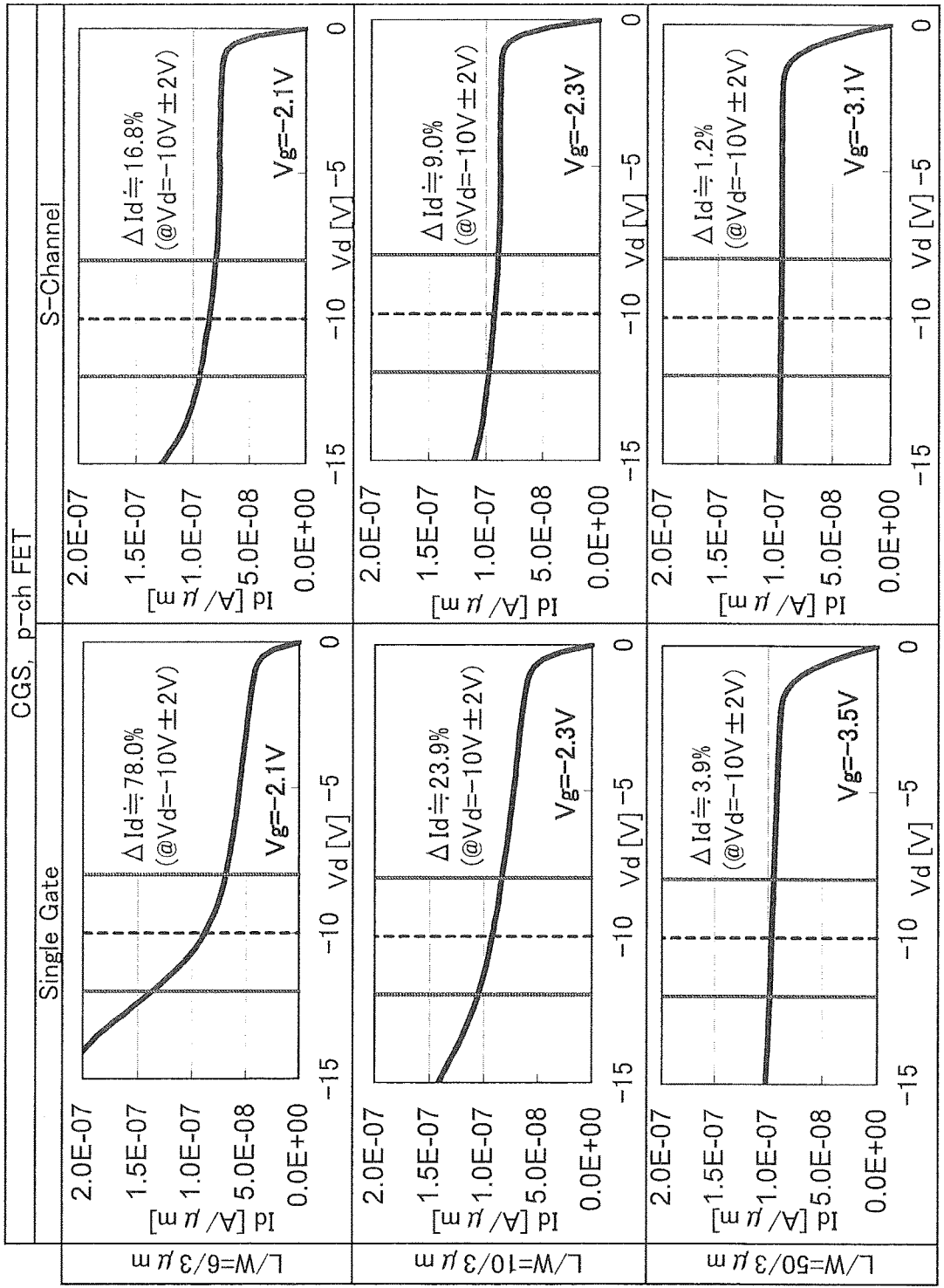
FIG. 26 shows Id-Vg characteristics of transistors.

FIG. 26 shows Id-Vd characteristics of Samples A9 to A14, which are p-channel transistors. Note that the measurement of Id-Vd characteristics was performed by measuring drain current when gate voltage was a voltage at which drain current was 100 nA/μm and drain voltage was swept in the range of 0 V to 15 V at 0.25 V intervals.

In the transistor using a polysilicon film, when voltage (Vd) applied to the drain electrode becomes high, electron-hole pairs are generated in the vicinity of the polysilicon film surface due to impact ionization. The generated electrons are accelerated by an electric field applied to the drain region and flow into the drain electrode. Through the impact ionization, transistor characteristics in which the amount of current flowing into the drain electrode at a high voltage is increased are obtained.

As shown in transistors in FIG. 26, it indicates that sufficiently constant current cannot be obtained when the channel length L is not over 10 μm. Thus, a transistor electrically connected to an organic EL element preferably has a channel length longer than 10 μm.

Furthermore, as shown in FIG. 26, with the s-channel structure, an external electric field is blocked by the two upper and lower gates between which the channel portion is sandwiched; thus, the saturation characteristics of the Id-Vd characteristics are improved as compared with the single-gate structure.

Embodiment 11

In this embodiment, Model B1 and Model B2 were used and S values were calculated. Calculation conditions are shown in Table 1. Model B1 is a transistor with an s-channel structure and Model B2 is a transistor with a single-gate structure.

TABLE 1

| FET structure | | | |
|---|---|---|---|
| | channel length | 6 | μm |
| | channel width | 10 | μm |
| LTPS (crystal grain) | electron mobility | 300 | $cm^2/Vs$ |
| | hole mobility | 30 | $cm^2/Vs$ |
| | thickness | 50 | nm |
| LTPS (grain boundary) | electron mobility | 30 | $cm^2/Vs$ |
| | hole mobility | 3 | $cm^2/Vs$ |
| | thickness | 50 | nm |
| | grain boundary width | 100 | nm |
| | S/D doping | 5.00E+18 | $cm^{-3}$ |
| | channel doping | 1E+15 | $cm^{-3}$ |
| gate insulating film (upper and lower) | relative dielectric constant | 3.9 | |
| | thickness | 300 | nm |
| gate electrode | work function | 4.1 | eV |

Figure 27A:
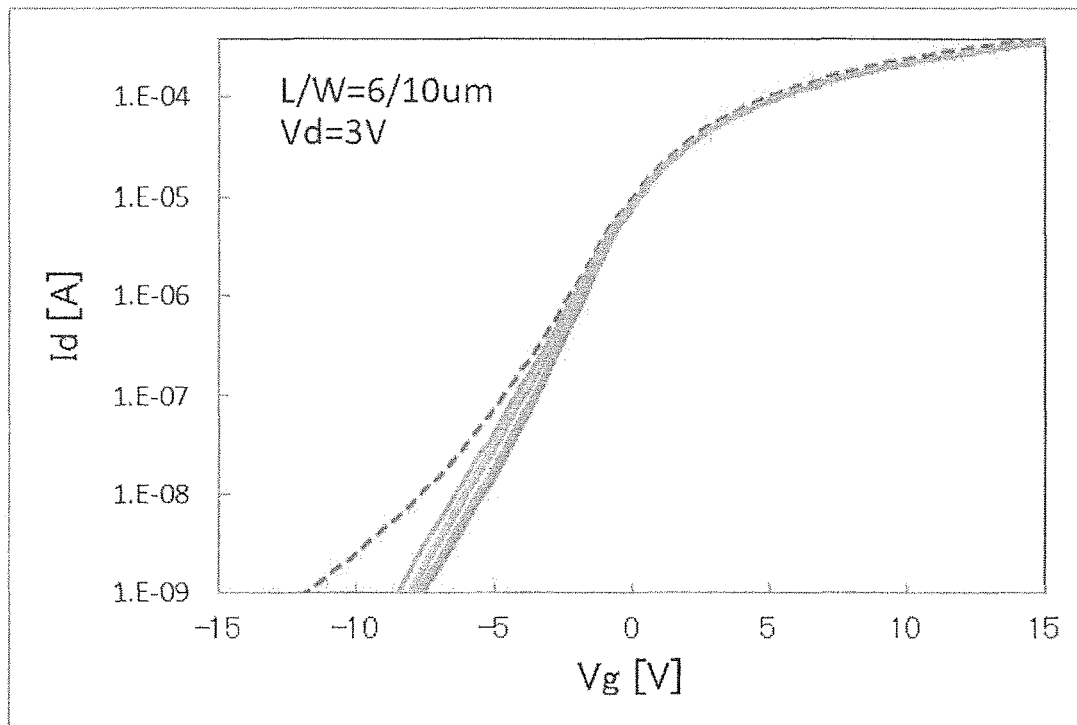
FIGS. 27A and 27B show calculation results of Id-Vg characteristics of transistors.
Figure 27B:
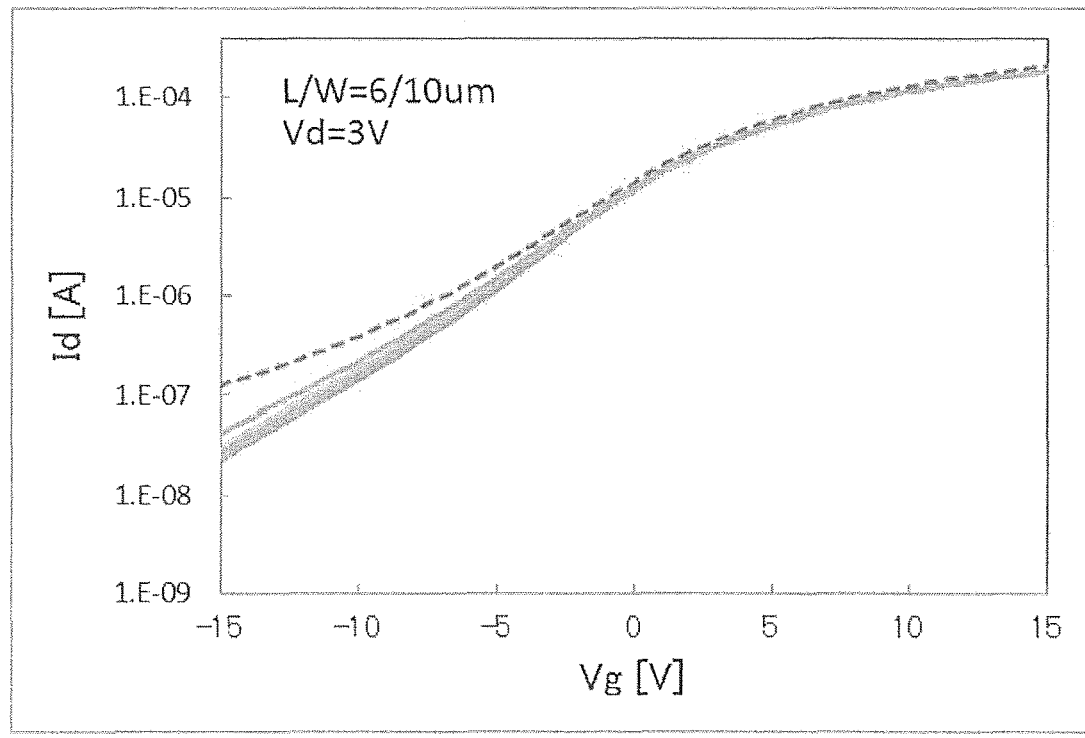

FIG. 27A shows results of Vg-Id curves of transistors that are Model B1. FIG. 27B shows results of Vg-Id curves of transistors that are Model B2.

From these results of FIGS. 27A and 27B, it indicates that S values are improved in the s-channel structure. Note that the S value is an abbreviation of a subthreshold swing, and refers to a reciprocal of the highest inclination at the rising portion of the Vg-Id curve.

This application is based on Japanese Patent Application serial no. 2015-055466 filed with Japan Patent Office on Mar. 18, 2015, Japanese Patent Application serial no. 2015-060518 filed with Japan Patent Office on Mar. 24, 2015, and Japanese Patent Application serial no. 2015-140262 filed with Japan Patent Office on Jul. 14, 2015, the entire contents of which are hereby incorporated by reference.

What is claimed is:

1. A semiconductor device comprising:
a first insulating layer over a first conductive layer;
a semiconductor layer including a channel formation region over the first insulating layer;
a second insulating layer over the semiconductor layer;
a second conductive layer over the second insulating layer; and
at least one of a source electrode and a drain electrode electrically connected to the semiconductor layer via a first opening opened in the second insulating layer,
wherein the second conductive layer covers side surfaces of the semiconductor layer with the second insulating layer positioned between the second conductive layer and the semiconductor layer,
wherein in a cross section in a channel width direction, the semiconductor layer is surrounded by the first conductive layer and the second conductive layer,
wherein the second conductive layer is electrically connected to the first conductive layer via a second opening opened in the first insulating layer and the second insulating layer, and
wherein the second opening is smaller than the first opening.

2. The semiconductor device according to claim 1, wherein the first conductive layer and the second conductive layer have a same potential.

3. The semiconductor device according to claim 1, wherein the semiconductor layer is a crystalline semiconductor film.

4. The semiconductor device according to claim 1, wherein the semiconductor layer is a polysilicon film.

5. The semiconductor device according to claim 1, wherein the first conductive layer and the second conductive layer have a light-blocking property.

6. The semiconductor device according to claim 1, wherein the semiconductor layer includes a first impurity region in contact with the channel formation region and a second impurity region in contact with the first impurity region, and wherein the second impurity region has a higher concentration than the first impurity region.

7. The semiconductor device according to claim 1,
wherein the semiconductor layer includes a first impurity region in contact with the channel formation region and a second impurity region in contact with the first impurity region, and
wherein the first impurity region overlaps with the second conductive layer.

8. The semiconductor device according to claim 1, wherein the second conductive layer has a tapered portion.

9. A semiconductor device comprising:
a first insulating layer over a first conductive layer;
a semiconductor layer including a channel formation region over the first insulating layer;
a second insulating layer over the semiconductor layer;
a second conductive layer over the second insulating layer; and
at least one of a source electrode and a drain electrode electrically connected to the semiconductor layer via a first opening opened in the second insulating layer,
wherein the second conductive layer covers side surfaces of the semiconductor layer and side surfaces of the first conductive layer,
wherein in a region where the semiconductor layer and the first conductive layer overlap with each other, a distance between the semiconductor layer and the first conductive layer is larger than or equal to a thickness of the first conductive layer,
wherein the second conductive layer is electrically connected to the first conductive layer via a second opening opened in the first insulating layer and the second insulating layer, and
wherein the second opening is smaller than the first opening.

10. The semiconductor device according to claim 9, wherein in a cross section in a channel width direction of the semiconductor layer, an end portion of the first conductive layer projects as compared with an end surface of the semiconductor layer.

11. The semiconductor device according to claim 9, wherein the first conductive layer and the second conductive layer have different potentials.

\* \* \* \* \*